United States Patent [19]

Nakakita et al.

[11] Patent Number: 6,061,820
[45] Date of Patent: *May 9, 2000

[54] SCHEME FOR ERROR CONTROL ON ATM ADAPTATION LAYER IN ATM NETWORKS

[75] Inventors: Kumiko Nakakita; Keiji Tsunoda, both of Kanagawa-ken, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/580,156

[22] Filed: Dec. 28, 1995

[30] Foreign Application Priority Data

Dec. 28, 1994 [JP] Japan ................................. 6-326911

[51] Int. Cl.[7] .................................................. H03M 13/00
[52] U.S. Cl. ......................... 714/751; 714/701; 714/702; 714/711; 714/760; 714/752; 714/776; 370/94.1
[58] Field of Search .......................... 370/94.1; 714/751, 714/702, 711, 752, 701, 760, 776

[56] References Cited

U.S. PATENT DOCUMENTS 5,572,532  11/1996  Fimoff et al. ........................... 714/702

FOREIGN PATENT DOCUMENTS

91/17503  11/1991  WIPO .

OTHER PUBLICATIONS

Esaki et al., "Evaluation of High Speed Multimedia Communication Architecture in ATM Networks", *IEICE Trans. Commun.*, vol. E77–B, No. 11, pp. 1407–1420, (1994).
Yamazaki, "Status Report on AAL1&2 (AAL Types 1 and 2) For video Signal Transport", Working Document TD/27 (Rev.), (13–2)–E, (Mar. 1994).
Matsuzaki et al., "A Study of Error Correction Method With The Alignment Between ATM Cell And MPEG–2 Transport Packet", *The 1994 IEICE Spring Conference*, B–853, pp. 3–348, (1994).
ITU–T Recommendation I.363, "B–ISDN ATM Adaptation Layer (AAL) Specification", pp. 1–16, (Mar. 1993).
McAuley, "Reliable Broadband Communication Using A Burst Erasure Correcting Code", pp. 297–306, (1990).
Kanai et al., "Error Control Method in ATM Networks, FEC on AAL Type 5", *The 1994 IEICE Spring Conference*, B–786, p. 3–281, (1994).
Carle, "Error Control For Reliable Multipoing Communication In ATM Networks", pp. 33–37, (1994).

*Primary Examiner*—William Grant
*Assistant Examiner*—McDieunel Marc
*Attorney, Agent, or Firm*—Foley & Lardner

[57] ABSTRACT

A scheme for error control on AAL in ATM networks capable of realizing a reliable communication with a high throughput and a low latency. On AAL, the segmented data are sequentially written into each column of a matrix shaped data region in an interleaver, while variably setting a last column of the data region in the interleaver. Then, an error control code for the data up to the last column in each row of the data region in the interleaver is obtained and written into a corresponding location within a matrix shaped error control code region in the interleaver. The contents of each column of the data region and the error control code region in the interleaver are then read out, and a prescribed header/trailer is attached to a prescribed number of columns of the data and/or the error control codes read out from the interleaver to form a data unit. Each data unit is sequentially given to a lower layer such that data units are transmitted in forms of ATM cells through the ATM network and an error correction using the error control codes can be carried out for the data at a receiving side when an error occurs during data transfer.

61 Claims, 29 Drawing Sheets

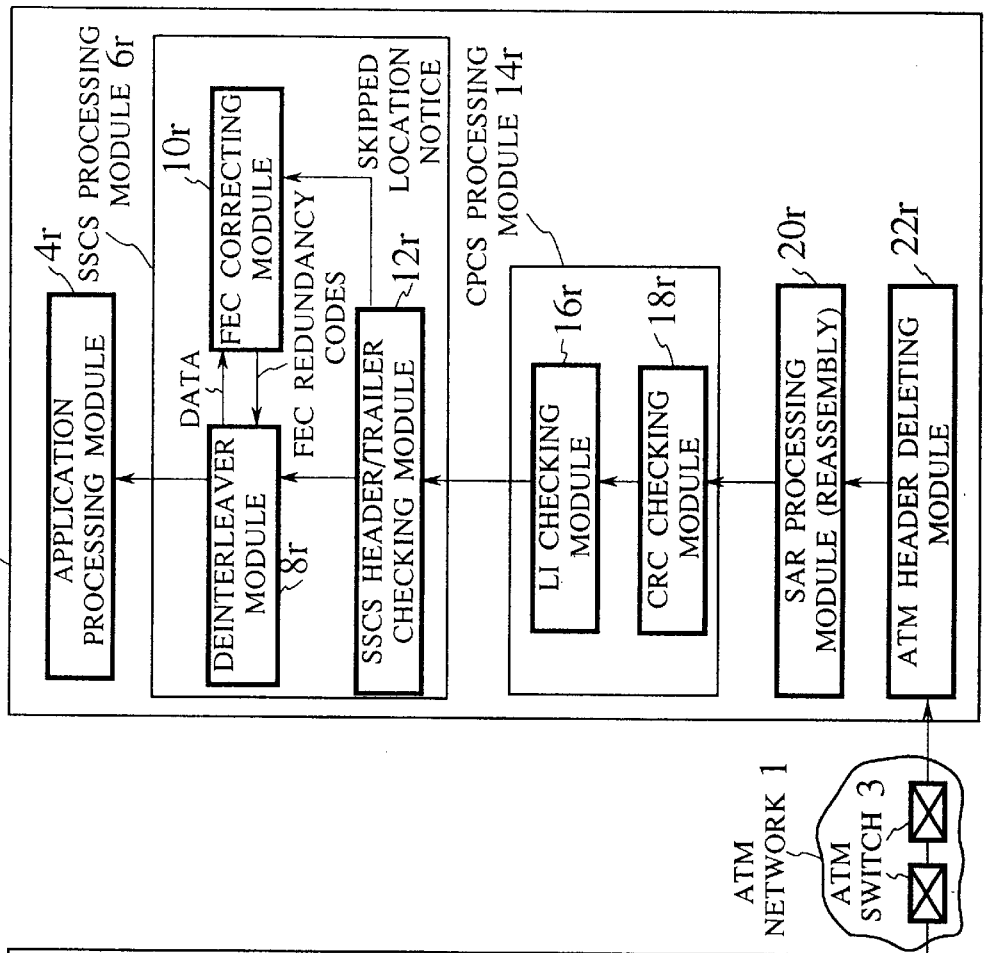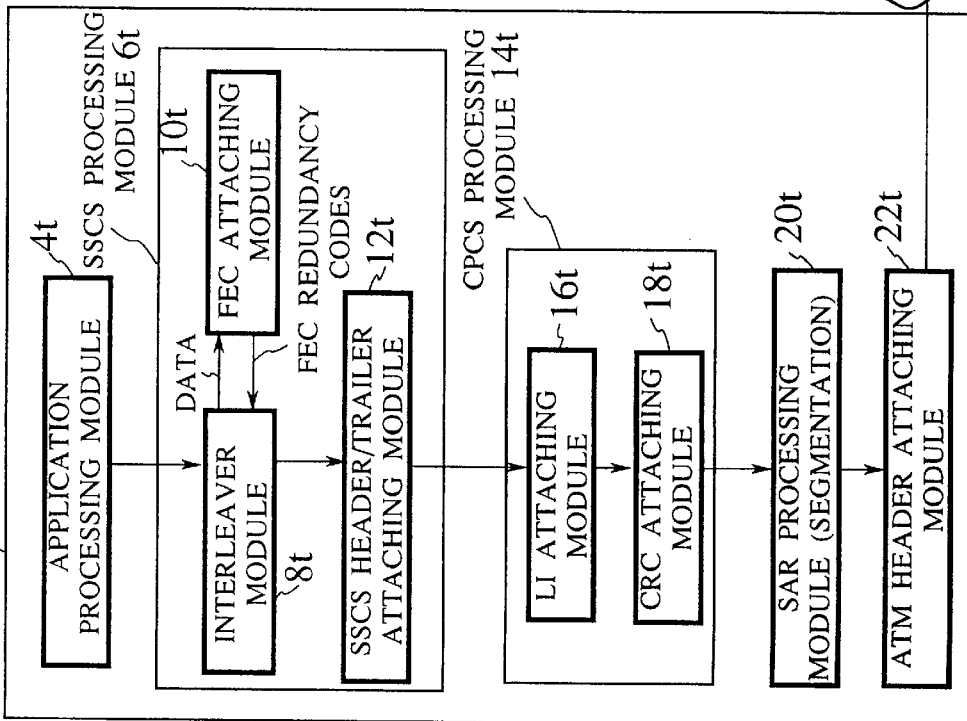
FIG.3

0 FOR PAD

0 FOR PAD   0 FOR PAD

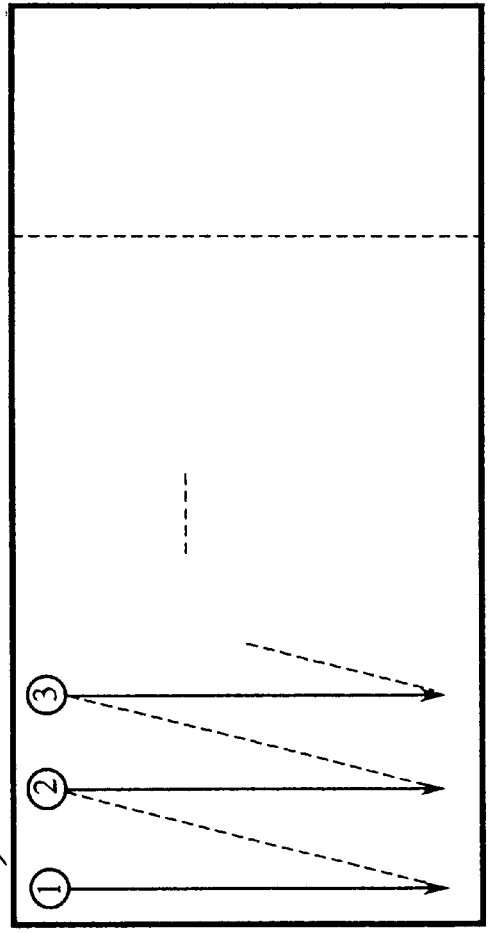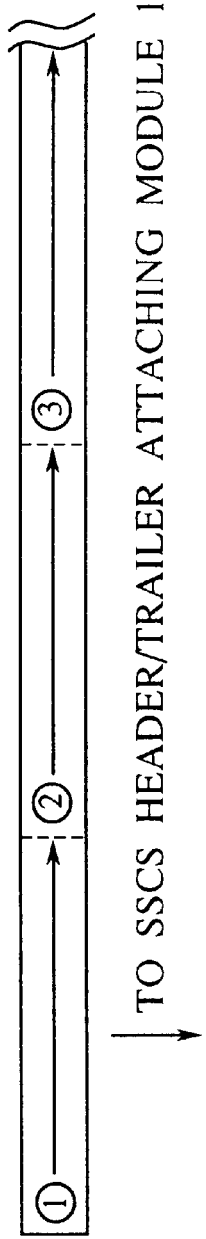
FIG. 12A
FIG. 12B

FIG.16A
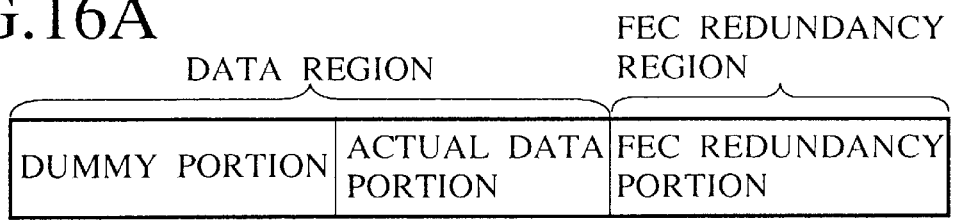
FIG.16B
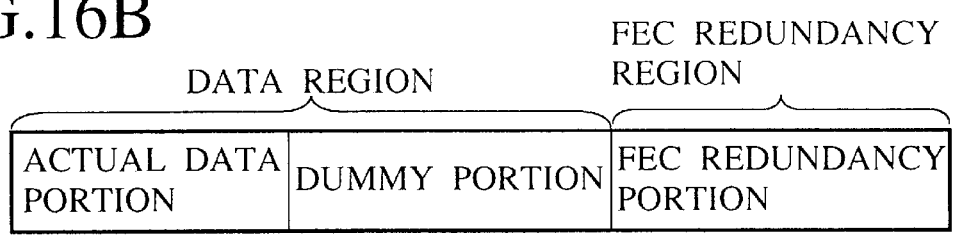
FIG.16C
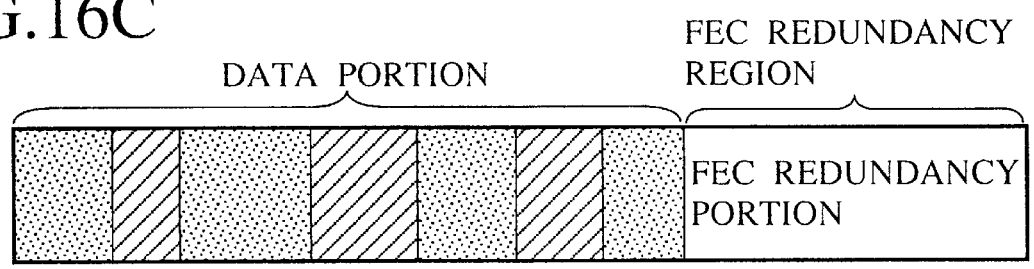

SSCS HEADER (1OCTET)

(a)=SYNCHRONIZATION BIT
  (INDICATING HEAD OF INTERLEAVER)
(b)=SEQUENCE NUMBER
  (INDICATING COLUMN IN INTERLEAVER)
(c)=SNP
  (FOR SEQUENCE NUMBER PROTECTION)
(d)=D/F
  (INDICATING WHETHER IT IS DATA OR FEC CODE)
(e)=B/E
  $\begin{pmatrix}\text{INDICATING ENDS OF DATA AND FEC}\\ \text{REDUNDANCY REGIONS}\end{pmatrix}$

FIG.23

| POWERS OF X | COEFFICIENT FOR $X^3$ | COEFFICIENT FOR $X^2$ | COEFFICIENT FOR X | CONSTANT |
|---|---|---|---|---|
| 127 | E [1] | F [1] | G [1] | H [1] |
| 126 | E [2] | F [2] | G [2] | H [2] |
| ⋮ | ⋮ | ⋮ | ⋮ | ⋮ |
| 4 | E [124] | F [124] | G [124] | H [124] |

FIG.24

| SYMBOL NUMBER | ROW NUMBER | COLUMN NUMBER |
|---|---|---|
| 1 | 121 | 4 |
| 2 | 121 | 2 |
| ⋮ | ⋮ | ⋮ |
| 19 | 118 | 2 |

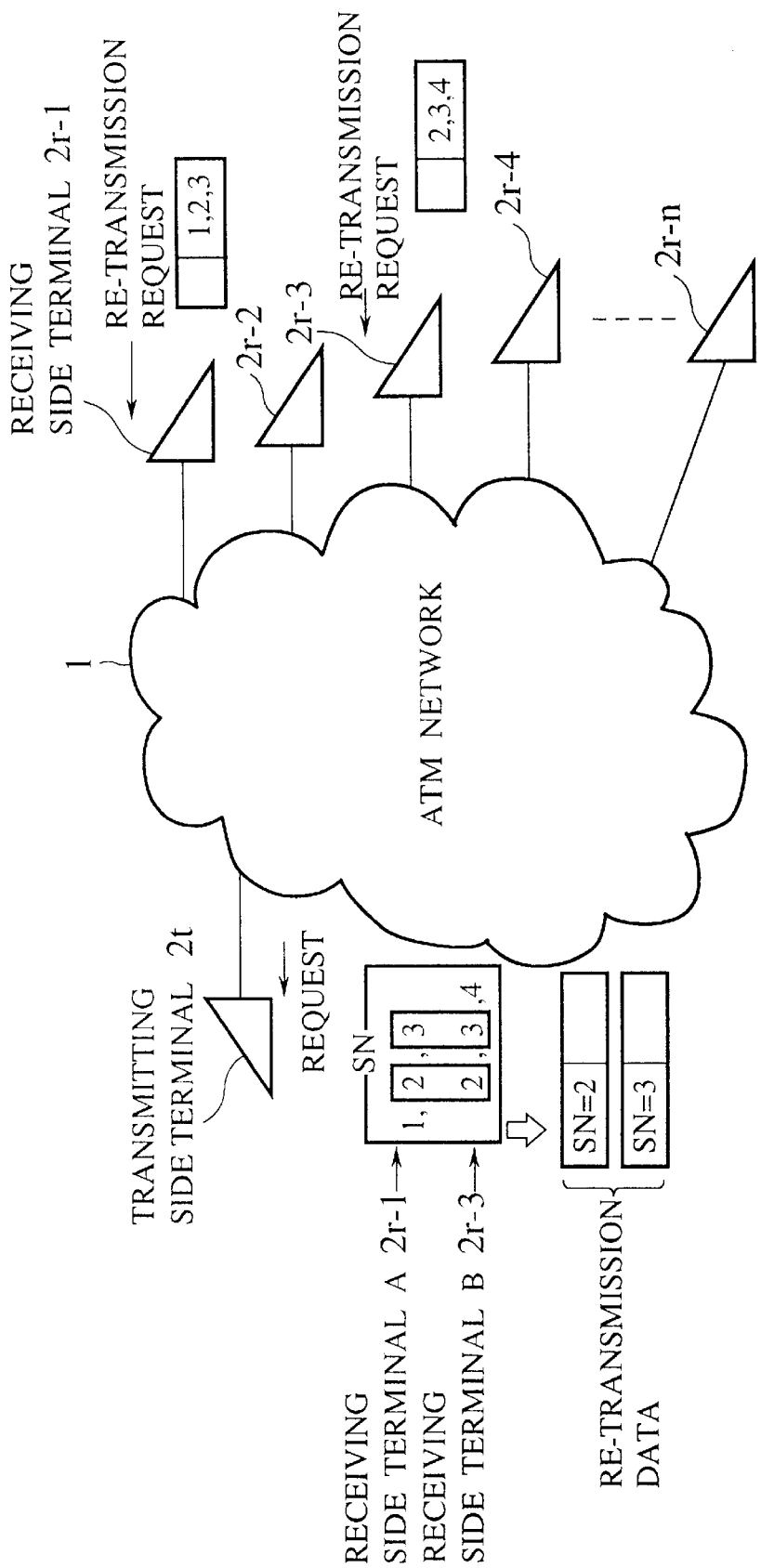

SCHEME FOR ERROR CONTROL ON ATM ADAPTATION LAYER IN ATM NETWORKS

BACKGROUND OF THE INVENTION

1. Field of the Invention

The present invention relates primarily to a data communication using ATM (Asynchronous Transfer Mode) cells, and in particular, to a scheme for error control on AAL (ATM Adaptation Layer) in ATM networks.

2. Description of the Background Art

In order to adapt variety of information to a communication mode using ATM cells, it is necessary to provide an inter-work between an ATM network and an upper layer, and an AAL to fulfill this function is provided between an ATM layer and an upper layer.

FIG. 1 shows a configuration of an AAL Type 5 as an example of an ATM adaptation layer. In a case of the Type 5, the AAL generally comprises a CS layer (Convergence Sublayer) and an SAR (Segmentation And Reassemble) layer. The CS layer further comprises two sub-layers including a CPCS (Common Part CS) layer to deal with processings required for all types of service, and an SSCS (Service Specific CS) layer to deal with processing specific to each type of service. This SSCS layer may be null. The SAR layer primarily carries out data segmentation/reassembling processing. Namely, at a time of data transmission, data are segmented in units of payload size, i.e., 48 octets for which an ATM header can be attached at the ATM layer, and given to the lower layer. On the other hand, at a time of data reception, data in units of payload size are received from the lower layer, reassembled into CS-PDU (CS-Protocol Data Unit), and given to the CS layer.

Currently, there are four types of AAL that have been standardized by an organization such as ITU-T, depending on types of information to be dealt with. More specifically, AAL1 is for a real time communication of speeches, images, etc. at a fixed bit rate, AAL2 is for a real time communication at a variable bit rate, and AAL3/4 and AAL5 are for a variable data communication, where AAL3 and AAL5 are for a connection-oriented (CO) communication while AAL4 is for a connection-less CL) communication.

Among them, AAL3/4 and AAL5 in particular are for data communication, so that there can be applications designed for them which require a rigorous accuracy of data which does not tolerate an error for even one bit, that is, a high reliability which guarantees a complete coincidence of received data and transmitted data. Also, even in cases in which a high QOS is required to real time applications designed for AAL1 or AAL2, a reliability of data itself will be a key factor.

However, the ATM techniques have been standardized only for primitive sections so far, and an error control function on AAL has not been provided sufficiently. For this reason, in order to provide a data communication requiring a rigorous data accuracy to users of AAL3/4 or AAL5, it is necessary to implement a protocol for guaranteeing data reliability at a not yet standardized upper layer, above the CPCS layer in a case of AAL5 for instance. Namely, for AAL5, the specifications for the CPCS layer and lower layers have already been standardized, so that an addition of a service dependent new function must be made at an upper layer above the CPCS layer.

There are known examples to this end, including a scheme for implementing a protocol based on data re-transmission control at the SSCS layer (such as a Q.SAAL protocol of ITU-T), and a scheme for setting the SSCS layer null and implementing a transport layer protocol (such as TCP (Transmission Control Protocol), or OSI/TP4) (Open Systems Interconnection Transport Protocol class 4) above the SSCS layer. All of these known schemes are basically a scheme for securing data reliability by using of data re-transmission.

However, there are reasons to expect a future increase of data communication regions for which an implementation of the error control scheme based on data re-transmission as noted above on ATM terminals is insufficient, such as the following.

(1) There is an expectation for a future increase of a number of applications which require a real time performance for a large capacity (for which a data re-transmission control is basically not permitted) as well as a high data reliability, such as large capacity transactions.

(2) The communication networks such as LAN, MAN, WAN, etc. are globalizing, and a securing of a latency and an error control based on data re-transmission become incompatible for a global communication network (because of an enormous amount of time required for the data re-transmission).

(3) In general, the error control scheme based on data re-transmission uses a group of upper layer packets (such as a group of TCP packets or layer 4 packets for example) as a unit of re-transmission, and therefore a re-transmission of large data is required even for a data loss in a relatively small unit such as a cell loss, so that this scheme can cause a significant waste of network resources.

In particular, when the real time performance is of importance, a use of the error control scheme based on data re-transmission is highly impractical because the higher priority must be given to the securing of the real time performance.

As a solution to this problem, the present inventors and others have proposed a scheme for implementing FEC (Forward Error Correction) on AAL5. (See, H. Esaki, et al.: "Evaluation of High Speed Multimedia Communication Architecture in ATM networks", IEICE Transactions on Communications, Vol. E77-B, No. 11, pp. 1407–1419, November 1994, for example.) This scheme adopts a different approach to realize a reliable communication in which a communication is made by attaching error correction codes to transmission data such that a reproduction of lost data can be carried out at a receiving side even when some data losses or errors are caused within a network.

More specifically, in this scheme, codes similar to the error correction codes provided as an option on the CS layer of AAL5 are applied to sections above the SSCS layer of AAL5. In AAL1, the data re-transmission is practically impossible because the real time communication of speeches, images, etc. from a transmitting side to a receiving side is to be realized, so that there is a measure to strengthen a protection against an error during transmission by way of attaching error correction codes to transmission data. By attaching FEC redundancy codes to data for AAL5 in a substantially similar manner as this interleave scheme provided for AAL1, a real time communication using no data re-transmission or a reliable communication can be guaranteed.

The reasons for using AAL5 rather than AAL3/4 in this scheme are the following.

(1) While the ATM scheme is considered as the most prospective candidate for a next generation communication scheme, AAL for data communication (i.e., AAL5), for which the standardization by standardization organizations such as ITU-T and ATM forum is in progress, has a very high likelihood for being implemented on future high speed terminals (including multimedia terminals).

(2) AAL5 is aimed at realizing a high throughput and a low latency.

It should be noted, however, that it is equally possible to implement this scheme on AAL other than AAL5.

In this implementation, in order to carry out FEC as done on AAL1, it is necessary for a transmitting side to write data given from the upper layer into matrix shaped interleavers once and attach redundancy codes to data, before transferring data. Also, it is necessary for a receiving side to identify locations within the interleavers at a time of transmission for data (cells) which should have arrived but lost, or which have arrived with delays beyond a tolerable range. In AAL1, a sequence number (SN) is attached to a cell at the SAR layer by the default processing, so that it is possible to utilize this sequence number in a case of carrying out FEC as an option, and it is always possible to identify a location or an error. However, in AAL5, there is no processing for identifying a location. For this reason, it has been proposed to provide a function to attach FEC redundancy codes and SN at the SSCS layer which is currently set to be null.

Now, an interleaver considered for use in this scheme has been the same as that used in AAL1, which has a fixed size area for writing data. In AAL1, data to be transferred are CBR (Constant Bit Rate) data such as speeches, so that it is known in advance that data are going to be given from the upper layer continuously at a constant rate, and therefore it suffices to use an interleaver of a sufficiently large fixed size. However, in a case of data transfer, data of what size is going to be given from the upper layer at what timing is unknown in advance. Consequently, when an interleaver of a fixed size is used, if data to be transferred has a size which is considerably smaller than a size of an interleaver, it is necessary to output dummy cells by padding a remaining area with dummy data. This can be particularly problematic when data to be transferred has an overall size which is much smaller than a size of an interleaver, or when data to be transferred in a plurality of interleavers include the last part of data in the last interleaver which has a size much smaller than a size of an interleaver, as considerably many dummy data would be required.

Thus, a use of such an interleaver prevents an effective use of bandwidth, and induces an increase of unnecessary traffics, which could possibly cause a congestion. In addition, unlike the conventional case of AAL1, whenever dummy data are to be entered into each interleaver, there is a need to provide an indicator section in each interleaver in order to indicate where the dummy data start, and there is a need to provide a mechanism for recognizing this indicator section accurately at a receiving side. Such a mechanism has not even been considered in relation to an interleaver used in the conventional AAL1.

Moreover, an existing interleaver carries out a data reading only after all the data given from the upper layer are written into a memory once, so that when writing and reading directions are perpendicular to each other, a latency becomes as much as a time necessary for writing into one interleaver at least. For example, a size of the data region in one interleaver provided as an option on AAL1 in the ITU-T recommendation I.363 is 47×124=5828 octets, and an output of data to the lower layer will be suspended during a period from a timing at which a writing of data into the first column of this region begins until a timing at which a writing of data into the last column of this region begins.

As an alternative interleave scheme, there is a recent proposition of an oblique interleave in which reading and writing directions intersect obliquely, as disclosed in "Status Report on AAL1/2 for video signal transport", ITU-T, SG XIII, Working Document TD/27(Rev.) (13-2)-E, March, 1994-at Geneva. However, even in this interleave scheme, a latency can be reduced to only a half of that in the above noted interleave scheme using perpendicular intersecting reading and writing directions.

In this regard, Matsuzaki et al. "A Study of Error Correction Method with the Alignment between ATM cell and MPEG-2 Transport Packet", The 1994 IEICE Spring Conference, B-853, p. 3-348, March, 1994, disclosed drawings of an interleaver which appears as if reading and writing directions are identical. However, this reference provides no explanation of these drawings, and it is considered on a general ground that this reference requires an operation to write all the data into the interleaver once and then read the data from the interleaver, and that this reference also requires a memory region in a size equivalent to a size of the interleaver for the sake of data writing and reading. It is also noted that this reference aims at accommodating TS (Transport Stream) packets of MPEG-2, and for this reason, a size of a data region of an interleaver shown in drawings is limited to an integer multiple of 188 byte. Consequently, this interleaver is incapable of dealing with arbitrarily variable data to be handled in AAL5.

Furthermore, when FEC redundancy codes are attached to data to be received at a receiving side, the conventional scheme such as that used in AAL1 also has a problem in that at least as much delay as a time required for attaching FEC redundancy codes at a time of transmission conventionally is caused in every deinterleaver processing at a time of reception. This is because, at a time of reception, it is necessary to carry out a processing to store all the arrived data into deinterleavers sequentially, regardless of whether each data belongs to a data region or an FEC redundancy region. Also, in AAL1, it is possible to detect a cell loss by using SN, but a function to detect and correct a bit error within data is provided only by FEC redundancy codes, so that in order to check whether each data is correct or not, it is necessary for a receiving side to carry out a decoding processing using FEC with respect to all the data. The delay caused by these processings can be particularly wasteful in a case where bit errors occur very rarely compared with cell losses such that most data are correct.

Up to this point, the background art concerning a general case including one-to-one communication has been described. In the following, the background art concerning a case of multicast communication in particular will be described.

As a protocol stack for multicast that is widely used in general presently, there exists IP (Internet Protocol) transfer using IP multicast address. In a currently available system, UDP (User Datagram Protocol) is usually used as an upper layer protocol in a case of carrying out IP multicast. Unlike TCP (Transmission Control Protocol), this UDP is a protocol which does not guarantee a reliability end-to-end, so that an error correction is not carried out even when a packet is discarded or a bit error is caused in a course of packet transfer. As a consequence, even if an error rate per one data link is small, as a number of receiving sides increases, an error rate from a point of view of a transmitting side often becomes quite large.

However, an increase of applications such as digital media which adopt multimedia broadcast mode is expected in future, and for such an application, a protocol such as the above noted IP+UDP which does not guarantee data reliability has a possibility of causing an inconvenience in that correct data cannot be reproduced immediately at a receiving side.

In this regard, there are MTP (Multicast Transport Protocol) and RMP (Reliable Multicast Protocol), which are layer-4 protocols which have a function to guarantee data reliability under multicast environment. In these protocols, when an error occurs during data transfer, a transmitting side re-transmits an identical data in response to a re-transmission request from a receiving side. Although such an error correction based on re-transmission can guarantee data reliability, it is impossible for these protocol to guarantee real time performance at the same time.

SUMMARY OF THE INVENTION

It is therefore an object of the present invention to provide a scheme for error control on AAL in ATM networks which is capable of realizing a reliable communication with a high throughput and a low latency.

According to one aspect of the present invention there is provided a method of error control at an AAL (ATM Adaptation Layer) level, comprising the steps of: (a) segmenting continuous data to be transmitted given from an upper layer into a sequence of data in a prescribed length, and sequentially writing each data into each column of a matrix shaped data region in an interleaver; (b) variably setting a last column of the data region in the interleaver as a column of the data region in the interleaver determined in relation to one column into which a last data is written in the interleaver by the step (a), obtaining an error control code for the data up to the last column in each row of the data region in the interleaver, and writing each obtained error control code into a corresponding location within a matrix shaped error control code region in the interleaver; and (c) reading contents of each column of the data region and the error control code region in the interleaver, attaching a prescribed header/trailer to a prescribed number of columns of the data and/or the error control codes read out from the interleaver to form a data unit, and sequentially giving each data unit to a lower layer such that data units are transmitted in forms of ATM cells and an error correction using the error control codes can be carried out for the data at a receiving side when an error occurs during data transfer.

According to another aspect of the present invention there is provided a method of error control at an AAL (ATM Adaptation Layer) level, comprising the steps of: (a) segmenting continuous data to be transmitted given from an upper layer into a sequence of data in a prescribed length, and sequentially giving each data to a lower layer; (b) obtaining error control codes for the data while the data are sequentially given to the lower layer at the step (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs, and calculating each error control code for the data up to the last column in each row of the interleaving matrix; and (c) attaching a prescribed header/trailer to a prescribed amount of the data and/or the error control codes sequentially given to the lower layer by the steps (a) and (b) to form a data unit, such that the data units are transmitted in forms of ATM cells and an error correction using the error control codes can be carried out for the data at a receiving side when an error occurs during data transfer.

According to another aspect of the present invention there is provided a method of error control at an AAL (ATM Adaptation Layer) level, comprising the steps of: (a) checking headers/trailers containing sequence numbers in a sequence of data units for data and error control codes given from a lower layer, and deleting the headers/trailers from the data units; (b) sequentially writing the data and the error control codes of the data units with the headers/trailers deleted at the step (a) into a deinterleaver having matrix shaped data region and error control code region according to an information contained in the headers/trailers, and detecting an end of a sequence of data units according to the information contained in the headers/trailers; (c) carrying out error detection and error correction for the data written into the deinterleaver at the step (b), so as to decode correct data; and (d) reading decoded correct data obtained at the step (c) from the deinterleaver, and sequentially giving the decoded correct data to an upper layer.

According to another aspect of the present invention there is provided a method of error control at an AAL (ATM Adaptation Layer) level, comprising the steps of: (a) segmenting continuous data to be transmitted given from an upper layer into a sequence of data in a prescribed length, and sequentially giving each data to a lower layer; (b) obtaining error control codes for the data while the data are sequentially given to the lower layer at the step (a), and sequentially giving obtained error control codes to the lower layer in succession to the data; and (c) attaching a prescribed header/trailer containing a sequence number to a prescribed amount of the data and/or the error control codes sequentially given to the lower layer by the steps (a) and (b) to form CPCS (Common Part Convergence Sublayer) protocol data units in which the data given by the step (a) and the error control codes given by the step (b) in succession to the data given by the step (a) belong to different CPCS protocol data units, such that the CPCS protocol data units are transmitted in forms of ATM cells and an error correction using the error control codes can be carried out for the data at a receiving side when an error occurs during data transfer.

According to another aspect of the present invention there is provided a method of error control at an AAL (ATM Adaptation Layer) level, comprising the steps of: (a) receiving a sequence of CPCS (Common Part Convergence Sublayer) protocol data units for data and CPCS protocol data units for corresponding error control codes given from a lower layer; (b) carrying out an error detection using a CPCS trailer for the CPCS protocol data units for the data; (c) carrying out an error correction for the data in which an error is detected at the step (b) by using the corresponding error control codes at SSCS (Service Specific Convergence Sublayer), and giving only corrected data to an upper layer; and (d) giving the data in which no error is detected at the step (b) to the upper layer by skipping the step (c), regardless of a presence or absence of an error in the CPCS protocol data units for the corresponding error control codes.

According to another aspect of the present invention there is provided a method of data re-transmission control in a communication using an error correction function by FEC (Forward Error Correction) and an error correction function by re-transmission, comprising the steps of: (a) receiving at a transmitting terminal a re-transmission request from a receiving terminal requesting a re-transmission of erroneous communication data which are received with errors that cannot be corrected by the error correction function by FEC at the receiving terminal; (b) determining a minimum amount of re-transmission data necessary in recovering the erroneous communication data by using the error correction function by FEC and the error correction function by re-transmission, according to the re-transmission request received by the step (a) and an error-correction capability of the error correction function by FEC; and (c) re-transmitting the minimum amount of re-transmission data determined by the step (b) from the transmitting terminal to the receiving terminal.

According to another aspect of the present invention there is provided a system for error control at an AAL (ATM Adaptation Layer) level, comprising: (a) unit for segmenting continuous data to be transmitted given from an upper layer into a sequence of data in a prescribed length, and sequentially writing each data into each column of a matrix shaped data region in an interleaver; (b) unit for variably setting a last column of the data region in the interleaver as a column of the data region in the interleaver determined in relation to one column into which a last data is written in the interleaver by the unit (a), obtaining an error control code for the data up to the last column in each row of the data region in the interleaver, and writing each obtained error control code into a corresponding location within a matrix shaped error control code region in the interleaver; and (c) unit for reading contents of each column of the data region and the error control code region in the interleaver, attaching a prescribed header/trailer to a prescribed number of columns of the data and/or the error control codes read out from the interleaver to form a data unit, and sequentially giving each data unit to a lower layer such that data units are transmitted in forms of ATM cells and an error correction using the error control codes can be carried out for each data unit at a receiving side when an error occurs during data transfer.

According to another aspect of the present invention there is provided a system for error control at an AAL (ATM Adaptation Layer) level, comprising: (a) unit for segmenting continuous data to be transmitted given from an upper layer into a sequence of data in a prescribed length, and sequentially giving each data to a lower layer; (b) unit for obtaining error control codes for the data while the data are sequentially given to the lower layer at the unit (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs, and calculating each error control code for the data up to the last column in each row of the interleaving matrix; and (c) unit for attaching a prescribed header/trailer to a prescribed amount of the data and/or the error control codes sequentially given to the lower layer by the unit (a) and (b) to form a data unit, such that the data units are transmitted in forms of ATM cells network and an error correction using the error control codes can be carried out for each data unit at a receiving side when an error occurs during data transfer.

According to another aspect of the present invention there is provided a system for error control at an AAL (ATM Adaptation Layer) level, comprising: (a) unit for checking headers/trailers containing sequence numbers in a sequence of data units for data and error control codes given from a lower layer, and deleting the headers/trailers from the data units; (b) unit for sequentially writing the data and the error control codes of the data units with the headers/trailers deleted at the unit (a) into a deinterleaver having matrix shaped data region and error control code region according to an information contained in the headers/trailers, and detecting an end of a sequence of data units according to the information contained in the headers/trailers; (c) unit for carrying out error detection and error correction for the data written into the deinterleaver at the unit (b), so as to decode correct data; and (d) unit for reading decoded correct data obtained at the unit (c) from the deinterleaver, and sequentially giving the decoded correct data to an upper layer.

According to another aspect of the present invention there is provided a system for error control at an AAL (ATM Adaptation Layer) level, comprising: (a) unit for segmenting continuous data to be transmitted given from an upper layer into a sequence of data in a prescribed length, and sequentially giving each data to a lower layer; (b) unit for obtaining error control codes for the data while the data are sequentially given to the lower layer at the unit (a), and sequentially giving obtained error control codes to the lower layer in succession to the data; and (c) unit for attaching a prescribed header/trailer containing a sequence number to a prescribed amount of the data and/or the error control codes sequentially given to the lower layer by the unit (a) and (b) to form CPCS (Common Part Convergence Sublayer) protocol data units in which the data given by the unit (a) and the error control codes given by the unit (b) in succession to the data given by the unit (a) belong to different CPCS protocol data units, such that the CPCS protocol data units are transmitted in forms of ATM cells and an error correction using the error control codes can be carried out for the data at a receiving side when an error occurs during data transfer.

According to another aspect of the present invention there is provided a system for error control at an AAL (ATM Adaptation Layer) level, comprising: (a) unit for receiving a sequence of CPCS (Common Part Convergence Sublayer) protocol data units for data and CPCS protocol data units for corresponding error control codes given from a lower layer; (b) unit for carrying out an error detection using a CPCS trailer for the CPCS protocol data units for the data; (c) unit for carrying out an error correction for the data in which an error is detected at the unit (b) by using the corresponding error control codes at SSCS (Service Specific Convergence Sublayer), and giving only corrected data to an upper layer; and (d) unit for giving the data in which no error is detected at the unit (b) to the upper layer by skipping the unit (c), regardless of a presence or absence of an error in the CPCS protocol data units for error control codes.

According to another aspect of the present invention there is provided a system for data re-transmission control in a communication using an error correction function by FEC (Forward Error Correction) and an error correction function by re-transmission, comprising the steps of: (a) unit for receiving at a transmitting terminal a re-transmission request from a receiving terminal requesting a re-transmission of erroneous communication data which are received with errors that cannot be corrected by the error correction function by FEC at the receiving terminal; (b) unit for determining a minimum amount of re-transmission data necessary in recovering the erroneous communication data by using the error correction function by FEC and the error correction function by re-transmission, according to the re-transmission request received by the unit (a) and an error correction capability of the error correction function by FEC; and (c) unit for re-transmitting the minimum amount of re-transmission data determined by the unit (b) from the transmitting terminal to the receiving terminal.

Other features and advantages of the present invention will become apparent from the following description taken in conjunction with the accompanying drawings.

BRIEF DESCRIPTION OF THE DRAWINGS

FIG. 3 is a schematic block diagram of internal configurations of a transmitting side and receiving side terminals the first embodiment of an error control scheme according to the present invention.

FIG. 12 is a diagram showing an exemplary manner of reading data from the interleaver in the first embodiment of an error control scheme according to the present invention.

FIG. 16A, 16B and 16C are diagrams showing various code word configurations that can be used in the first embodiment an error control scheme according to the present invention.

FIG. 23 is a diagram showing one table that can be conveniently used in exemplary FEC processing schemes in the first embodiment of an error control scheme according to the present invention.

FIG. 24 is a diagram showing another table that can be conveniently used in exemplary FEC processing schemes in the first embodiment of an error control scheme according to the present invention.

FIG. 31 is a schematic diagram of one-to-multiple communication system used in the second embodiment of an error control scheme according to the present invention, in a case of re-transmission requests from a plurality of receiving side terminals.

DETAILED DESCRIPTION OF THE PREFERRED EMBODIMENTS

Now, the preferred embodiments of an error control scheme according to the present invention will be described in detail with references to drawings.

In the embodiments described below, a case of carrying out a data communication using AAL5 through an ATM network between a transmitting side terminal and a receiving side terminal will be described, but the present invention is equally applicable to other types of communication in the ATM networks using other types of AAL.

It is assumed here that processings such as large capacity transactions are carried out between the terminals and data exchanges between the terminals are required to be made by a data communication with a low latency (for which re-transmission control is basically not permitted), a high throughput, and a data reliability. For example, the terminals may be connected through public networks in a manner of WAN, and the terminals may be far distanced physically.

The present invention provides a scheme for enabling a reproduction of correct data without data re-transmission when a cell loss occurs within a transmission path or an ATM switch during data transmission, by using of error correction bits for FEC attached to data to be exchanged between the terminals.

In the following description, a case of cell loss which is characteristic to ATM will be mainly considered, but in an actual data communication, there is also a possibility for an occurrence of a bit error. In order to correct such a bit error, it is possible to adopt a scheme in which a CRC (Cyclic Redundancy Check) field is provided in an SSCS header/trailer as will be described in detail below, a bit error detection is carried out for each cell, and a cell for which an error is detected is discarded such that it can be handled as a case of cell loss. It is also possible to adopt a scheme using Reed-Solomon (RS) codes as error correction codes in which an error can be corrected even when a location of a bit error within an interleaver is unknown. In this latter scheme, however, it is necessary to carry out a decoding operation for the sake of identifying an error location at a receiving side.

In the present invention, the transmitting side terminal and the receiving side terminal are ATM terminals using AAL5. Then, the FEC function is implemented on an SSCS layer which is an upper layer of a CPCS layer on AAL5, so as to realize a data communication of error-free data with a high throughput and a low latency.

First Embodiment One-To-One Communication

Now, the first embodiment of an error control scheme according to the present invention, which is concerned with a case of one-to-one communication between terminals, will be described in detail.

Figure 1:
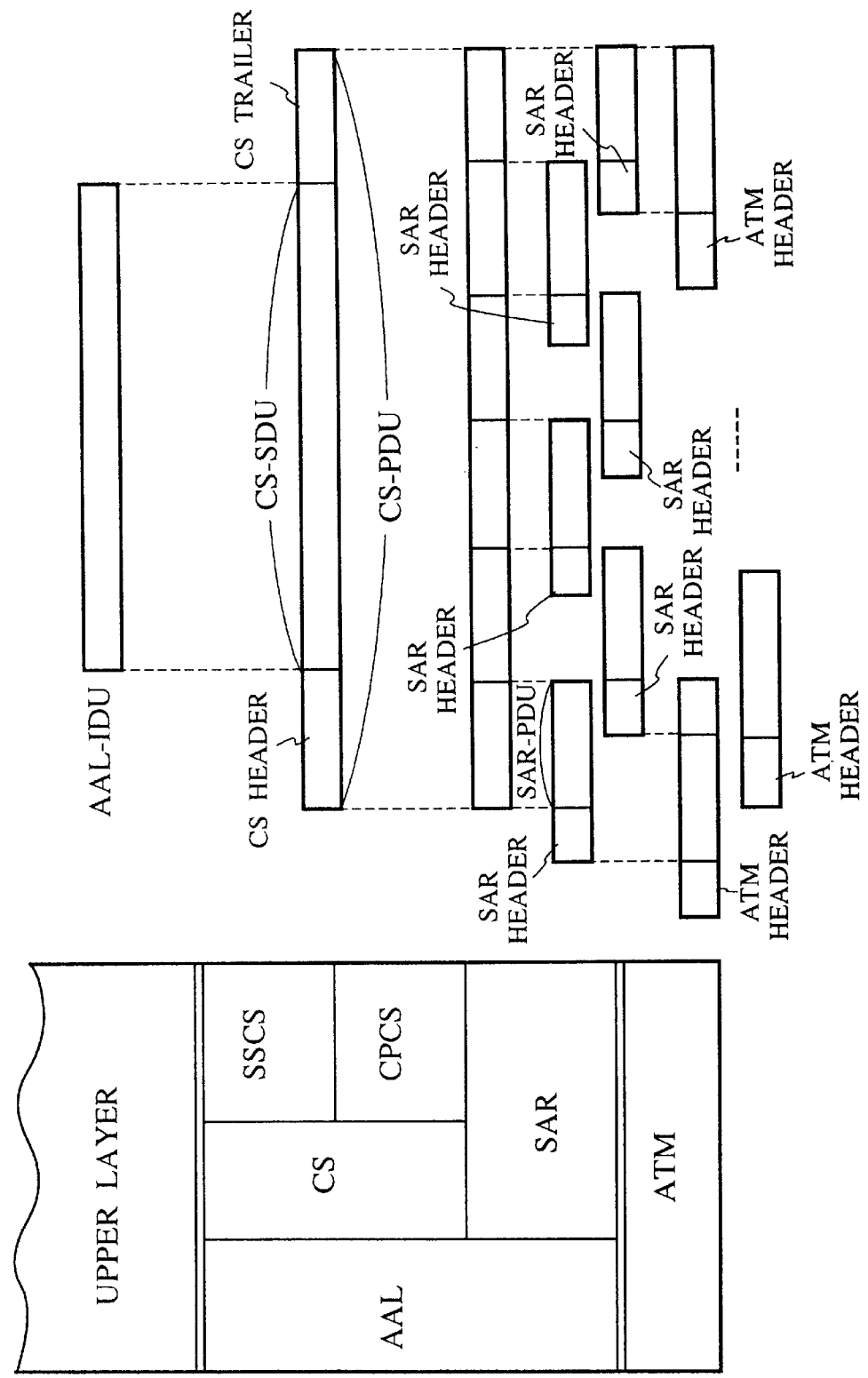
FIG. 1 is a diagram showing a conventionally known configuration of AAL Type 5.
Figure 2:
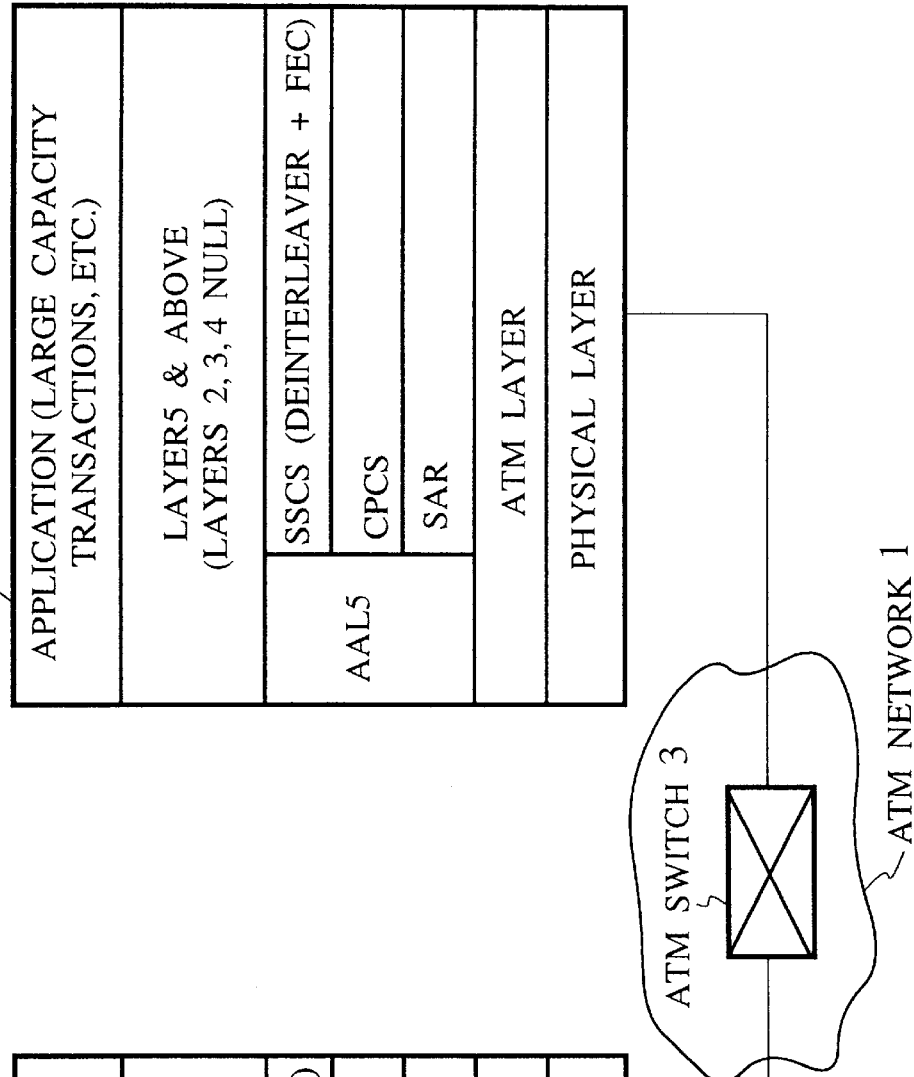
FIG. 2 is a schematic diagram showing a structure of protocol stacks for transmitting side and receiving side terminals in the first embodiment of an error control scheme according to the present invention.

FIG. 2 shows a structure of protocol stacks for terminals in this first embodiment, which are for U plane communication (i.e., communication between applications). In FIG. 2, a transmitting side terminal $2t$ and a receiving side terminal $2r$ are connected through an ATM network 1 having an ATM switch 3.

On both of the transmitting side terminal $2t$ and the receiving side terminal $2r$, applications such as large capacity transactions are operated, and large capacity, real time data are to be transferred from the transmitting side terminal $2t$ to the receiving side terminal $2r$. Here, it is assumed that the terminals $2t$ and $2r$ are directly connected through an end-to-end ATM connection is established between the applications in advance. Consequently, layers 2, 3, and 4 among layer 5 and above are normally set to be null as shown in FIG. 2.

If the transmitting side terminal $2t$ and the receiving side terminal $2r$ are to be connected through at least one router for some reason, it is necessary for that router to carry out the similar FEC processing as an SSCS layer processing.

In the ATM adaptation layer, the already standardized AAL5 is implemented, and the interleaver processing and the FEC processing according to the present invention are implemented on an SSCS layer of AAL5, so as to realize a reliable end-to-end communication. AAL5 has CPCS layer and SAR layer below the SSCS layer, and below AAL5, there are ATM layer and physical layer, as usual.

Here, in order to increase the reliability further, it is also possible to implement a light weight re-transmission control protocol on a layer 4 of transport protocol, which is set to be null in FIG. 2. Namely, FEC has a limit in its correction capability depending on a level of redundancy, and FEC should be designed such that most errors fall within a range of its correction capability, but the re-transmission control protocol may be additionally implemented just in case there happens to be errors beyond a range of correction capability of FEC (i.e., a case in which errors cannot be corrected). In this manner, even when there arises a situation in which a large number of losses causing errors beyond a range of correction capability of FEC occur, it is still possible to maintain the data reliability by using the re-transmission control at least, though this re-transmission control causes some delay so that the real time performance may not be maintained.

FIG. 3 shows internal configurations of the transmitting side terminal $2t$ and the receiving side terminal $2r$.

The transmitting side terminal $2t$ carries out application processings (such as global transaction processings), and transmits application data to the receiving side terminal $2r$. As shown in FIG. 3, the transmitting side terminal $2t$ comprises: an application processing module $4t$; an SSCS processing module $6t$ including an interleaver module $8t$, an FEC attaching module $10t$, and an SSCS header/trailer attaching module $12t$; a CPCS processing module $14t$ including an LI (Length Indicator) attaching module $16t$ and a CRC attaching module $18t$; an SAR processing module $20t$ for segmentation; and an ATM header attaching module $22t$.

The application processing module $4t$ carries out a processing for giving the application data to the SSCS processing module $6t$.

The SSCS processing module $6t$ carries out an interleave operation with respect to the data given from the application processing module $4t$ at the interleaver module $8t$, attaches FEC redundancy codes to the data at the FEC attaching module $10t$, attaches an SSCS header/trailer with respect to each column of the interleaver at the SSCS header/trailer attaching module $12t$, and gives the resulting data to the CPCS processing module $14t$.

The CPCS processing module $14t$ carries out the CPCS processing of AAL5 for attaching a CPCS trailer, including calculation and attaching of a length indicator at the LI attaching module $16t$ and calculation and attaching of a CRC at the CRC attaching module $18t$, and gives the resulting data to the SAR processing module $20t$.

The SAR processing module $20t$ carries out the segmentation with respect to the data given from the CPCS processing module $14t$, as a usual SAR layer processing of AAL5, and gives the segmented data to the ATM header attaching module $22t$.

The ATM header attaching module $22t$ attaches an ATM header to each segmented data. The resulting data are then subjected to processings at lower layers not shown in FIG. 3, and sent into the ATM network 1 as cells.

On the other hand, the receiving side terminal $2r$ comprises: an application processing module $4r$; an SSCS processing module $6r$ including a deinterleaver module $8r$, an FEC correcting module $10r$, and an SSCS header/trailer checking module $12r$; a CPCS processing module $14r$ including an LI checking module $16r$ and a CRC checking module $18r$; an SAR processing module $20r$ for reassembly; and an ATM header deleting module $22r$.

In this receiving side terminal $2r$, the processings of the physical layer and the ATM layer not shown in FIG. 3 are carried out with respect to the cell flow entered from the ATM network 1, and cells destined to this terminal are selectively taken out.

Then, the ATM header deleting module 22r deletes the ATM header from each cell, and gives the resulting data to the SAR processing module 20r. At this point, if a bit for indicating a last part of CS-PDU is indicated in an UUI (User-User Information) region of PT (Payload Type) field in the ATM cell header, this fact is notified to the SAR processing module 20r.

The SAR processing module 20r carries out the reassembly processing of AAL5 with respect to the data given from the ATM header deleting module 22r, i.e., the payload sections of cells, while referring to an information on the last part of CS-PDU, and gives the reassembled CS-PDU to the CPCS processing module 14r.

The CPCS processing module 14r reproduces CS-SDU (CS-Service Data Unit) by carrying out the CPCS layer processing of AAL5, including the checking of CRC at the CRC checking module 18r and the checking of the length indicator at the LI checking module 16r, with respect to the reassembled CS-PDU given from the SAR processing module 20r.

The SSCS header/trailer checking module 12r checks and deletes the SSCS header/trailer attached to CS-SDU given from the CPCS processing module 14r, and gives the resulting data to the deinterleaver module 8r.

At this point, if an error has been detected in the CPCS trailer by the CRC checking module 18r in the CPCS processing module 14r, it is necessary for this SSCS header/trailer checking module 12r to receive a notice for this fact from the CPCS processing module 14r.

Then, when there is no notice for a detection of an error (i.e., a usual case of no error), the SSCS header/trailer checking module 12r at least carries out the deletion of the SSCS header/trailer and the identification of the payload on the SSCS layer (as either data or error correction codes), with respect to data sequence contained in CPCS-PDU for which there is no notice for a detection of an error. If the bit sequence contained in the payload is data, the header/trailer is deleted, and the bit sequence is given to the upper layer by passing through the deinterleaver 8r. If the bit sequence contained in the payload is error correction codes, header/trailer+payload can be discarded. This is because an absence of an error in that CPCS-PDU as a whole is guaranteed by the error detection on the CPCS layer, so that there is no need to carry out the error correction anymore. In this case, at the SSCS processing module 6r, only the SSCS header/trailer checking module 12r is operated, and the FEC correcting module 10r is not operated at all while no data sequence is written into the deinterleaver of the deinterleaver module 8r.

On the other hand, when there is a notice for a detection of an error, the SSCS header/trailer checking module 12r carries out the deletion of the SSCS header/trailer, the identification of the payload on the SSCS layer (as either data or error correction codes), and the checking of a sequence number, etc., depending on needs over the entire fields of the attached header, with respect to data sequence contained in CPCS-PDU for which there is a notice for a detection of an error. Then, according to the information of the SSCS header/trailer, the SSCS header/trailer checking module 12r returns the data sequence to the most appropriate location within the deinterleaver of the deinterleaver module 8r. In addition, the SSCS header/trailer checking module 12r notifies a skipped location within the deinterleaver at which a cell loss occurred as indicated by a gap in the sequence numbers to the FEC correcting module 10r. Here, depending on the function of the SSCS header/trailer, the information concerning the data sequence containing a bit error may also be notified to the FEC correcting module 10r. Then, with respect to the data sequence returned into the deinterleaver, the deinterleaver module 8r and the FEC correcting module 10r carry out the error correction in cooperation, so as to decode correct data.

For the data correctly reproduced at the deinterleaver module 8r, the data sequence in the data region within the deinterleaver is then given from the SSCS processing module 6r to the application processing module 4r as the application data.

It is to be noted that each individual module described above can be realized by using either a hardware processing or a software processing. For example, the application processing modules 4t and 4r and the SSCS processing modules 6t and 6r can be implemented as software processings by CPUs provided inside the respective terminals 2t and 2r, while the CPCS processing modules 14t and 14r, the SAR processing modules 20t and 20r, and the ATM header attaching/deleting modules 22t and 22r can be implemented as hardwares provided inside the respective terminals 2t and 2r.

Next, the processings at the transmitting side terminal 2t will be described in an order of layers.

(A) Processings at the Application Processing Module 4t

Figure 4:
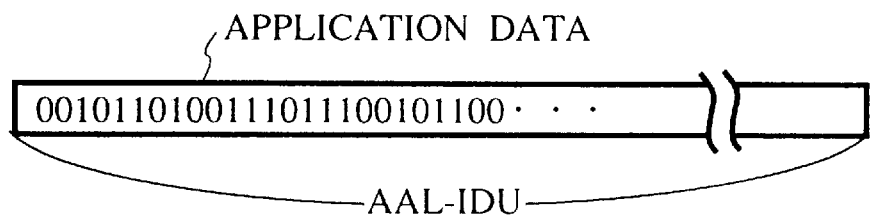
FIG. 4 is a diagram showing an exemplary application data given as AAL-IDU used in the first embodiment of an error control scheme according to the present invention.

First, application data (AAL-IDU: AAL-Interface Data Unit) formed by bit sequence such as that shown in FIG. 4 is generated at the application processing module 4t. A length of the application data is different for different applications, and in general the application data are data with a wide range variable length. An interval for generating the application data is also different for different applications, and there are a variety of cases including a case of consecutive generation, a case of intermittent generation, a case of fragmentary generation, etc.

The application processing module 4t then gives the generated application data (AAL-IDU) to the interleaver module 8t, and notifies an end of one application data as a delimiter to the interleaver module 8t whenever one application data ends.

(B) Processings at the Interleaver Module 8t

The interleaver module 8t sequentially writes the AAL-IDU (that is the application data given from the application processing module 4t) into a data region of a matrix shaped memory constituting an interleaver. Here, the writing is carried out from an upper left corner in a vertical direction, column by column, as indicated in FIG. 5, for example.

Figure 5A:
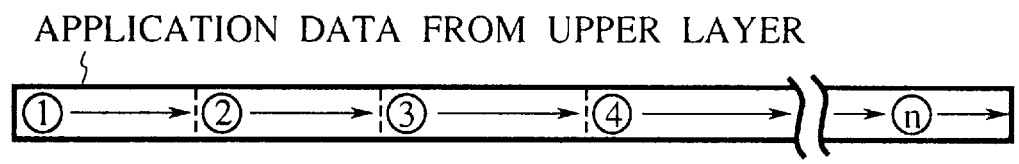
FIG. 5 is a diagram showing one exemplary manner of writing data into the interleaver in the first embodiment of an error control scheme according to the present invention.
Figure 5B:
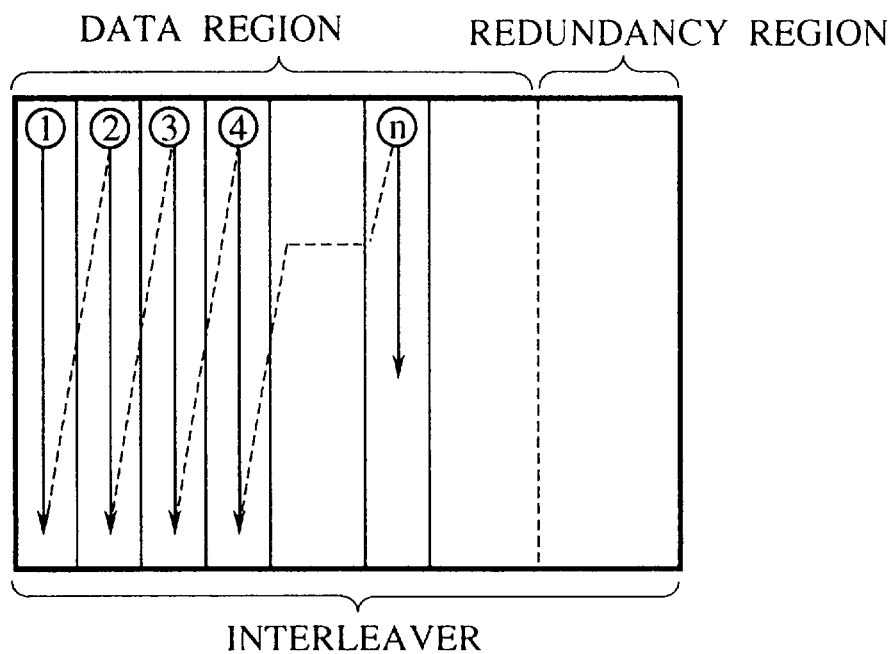
Figure 6A:
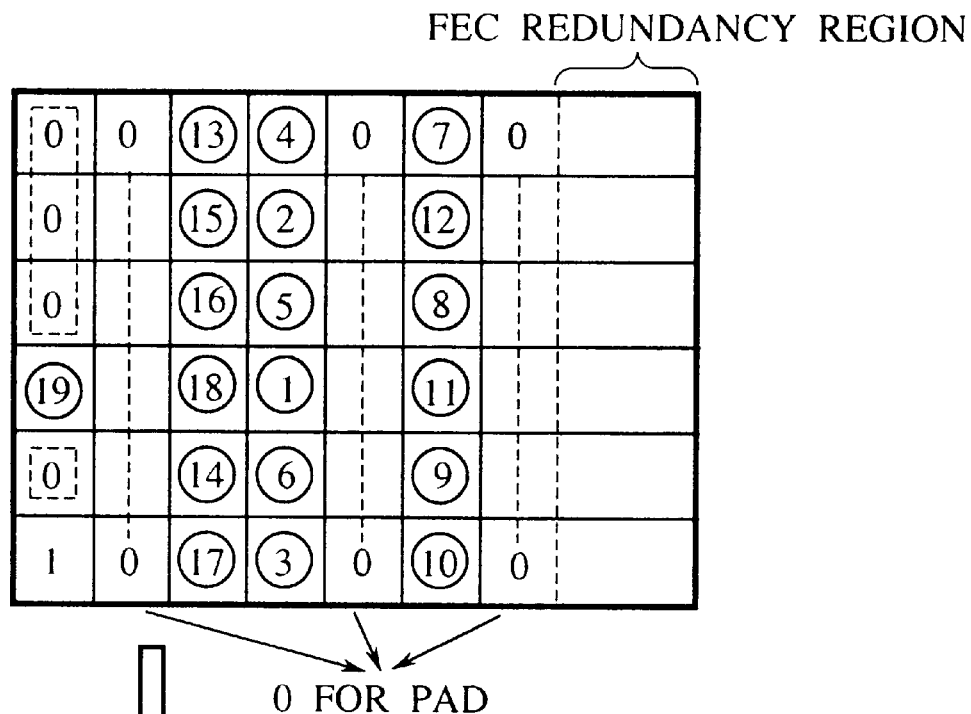
FIG. 6 is a diagram showing another exemplary manner of writing data into the interleaver in the first embodiment of an error control scheme according to the present invention.
Figure 6B:
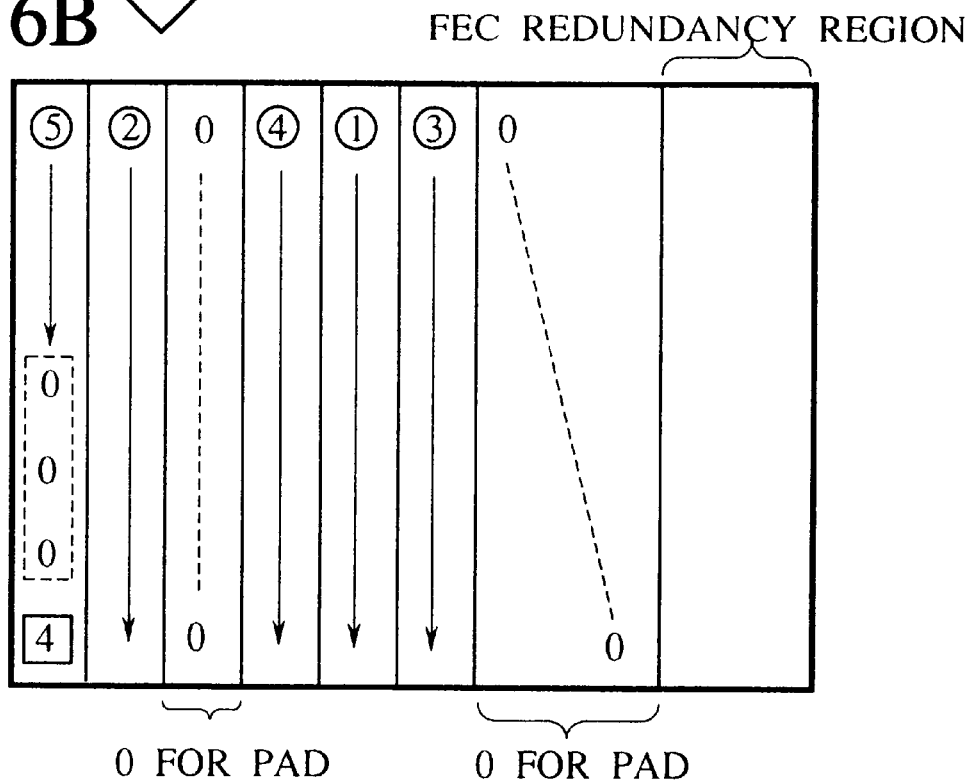

It is noted that this manner of writing data into the interleaver shown in FIG. 5 is only an exemplary one, and may be replaced by any other manners using different order of writing and/or different direction of writing, such as that indicated in FIG. 6.

The data will not be written into an FEC redundancy region, and a result of calculation predetermined for each symbol of each row that is carried out after the data writing is finished will be written into a corresponding row of the FEC redundancy region. Here, it is also possible to adopt a scheme in which, instead of writing the result of calculation into the interleaver region of a memory, the result of calculation is stored in a logically separate memory and read out from this logically separate memory to a lower layer according to the need.

A size of the interleaver can be set in any desired value, but the size of the interleaver that has been standardized as an option in ITU-U recommendation I.363 is that: with one symbol given by one octet, a size in a horizontal direction (row) is 124 symbols for the data region and 4 symbols for the FEC redundancy region; and a size in a vertical direction (column) is a length equal to that in which SAR header length is subtracted from a cell length, i.e., 47 octets. There is also another value for a size of the interleaver that has been standardized as an option on AAL1 in which the vertical size is 8 symbols, a horizontal size is 88 symbols for the data region and 6 symbols for the FEC redundancy region, with one symbol given by one octet as before. From a point of view of the present invention, however, the size other than these may be used, if desired.

In the following description, several values are used as exemplary sizes of the interleaver, and each such value indicates the maximum value that can be used as the data region in the interleaver, and it is possible to make the actual size of the data region smaller than that maximum value depending on a size of the application data. When a size of the application data is so large that it cannot fit into one interleaver even when an entire horizontal size of the interleaver is fully used, the application data will be transferred by using a plurality of interleavers, just as in a case of the CBR transfer on AAL1. It is also noted that there are several practical candidates for a vertical size of the interleaver depending on a size of a payload of a cell to be used.

For example, consider a case of using a scheme in which one SSCS header/trailer and one CPCS trailer of AAL5 are to be attached with respect to one column of the interleaver. In this case, a vertical length can be set equal to that in which SSCS header/trailer part (which can be 1 octet in order to minimize the overhead due to the header/trailer portion) and the CPCS trailer part (8 octets) are subtracted from the payload length of a cell, i.e., 48−1−8=39 octets, for example. Alternatively, by using one column for a plurality of cells such as two cells, a vertical length can be set equal to 39+48=87 octets, for example.

A case of larger vertical size and a case of smaller vertical size can be compared as follows. Namely, regarding SSCS-PDU which has one column of the interleaver as described above for the payload, if SSCS header/trailer length is the same, a case of larger vertical size has an advantage of a higher packing efficiency for the upper layer data. On the other hand, for the larger vertical size, there is a higher probability for the data sequence to be transferred to end in a middle of one column, so that it is necessary to fill up a remaining portion of that column by padding and this in turn may cause a lowering of the packing efficiency. In order to select an appropriate value for the vertical size, these factors should be taken into account. It should also be noted that when the vertical size is excessively large, it is possible to cause some other problems such as that of a tendency to contain random bit errors, that of an increase of an overhead of FEC codes, etc.

As for the horizontal size, assuming that the Reed-Solomon code (RS code) having n bits for one symbol is to be used as the error correction code as in a conventional case, the maximum length is usually limited to $(2^n-1)$ symbols. When the expanded RS code is used, it is possible to make the horizontal length longer than that by one or two symbols, but the expanded RS code requires more complicated decoding processing and error correction processing after the reception compared with the normal RS code. Consequently, in the present embodiment, the expanded RS code will not be used. For a value of n, it is common to use 8 or an integer multiple of 8, in view of an ease of processing by software.

Figure 7:
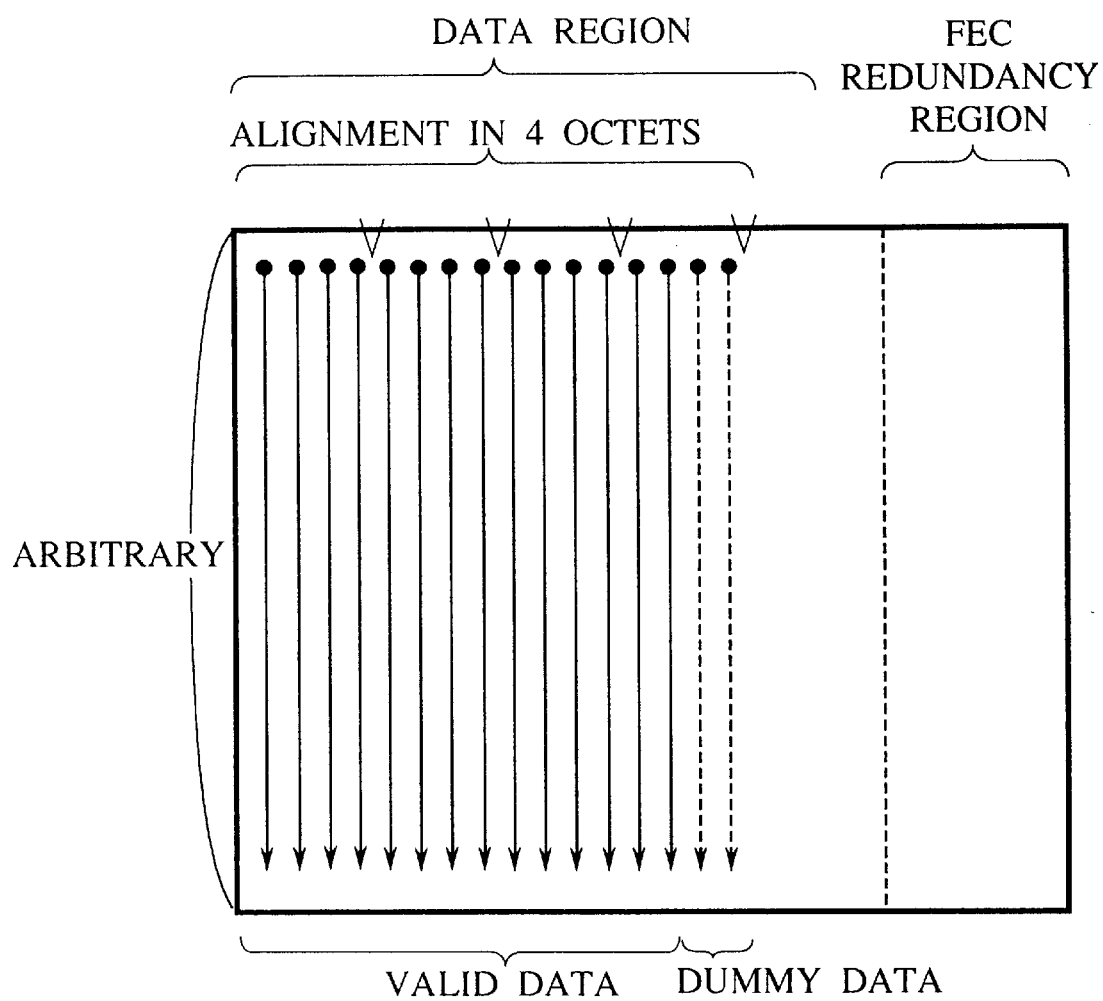
FIG. 7 is a diagram showing an alignment of data in the interleaver that can be used in the first embodiment of an error control scheme according to the present invention.

As illustrated in FIG. 7, there is also a scheme in which the horizontal size of the interleaver is set equal to an integer multiple of 4 octets, within a range of not exceeding the above described interleaver size. In this scheme, when one symbol of the RS code is set to be n bits for example, it implies that a product of n and a number of symbols per column becomes an integer multiple of 32. Considering a case of realizing the FEC function by software, the data write/read with respect to the interleaver is going to be carried out virtually by a computer, and it is easier for a CPU of a computer to handle a memory access in units of 4 octets, so that the alignment as shown in FIG. 7 is preferable in some cases, even if it requires the padding to make up 4 octet when there is not enough valid data.

Next, consider a case of attaching one CPCS trailer to each of the data region and the FEC redundancy region, which will be described in further detail later. In this case, it suffices to consider SSCS header/trailer part in order to determine the vertical length of the interleaver. Therefore, setting the overhead due to SSCS layer as one octet, for example, 48−1=47 octets can be considered as appropriate. However, in this case, no consideration is given to the fact that an increased part of 8 octets due to CPCS trailer must also be transmitted as a payload of a cell, so that there is a need to adopt either a scheme for securing 8 octets for this purpose within the data region of the interleaver, or a scheme in which this is furnished by a function for aligning CPCS layer. In the latter scheme, only CPCS trailer is going to be stored in one cell, so that 40 octets of padding will be required and there is a problem of a large overhead. Consequently, the former scheme for securing a space of 8 octets for CPCS layer within the data region of the interleaver in advance has a better packing efficiency.

As already mentioned above, in a case of data transfer, a size of AAL-IDU is not constant, and there is a need for the SSCS processing module $6t$ to recognize this size of AAL-IDU and notifies it to the SSCS processing module $6r$ on the receiving side. In many protocols, an end (delimiter) of AAL-IDU can be detected at the SSCS processing module $6t$, so that it is possible for the SSCS layer to recognize this size in advance. Consequently, it is necessary to make a clear indication for a location within the interleaver up to which the data have been written at the SSCS layer on the transmitting side, such that this can be recognized at the SSCS layer on the receiving side.

Now, the final state resulting after AAL-IDU of arbitrary size are stored in the interleaver will be described for exemplary cases described above. In the following examples, it is assumed that various factors such as a maximum size of the interleaver, a size of FEC region, a size and a format of SSCS-PDU, etc. for each connection are already negotiated at a time of call set up.

Figure 8:
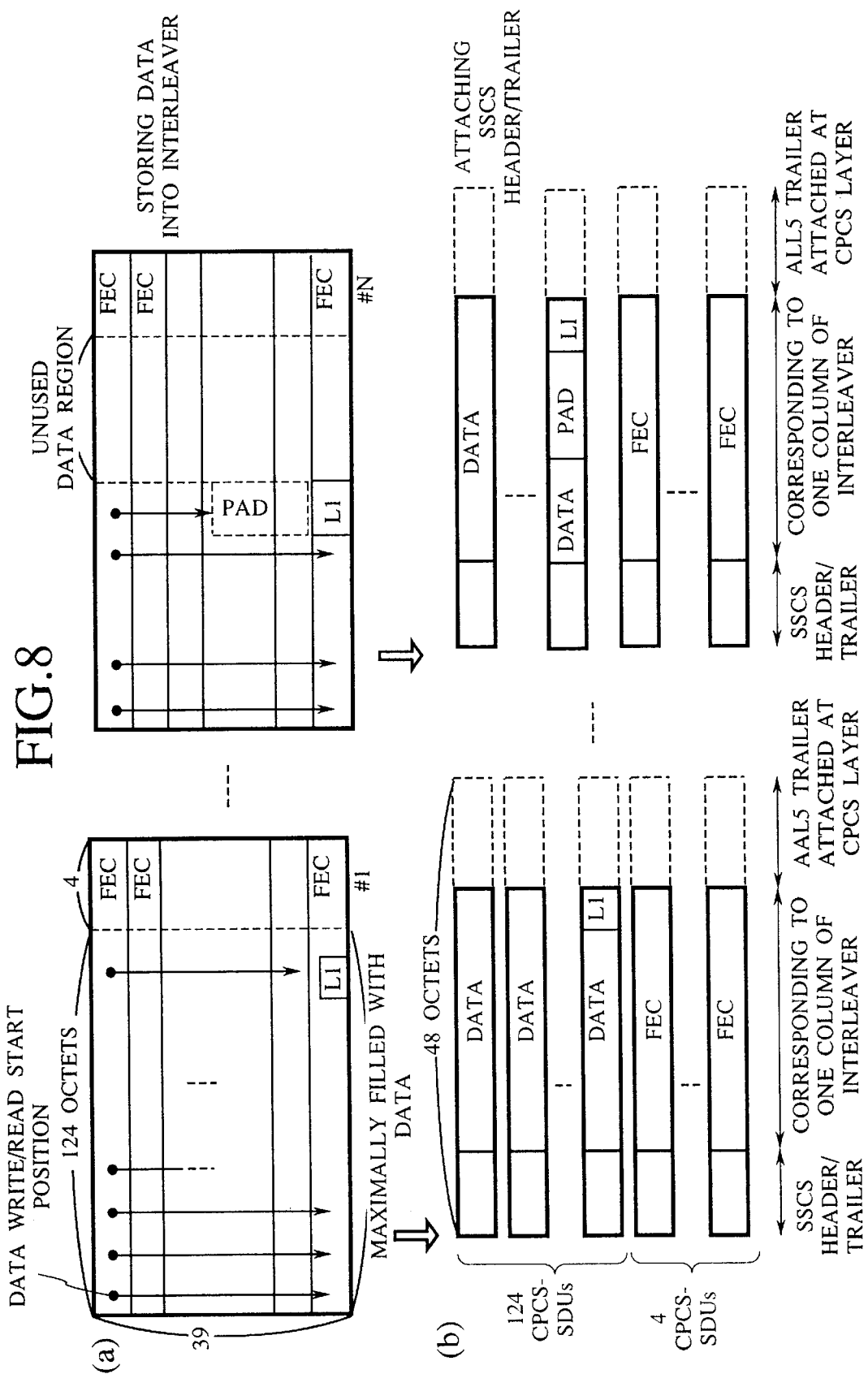
FIG. 8 is a diagram showing one exemplary state in which data are stored in the interleaver in the first embodiment of an error control scheme according to the present invention.

FIG. 8 shows an example in which the vertical size of the interleaver is 39 octets. This is an example in which one octet of SSCS header/trailer (which provides header as indicated in a part (b) of FIG. 8), and one CPCS trailer are attached with respect to each column. A number of maximum columns in the interleaver is 128 octets, and each row has the FEC region in a size of 4 octets.

This example of FIG. 8 illustrates a case in which the application data of a relatively large size has been stored, so that the application data extend over a plurality of interleavers (#1 to #N). Of course, the application data of a small size can also be stored in the similar state as shown in FIG. 8. The interleaver #1 shown in a part (a) of FIG. 8 is an interleaver whose data region has been used up to the maximum value allowed in this example, where an amount of valid data contained in the last column is indicated in the LI field provided by the last one octet of the last column. On the other hand, the interleaver #N shown in a part (a) of FIG. 8 is an interleaver whose data region still has some unused portion remaining, i.e., an interleaver in which the application data ended in a middle of its data region, and the last column may include the padding as shown in FIG. 8. In this interleaver #N, an amount of valid data contained in the last column is indicated in the LI field provided by the last one octet of the last column, just like the interleaver #1. Consequently, when a sum of the valid data length in the last column and one octet of the LI field is less than 39 octets, the pad is inserted for as many octets as necessary to make up 39 octets in total.

Figure 9:
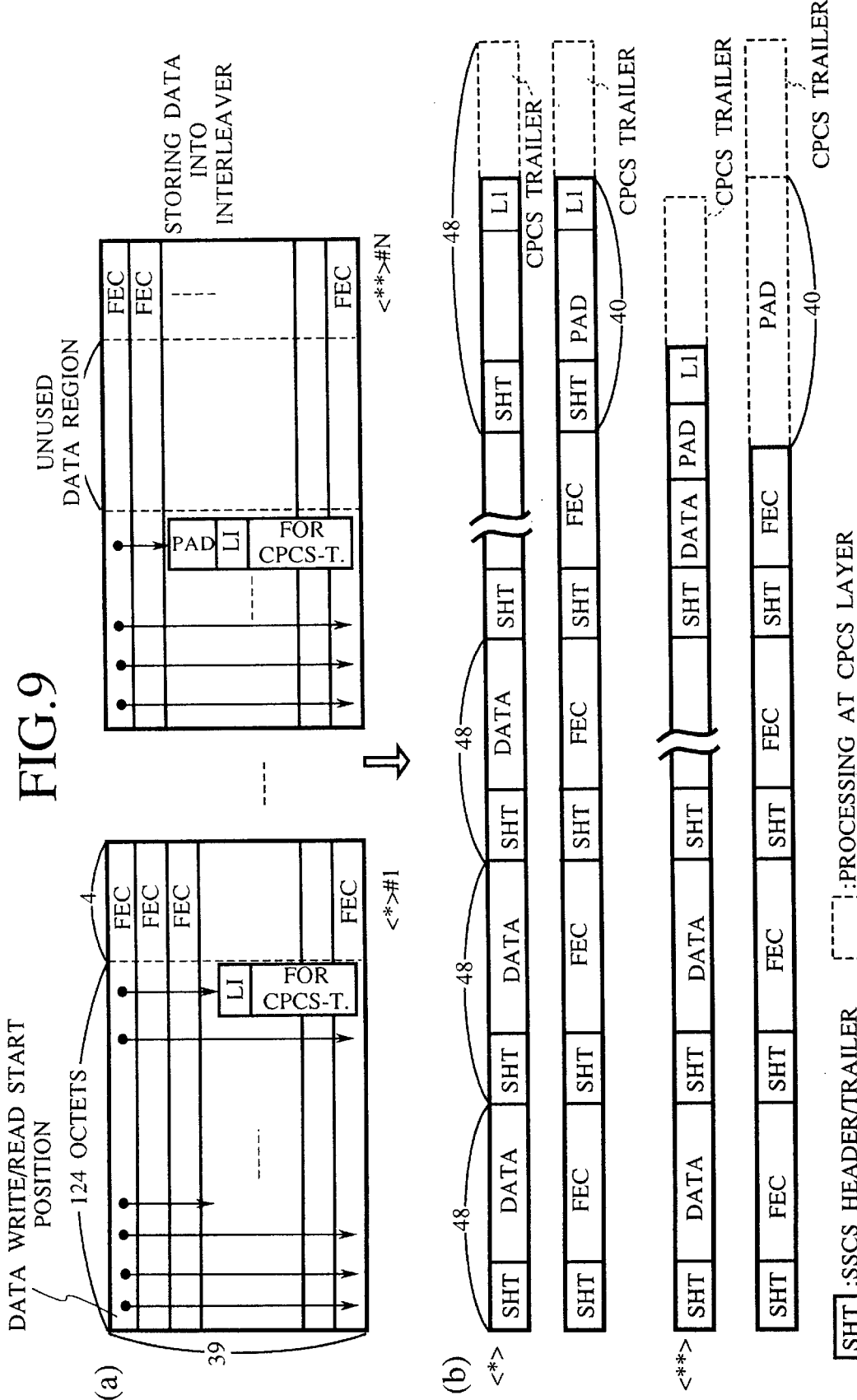
FIG. 9 is a diagram showing another exemplary state in which data are stored in the interleaver in the first embodiment of an error control scheme according to the present invention.
Figure 10:
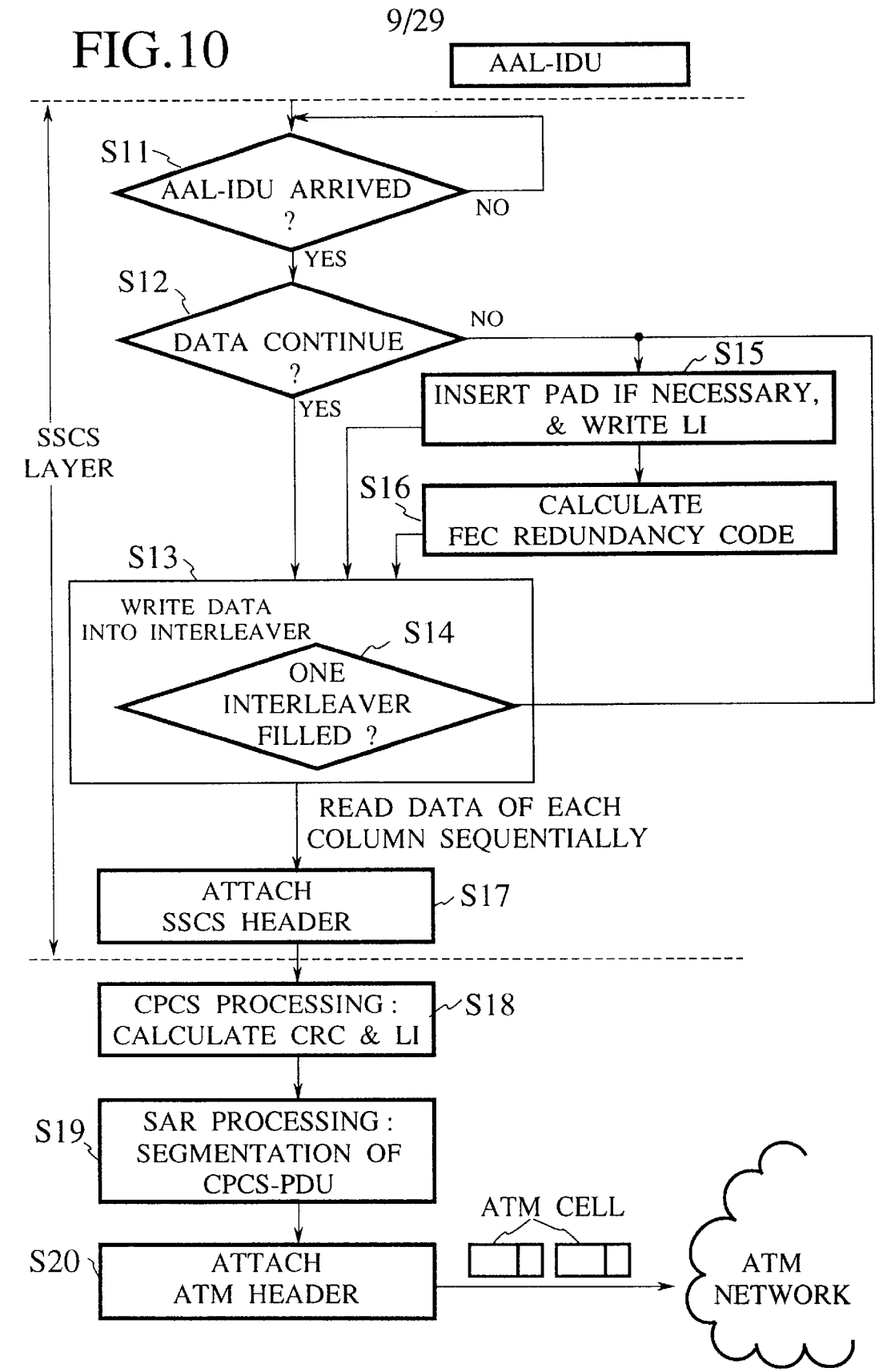
FIG. 10 is a flow chart for the processing at a transmitting side terminal in a case of FIG. 9.

Next, FIG. 9 shows an example in which the vertical size of the interleaver is 47 octets. In this case, the processings at the transmitting side terminal 2t proceed according to the flow chart of FIG. 10 as follows.

When AAL-IDU arrived (S14 Yes), as long as data continue (S12 Yes), the writing of data into the interleaver is carried out (S13).

When one interleaver is filled (S14 Yes), or when data is ended (S12 No), a PAD (padding) is inserted according to the need and LI is written (S15) while the FEC redundancy code is calculated and entered into the interleaver sequentially (S16).

On the other hand, data of each column are sequentially read out from the interleaver, and SSCS header is attached to data of each column (S17).

Then, the CPCS processing to calculate CRC and LI is calculated (S18), and the SAR processing to make the segmentation of CPCS-PDU is carried out (S19). Finally, an ATM header is attached (S20), and the resulting ATM cell is transferred to the ATM network.

Now, FIG. 9 shows an example in which one CPCS trailer is attached to each of the data region and the FEC region of the interleaver. Also, Just as in an example of FIG. 8 described above, SSCS header/trailer of one octet is attached with respect to each column (as indicated in a part (b) of FIG. 9). This example of FIG. 9 also illustrates a case in which the application data of a relatively large size has been stored, so that the application data extend over a plurality of interleavers (#1 to #N). Of course, the application data of a small size can also be stored in the similar state as shown in FIG. 9.

The interleaver #1 shown in a part (a) of FIG. 9 is an interleaver whose data region has been used up to the maximum value allowed in this example, where an amount of padding contained in the last column is indicated in the LI field provided by one octet among the last 9 octets of the last column while the remaining 8 octets are reserved for CPCS trailer such that there is no need to make any extra padding at a time of attaching CPCS trailer with a size of 8 octets. On the other hand, the interleaver #N shown in a part (a) of FIG. 9 is an interleaver whose data region still has some unused portion remaining, i.e., an interleaver in which the application data ended in a middle of its data region, and the last column may include the padding as shown in FIG. 9. In this interleaver #N, an amount of padding contained in the last column is indicated in the LI field provided by one octet among the last 9 octets of the last column while the remaining 8 octets are reserved for CPCS trailer, just like the interleaver #1. Consequently, when a sum of the valid data length in the last column, one octet of the LI field, and 8 octets reserved for CPCS trailer is less than 47 octets, the pad is inserted for as many octets as necessary to make up 47 octets in total.

Figure 11A:
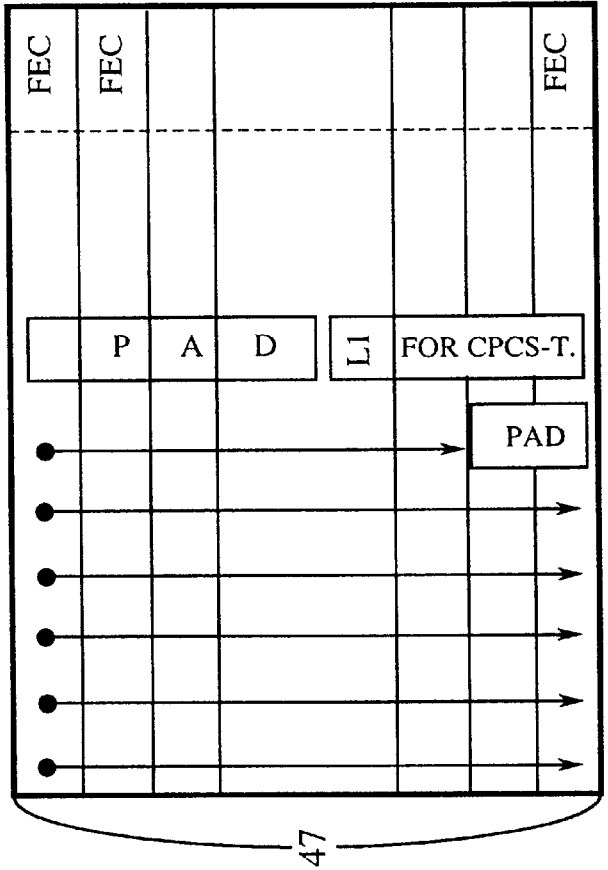
FIG. 11A and 11B are diagrams showing manners of length indication in the interleaver in cases of FIG. 8 and FIG. 9, respectively.
Figure 11B:
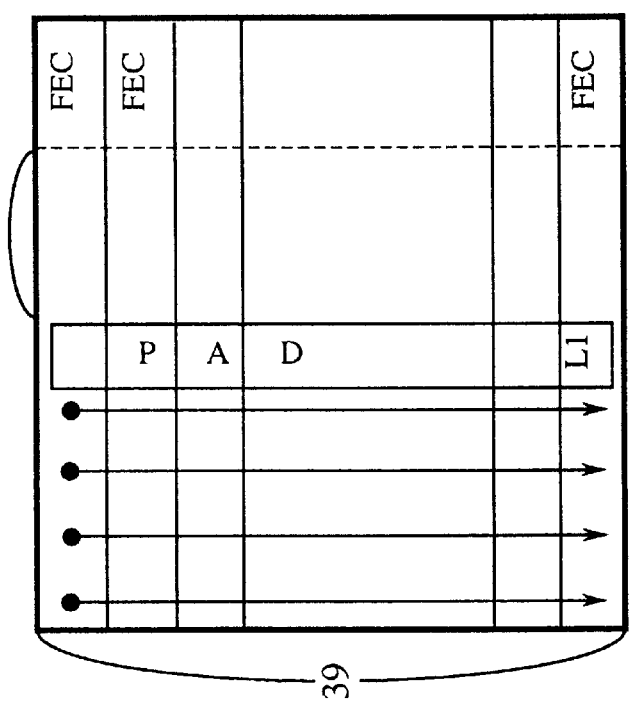

Next, detailed manners for LI indications used in the examples of FIG. 8 and FIG. 9 will be described. FIG. 11A shows an example corresponding to FIG. 8, which illustrates a case in which the application data ended at the last row of a column in a middle of the data region. In this case, the last column contains no valid data, so that LI field indicates 0, and padding is inserted for 38 octets. On the other hand, FIG. 11B shows an example corresponding to FIG. 9, which illustrates a case in which the application data ended at any of 38th to 47th octet of a column in the data region. In this example, LI indicates an amount of padding. In these manners, it becomes possible to notify an amount of application data accurately from the transmitting side to the receiving side.

Note that, if a plurality of data belongs to the same application, it is also possible to store a plurality of AAL-IDUs in one interleaver. In this case, after the delimiter of one AAL-IDU is detected, a timer can be activated and an output from this interleaver can be postponed until the next AAL-IDU arrives during a prescribed period of time.

The timer setting can be made in various manners depending on what level of latency is required by the application. For example, it is possible to wait for several seconds in a case of an operation such as the file transfer which requires only a moderate request condition regarding the delay. On the contrary, it is also possible to set the timer threshold to 0 in order to use the bandwidth maximally in a case of an operation such as the video image transfer.

After the application data are written into the data region, it is preferable to calculate the FEC redundancy region entry as quickly as possible, in order to suppress the latency.

As illustrated in FIG. 12, in this embodiment, the reading from the interleaver is carried out in the same direction, in the same order, as the writing into the interleaver. Here, after the writing of one symbol, the reading of one symbol is carried out immediately. By carrying out the writing and the reading alternately, or in parallel, it is possible to resolve a conventionally encountered bottleneck regarding the fact that the reading cannot be carried out until the writing is finished, so that a time required for giving data from an upper layer of the SSCS layer to a lower layer of the SSCS layer can be reduced considerably. After the data reading, the data are sequentially given to the SSCS header/trailer attaching module 12t.

In this manner, the delay caused by the interleaving becomes almost ignorable, and a rate very close to a case of null SSCS layer can be obtained. In the conventional interleaving, the writing is carried out in a horizontal direction while the reading is carried out in a vertical direction, so that the reading can be carried out only after all the data are written into one data region (and the PAD is inserted when the data region is not filled). In contrast, in this embodiment, the direction for reading data to be given to the lower layer is identical to the direction for writing data, and the writing and the reading are carried out almost simultaneously as far as the data region is concerned, so that there is no need to delay the output of data until the writing of the entire data region is completed, and consequently the delay can be considerably small.

It is to be noted that, in the interleaver processing module 8t to carry out the above described series of processings, the interleaver may not necessarily be provided physically. Namely, in the above description, it has been assumed that the interleaver is physically provided in a form of a memory, and this memory can be a hardware memory device or a memory dynamically secured within a computer. Moreover, in the above description, it has been assumed that this memory is a target for writing and reading, in which data can be stored once.

However, it is also possible to carry out the processings described above logically, with respect to data sequence received from the upper layer at the interleaver processing module 8t, without using such a physically provided memory. In this case, there is no memory base to write data, so that data received from the upper layer will be given to the lower layer without being written or stored into somewhere once. These data must be utilized in calculating the error correction code, however, so that the error correction code as a bit sequence entry for the FEC redundancy region is going to be calculated sequentially at a time of giving data from the upper layer to the lower layer.

It is necessary for an intermediate calculation result for the error correction code to be stored somewhere and updated whenever data is given from the upper layer to the lower data. Also, SSCS header/trailer is sequentially inserted into appropriate location whenever data is given from the upper layer to the lower layer. When the actual data to be transmitted ends, the calculation of the FEC redundancy region entry is also completed by the same manner as described above, so that the bit sequence of the error correction code can also be given to the lower layer subsequent to the data sequence.

The FEC redundancy region entry can be calculated from the actual data sequentially, so that there is no need to keep the actual data itself on SSCS layer, and it suffices to keep only the intermediate calculation result. In this case, there is no actual writing/reading of the transmission data into a memory, so that the delay time required by data writing/reading can be eliminated completely.

It is to be noted that, in the following description, cases using physically provided interleaver or memory will be mainly described because the description will be easier to comprehend in terms of physically provided interleaver or memory, but all of the following description is equally applicable to a case of logical realization as described here.

(C) Processing at the FEC Attaching Module 10t

Figure 13A:
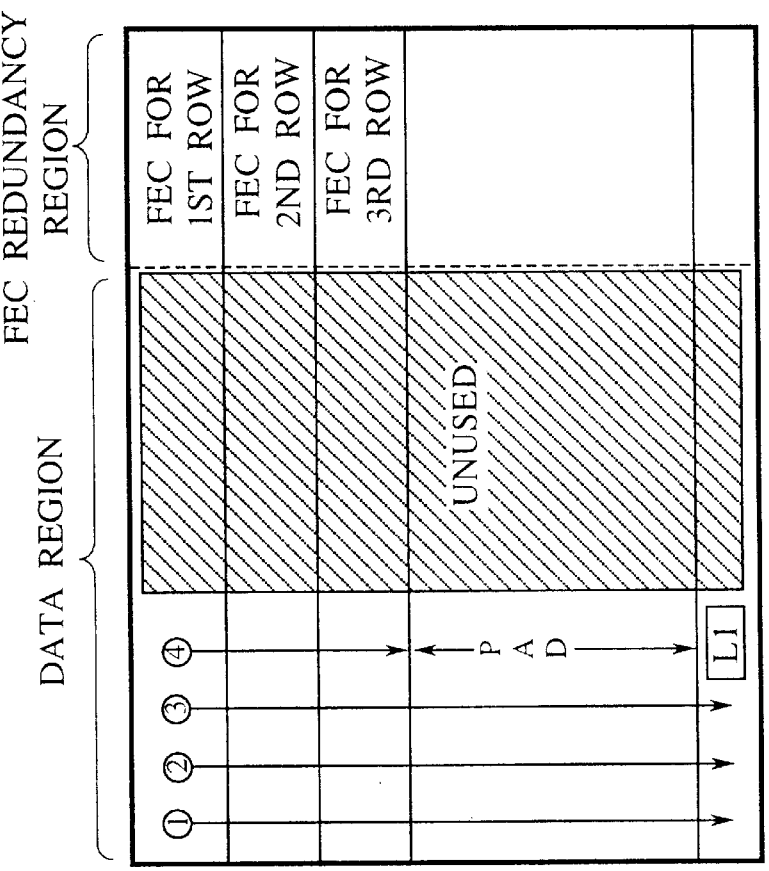
FIG. 13A and 13B are diagrams showing manners of entering FEC redundancy codes into the interleaver for two distinct cases in the firs embodiment of an error control scheme according to the resent invention.
Figure 13B:
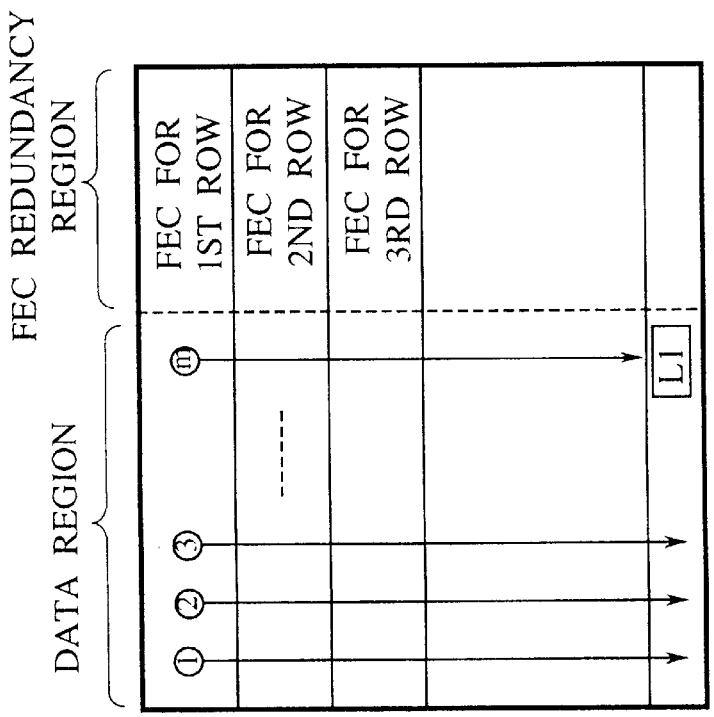

At the FEC attaching module 10t, the FEC redundancy region entry is calculated for each row of the data written into the data region, and entered into a corresponding row of the FEC redundancy region, as indicated in FIG. 13A and FIG. 13B. The FEC redundancy region entry for the n-th row is a calculation result obtained from m symbols written in the n-th row and 1st column, the n-th row and 2nd column, . . . , the n-th row and m-th column.

In a case of the interleaver without any padding, the FEC redundancy region entry is calculated as shown in FIG. 13A, whereas in a case of the interleaver with the data ending in a middle, the FEC redundancy region entry is calculated as shown in FIG. 13B by removing the unused region. In the latter case of FIG. 13B, the FEC redundancy region entry for the n-th row can be calculated from 4 symbols written in the n-th row and 1st column to the n-th row and 4t h column, in the same manner as in a case where the unused region is absent.

Figure 14A:
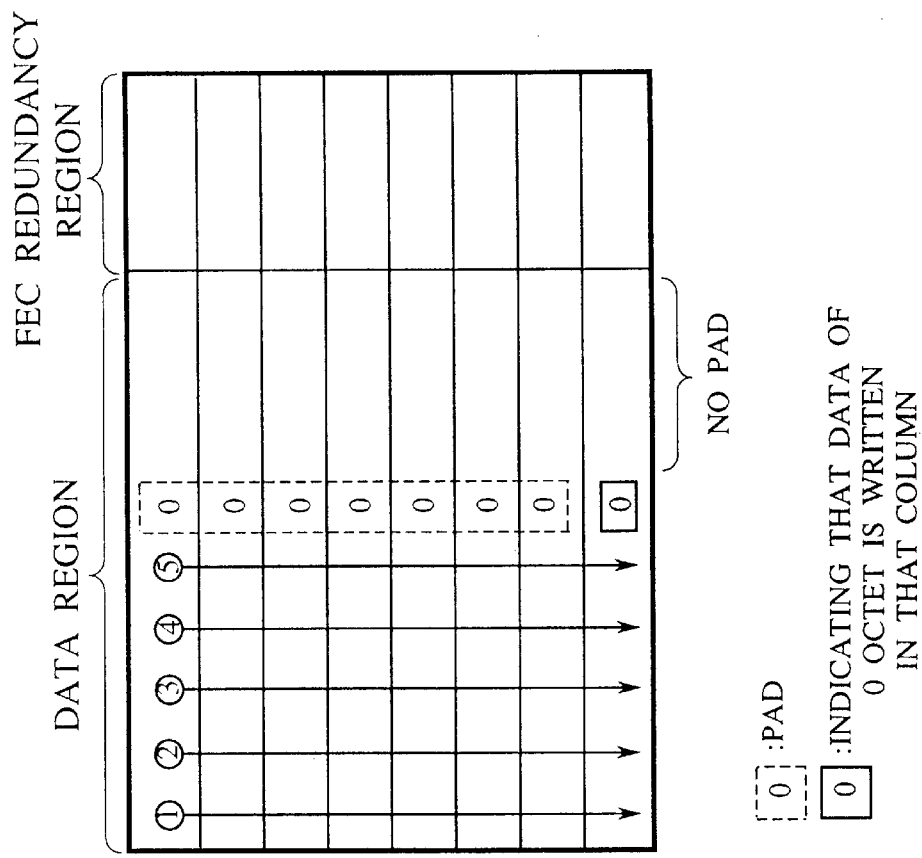
FIG. 14A and 14B are diagrams showing manners of length indication in the interleaver for two distinct cases in the first embodiment of an error control scheme according to the present invention.
Figure 14B:
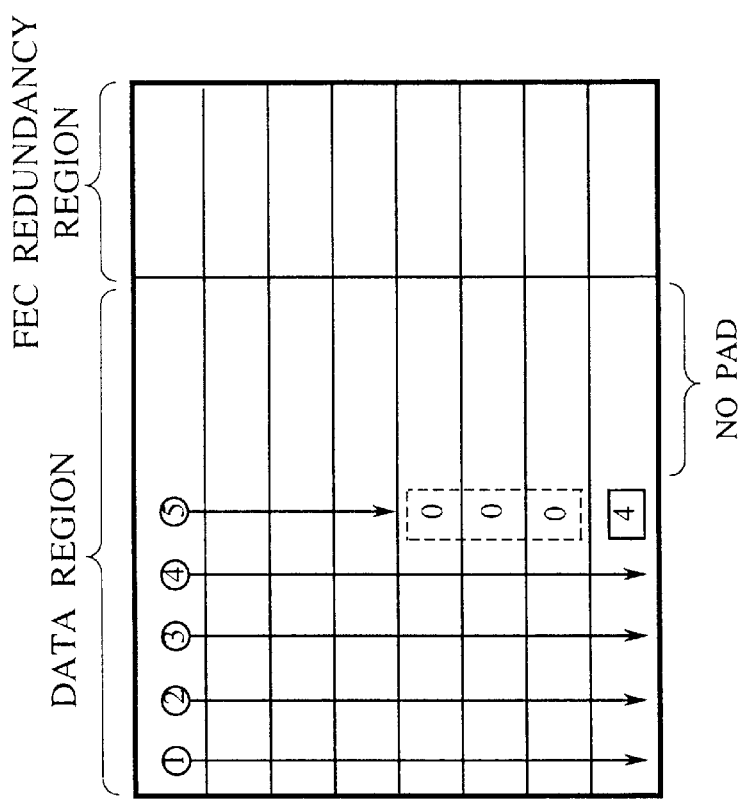

FIG. 14A and FIG. 14B show examples in which one column becomes one CPCS-SDU. When the writing of data (AAL-IDU) is finished, the interleaver fills the remaining portion of the last column with PAD (which is given by a symbol with all "0" or all "1" bits), and also a valid data length contained in that last column is written into the last one symbol portion of that last column. When the data are filled up to an end of a certain column, the length indication is made by using the next column, as shown in FIG. 14B. In short, all the columns ahead of the column which contains the length indication at its end are going to be filled with data.

The padding is not made for the rest of columns into which no data are written. The end of the data region can be recognized at the receiving side by using SSCS header/trailer attached at the next step, so that there is no need to insert extra PAD to make up the maximum size of the interleaver. Moreover, this portion without any data will not be transferred as cells. In this manner, the interleaver used in the CBR transfer can be easily adapted to the data transfer.

At a time of calculating the FEC redundancy region entry, those columns of the data region into which neither data nor dummy data are written will give rise to no parameter for the FEC redundancy code calculation, so that an amount of calculation can be reduced. In contrast, in a conventional manner in which "0"s or "1"s for padding are inserted as the dummy data completely and these dummy data are to be used for the FEC redundancy code calculation, the same calculation as for the column containing data must be carried out with respect to these dummy data as well, so that as much calculation time as in a case in which the data region is completely filled with valid data would be always required. Thus, when no PAD is inserted into the remaining data region and this remaining data region is removed from a target of the FEC redundancy code calculation, the required amount of calculation can be reduced, so that the FEC redundancy code can be calculated easily in shorter period of time, and the protocol processing can be carried out at faster speed.

Figure 15:
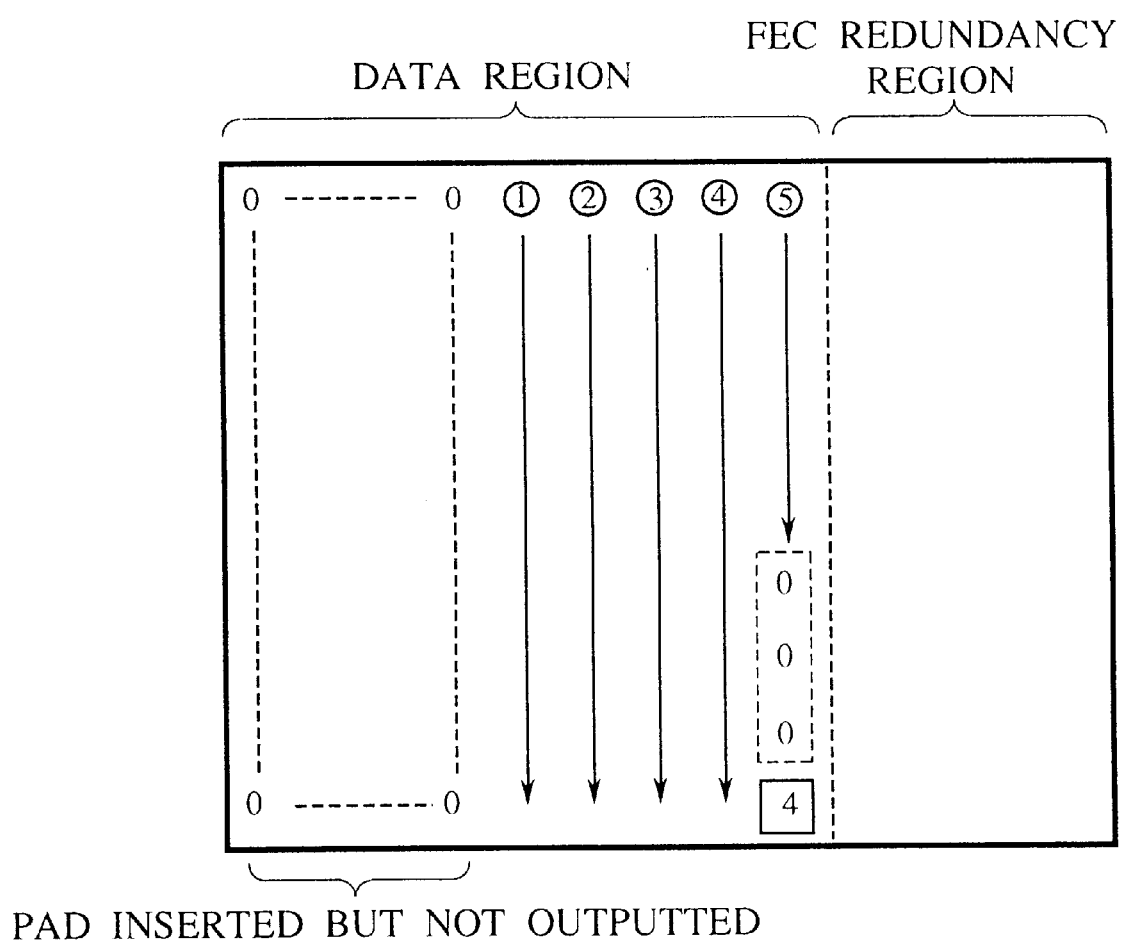
FIG. 15 is a diagram showing a state of the data in the interleaver from viewpoint of FEC redundancy code calculation in the first embodiment of an error control scheme according to the present invention.

FIG. 14A and FIG. 14B depict states of writing data from an upper left corner of a virtually provided interleave matrix, from a viewpoint of data writing, but from a viewpoint of FEC redundancy code calculation, they are actually equivalent to a state depicted in FIG. 15 in which PAD is inserted as dummy data at a left side of the interleave matrix (i.e., an upper part of data portion used for FEC redundancy code calculation) and actual data are placed at a right side of the data region. In the actual data region, those data with smaller number assigned (which arrived from the upper layer earlier) are placed closer to the left side. In other words, from a viewpoint of code words in terms of which the FEC redundancy code calculation is carried out, it appears as if the actual data portion at a lower part of the data portion and the FEC redundancy portion are present, as indicated in FIG. 16A.

Figure 17:
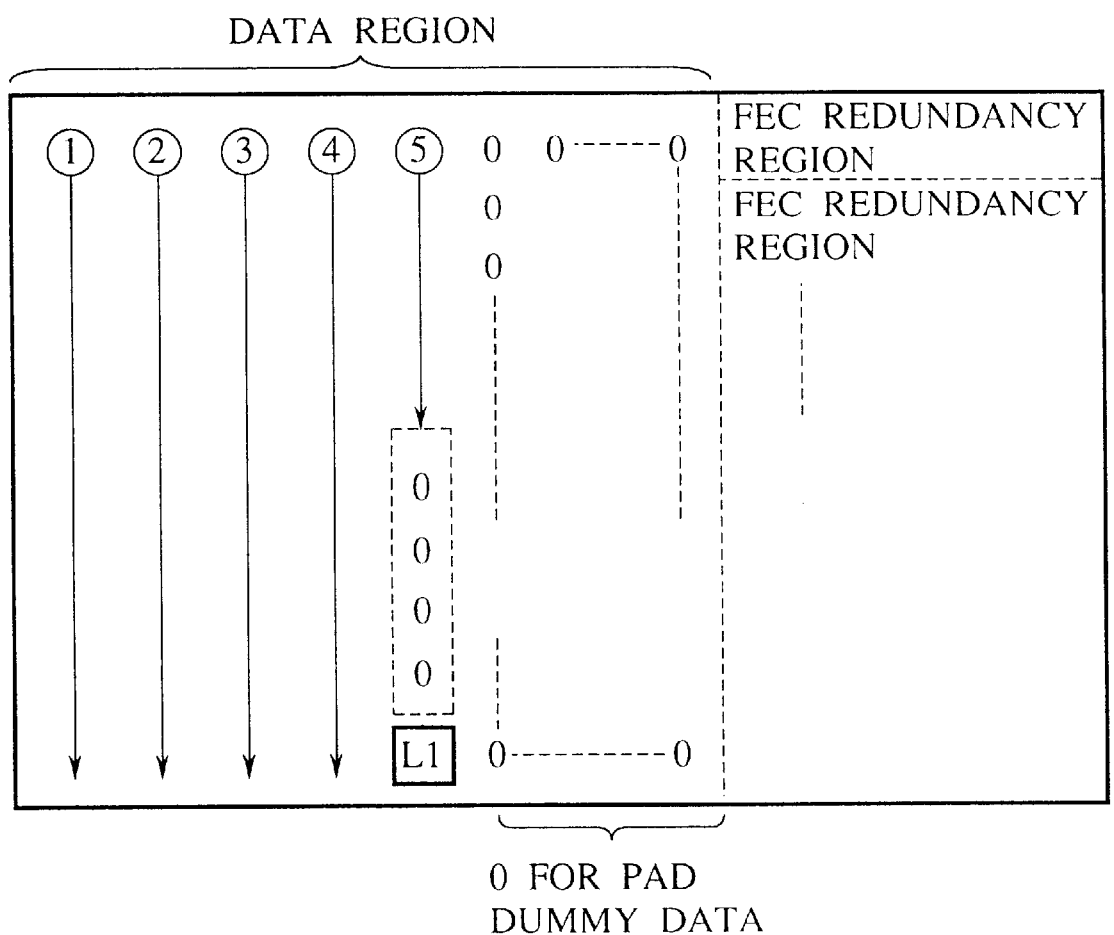
FIG. 17 is a diagram showing a manner of entering dummy data for padding into the interleaver in the first embodiment of an error control scheme according to the present invention.

Alternatively, it is also possible to adopt a scheme in which dummy data are entered into those columns without data and used in the FEC redundancy code calculation, but these dummy data are not outputted as dummy cells, as indicated in FIG. 17. In this case, it is also possible to minimize an amount of data to be outputted to the network Just as in a case of FIG. 14A or FIG. 14B.

Besides these, it is also possible to arrange symbols within each column of the data region of the interleaver randomly as indicated in a part (a) of FIG. 6 described above, or to set up the order of columns in the data region freely as indicated in a part (b) of FIG. 6. In these cases, it is also possible to minimize an amount of data to be outputted to the network by not outputting dummy data column without any data, just as in a case of FIG. 14A, FIG. 14B, or FIG. 17.

It should be apparent that, in these examples, the manner of entering data into the interleave matrix must be negotiated in advance between the transmitting side and the receiving side, before the communication takes place.

Cases of FIG. 17 and FIG. 6 differ from a case of FIG. 14 in that the interleave matrix structure seen from a viewpoint of the FEC redundancy code calculation is identical to those shown in FIG. 17 and FIG. 6. Namely, in a case of FIG. 17, each code word comprises an actual data portion at an upper part, a dummy portion with dummy data (given by symbol value "0") to the right of the actual data portion, and an FEC redundancy portion to the right of the dummy portion, as indicated in FIG. 16B. Also, in a case of a part (b) of FIG. 6 in which actual data columns are to be arranged randomly, each code word comprises a data portion in which actual data portions and dummy portions are mixedly present, and an FEC redundancy portion to the right of the data portion, as indicated in FIG. 16C.

In all cases of FIG. 17, FIGS. 14A and 14B, and FIG. 6, the actual data portions are transmitted as cells, but the dummy portions are not outputted. At the receiving side, the decoding is carried out by regarding that "0"s are transmitted at the dummy portions.

The manner of producing the FEC redundancy region entry for cases of FIGS. 14A and 14B and FIG. 17 will be described in further detail later. In the following protocol processing flow, it is assumed that a manner of writing into the interleave matrix as shown in FIGS. 14A and 14B is adopted as a representative example.

At a time of a start of the calculation of the FEC redundancy region entry, most of the data once written into the data region are already given to the SSCS header/trailer attaching module 12t for the purpose of attaching SSCS header/trailer, as indicated in FIG. 12. Then, as shown in FIG. 8 and FIG. 9, the calculation results written into the FEC redundancy region are also sequentially read out in the vertical direction column by column, Just like the data of the data region, as soon as the calculation is finished, and sequentially given to the SSCS header/trailer attaching module 12t. A time required for the calculation of the FEC redundancy region entry is known to be much less than a time required for awaiting the writing of data in the horizontal direction in general.

(D) Processings at the SSCS Header/Trailer Attaching Module 12t

Figure 18B:
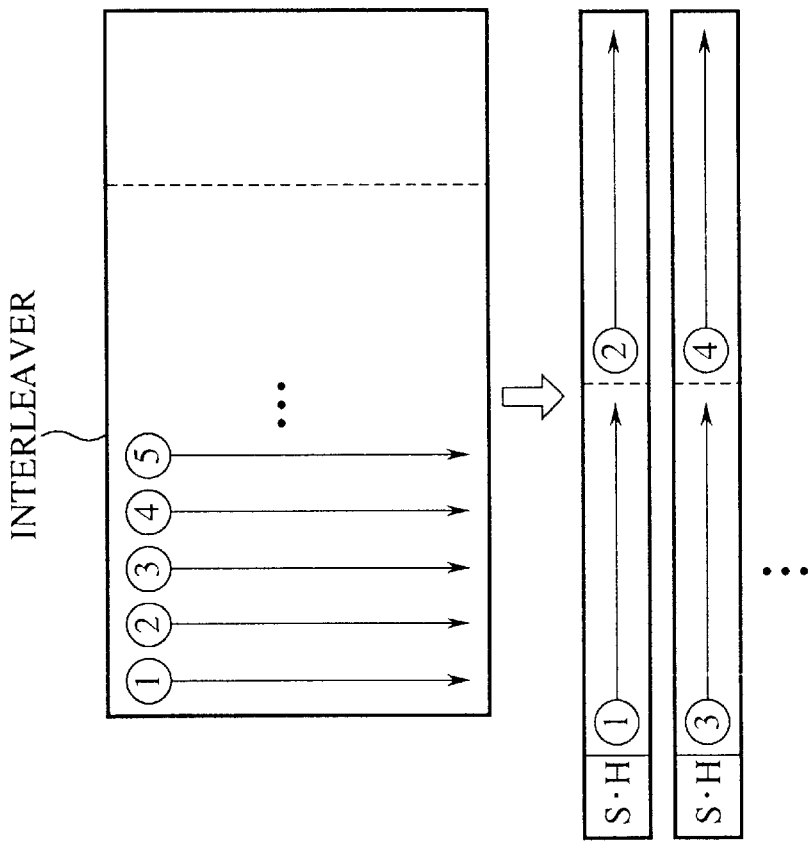
FIG. 18A and 18B are diagrams showing two manners of attaching SSCS header/trailer that can be used in the first embodiment of an error control scheme according to the present invention.
Figure 18A:
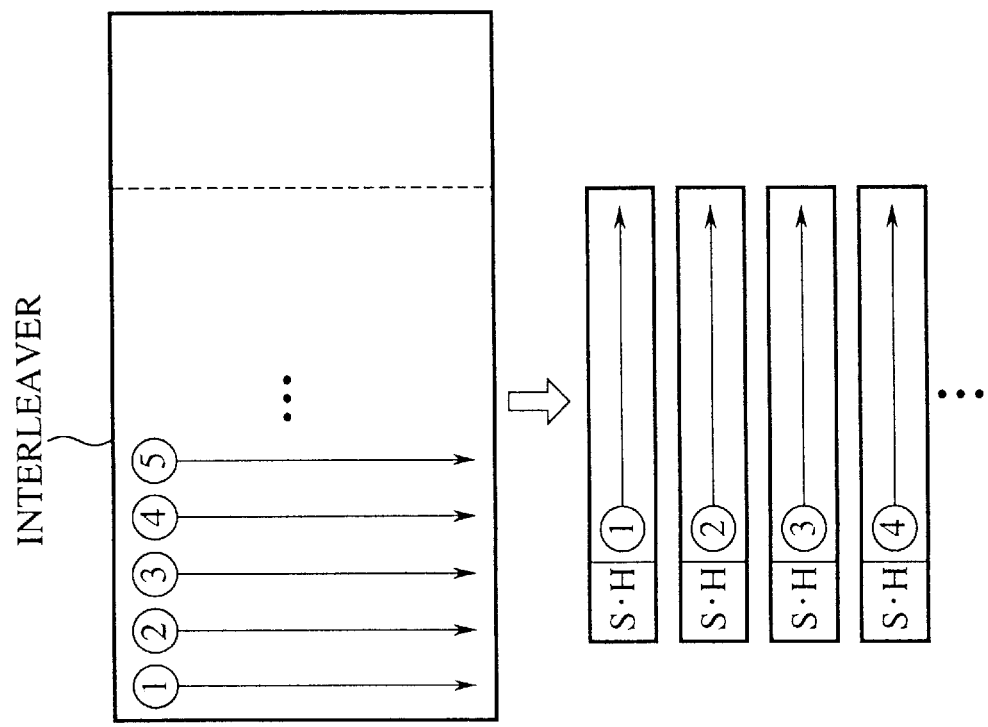

At the SSCS header/trailer attaching module 12t, an SSCS header/trailer is attached to the data read out in unit of column from the interleaver module 8t, and then the data with the SSCS header/trailer is sequentially given to the CPCS processing module 14t. Here, the SSCS header/trailer can be attached in unit of column of the interleaver as indicated in FIG. 18A, or in unit os a prescribed number of columns such as two columns as indicated in FIG. 18B. In the latter case, an SSCS-PDU is going to be formed by attaching an SSCS header/trailer to a plurality of columns of the interleaver. In this case, a number of columns to be grouped together should not exceed a correction capacity of the FEC. Namely, in the FEC type error correction, there is a limit to a number of symbols (a number of columns of the interleaver) that can be corrected, depending on an amount of overhead (redundant portion) of the error correction code attached. For example, in a case where the FEC redundancy region has a size of 4 columns in the interleaver as in FIG. 9 described above, up to 4 columns of loss and error can be corrected with respect to the data and the FEC redundancy region as a whole.

The SSCS header/trailer to be attached here must contain an information for column) in identifying a location (a column) in the interleaver at which the data sequence to which this SSCS header/trailer is attached was located.

As a representative error correction code for carrying out the FEC, the Reed-Solomon code is known, and as a prerequisite for enabling an easy correction using this Reed-Solomon code, there is a condition which requires to have a location of an error being identified. If a location of an error has not been identified, it would require a considerable amount of calculations for the purpose of identifying a location of an error, and a correction capacity would be reduced to nearly a half compared with a case of having a location of an error identified. In order to identify a location of an error (which corresponds to a location within the interleaver of a cell containing data with an error in this embodiment), there is a need to attach some kind of an identifier for each cell at a time of transmission. In this regard, a scheme for attaching SN in unit of cell as this identifier is considered as most effective. In addition, it is necessary to provide a certain level of reliability to SN itself.

Figure 19:
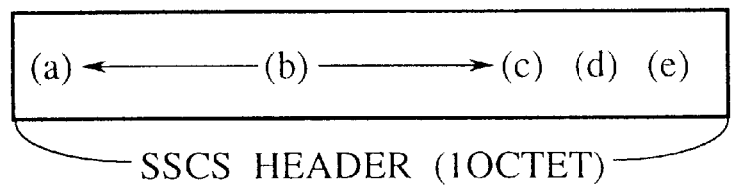
FIG. 19 is a diagram showing a configuration of SSCS header/trailer that can be used in the first embodiment of an error control scheme according to the present invention.

It is possible for the SSCS header/trailer to have various fields, such as those indicated in FIG. 19, for example. FIG. 19 shows an SSCS header with a length of one octet.

In the above, it has been pointed out that, for an exemplary horizontal size of the interleaver, it is preferable to align the data length in 4 octets units by which CPU makes accesses in a case of software processing using CPU, and this can also be true here, so that the header/trailer length can be set equal to 4 octets.

Now, an example of the SSCS header shown in FIG. 19 will be described in detail.

A field (a) is a synchronization bit for indicating an SSCS header/trailer at a top of the interleaver, i.e., a boundary of a corresponding set of the data region and the FEC redundancy region. For instance, this synchronization bit indicates a value "1" when it is at a top, or a value "0" otherwise.

A field (b) is a sequence number for indicating an order within the interleaver. For instance, a skipped location due to cell loss can be detected using of this sequence number.

A field (c) is an SNP (Sequence Number Protection) bit, i.e., a parity bit for the protection of the sequence number, by which an error of the sequence number can be detected.

A field (d) is a D/F (Data/Flag) bit for indicating whether a content of the payload is data or FEC redundancy code.

A field (e) is a B/E (Begin/End) bit for indicating a beginning or an end of the data region and a beginning or an end of the FEC redundancy region. For instance, this B/E bit indicates a value "1" in the SSCS header/trailers located at ends of the data region and the FEC redundancy region within the interleaver, or a value "0" otherwise.

The data region and the FEC redundancy region are sequentially read out from the interleaver and given to the SSCS header/trailer attaching module 12t. The attaching of the SSCS header/trailer is realized by inserting the above described header/trailer at constant interval with respect to these data sequences. Here, a constant interval can be a length of one column in the interleaver, or a length of a plurality of columns in the interleaver.

Figure 20:
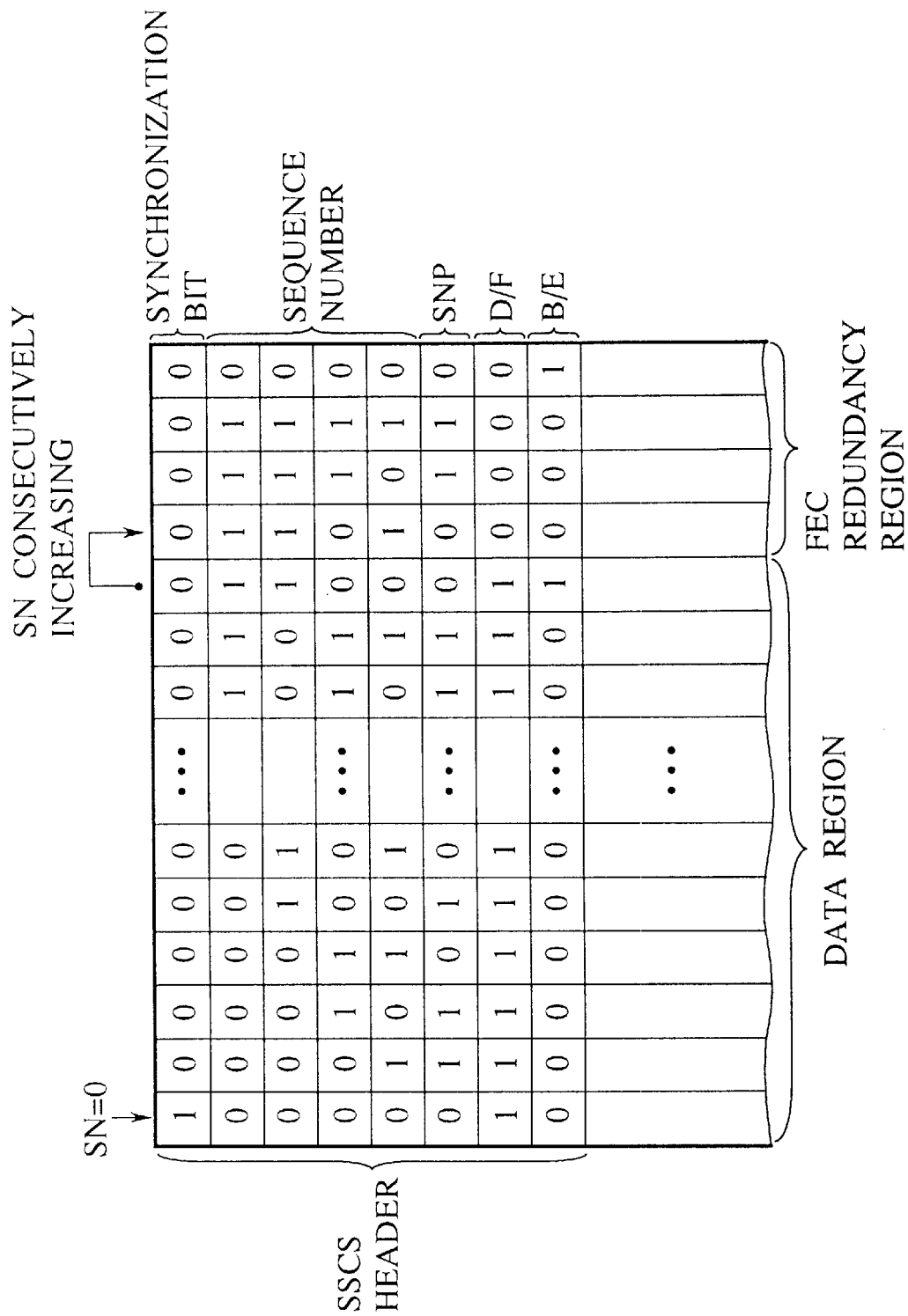
FIG. 20 is a diagram showing exemplary SSCS headers/trailers for an entire one interleaver in the first embodiment of an error control scheme according to the present invention.

FIG. 20 shows an example of SSCS headers/trailers for an entire one interleaver, where values indicated in FIG. 20 represent an example of correct SSCS header/trailers which contain no error.

The synchronization bit indicates an SSCS-PDU located at a top of the interleaver, and the sequence numbers are given in a cycle defined by 4 bits. In this example of FIG. 20, the sequence number starts from "0" given to the first SSCS header/trailer written in the data region, and increases in modulo 16. The sequence numbers for the last SSCS header/trailer in the data region and the first SSCS header/trailer in the FEC redundancy region are consecutive. Alternatively, it is also possible to clear the sequence number at the first SSCS header/trailer in the FEC redundancy region, to restart the sequence number from "0" in the FEC redundancy region. Note, however, that a scheme for giving the sequence numbers consecutively without a reset in a middle as shown in FIG. 20 has an advantage that it is easier to carry out a detection of a cell loss even when a cell loss occurs at a boundary of the data region and the FEC redundancy region. Also, in a case where a size of one AAL-IDU is so large that it is going to be stored over a plurality of interleavers, it is possible to adopt a scheme for attaching the consecutive sequence numbers among consecutive interleavers, or a scheme for resetting a sequence number to "0" at a top SSCS header/trailer of each data region. In the latter scheme, even though a number of columns in the data region is not fixed, it is possible to correctly recognize the boundary between the data region and the FEC redundancy region that are transferred in alternation, according to the indications of the other fields (such as D/F bit and B/E bit) in the SSCS header/trailer, and also from the fact that a size of the FEC redundancy region is negotiated end-to-end in advance.

The SNP indicates an even parity calculated for 4 bits of the sequence number. It is also possible to use an odd parity, if desired.

In this embodiment, the D/F bit with a value "1" indicates that it is the data region, and the D/F bit with a value "0" indicates that it is the FEC redundancy region. On the other hand, the B/E bit marks the last PDU among the SSCS-PDUs in the data region and the last PDU among the SSCS-PDUs in the FEC redundancy region by a value "1" representing END.

In the SSCS headers/trailers shown in FIG. 20, a header/trailer having B/E field="1" and D/F field=data is attached to the SSCS-SDU containing the LI field to be used in indicating a length of valid data that are contained in the last column of the data region in the interleaver.

(E) Processings at the CPCS processing module 14*t*

At the CPCS processing module 14*t*, the usual AAL5 processing is applied to the data sequentially given from the SSCS processing module 6*t*, and an LI and a CPCS trailer are attached. As a unit for forming the CPCS-SDU, two examples shown in FIG. 8 and FIG. 9 can be considered. In FIG. 8, a unit for forming the CPCS-SDU is a set of an SSCS header/trailer and a corresponding payload. In FIG. 9, there are two units for forming the CPCS-SDU, including the data region in the interleaver and the FEC redundancy region in the interleaver.

In a case of FIG. 8, a scheme for attaching an SSCS header/trailer to each column of the interleaver is adopted, and a CPCS trailer of AAL5 is attached to each column. In this scheme, CRC of AAL5 is applied to one column of the interleaver, so that when an error is discovered at the receiving side, a presence of an error in a particular column of the interleaver can be recognized. Moreover, even when a cell loss occurs, it is made possible to recognize which interleaver column has not reached to the receiver side according to a skip in the sequence number in the SSCS header/trailer. In this manner, a location of a cell loss or a bit error can be specified accurately.

As a variation on a case shown in FIG. 8, there is also a scheme for attaching an SSCS header/trailer to every prescribed number of columns. In FIG. 8, the interleaver is designed to make a sum of an overhead of the SSCS layer, one column of the interleaver data, and a CPCS trailer becomes 48 octets for example, so as to provide a measure to prevent an extra padding in each layer. In the variation mentioned above, it is also preferable to provide the similar measure for the vertical length of the interleaver from a viewpoint of packing efficiency, by setting a sum of an SSCS-PDU length and a CPCS trailer length equal to an integer multiple of 48 octet, or to a value for minimizing an amount of padding at the CPCS layer even when a setting to an integer multiple of 48 octet is impossible in view of an operation on a terminal which makes a communication.

In a case of FIG. 9, a scheme for attaching only two AAL5 trailers with respect to one interleaver is adopted. Here, two AAL5 trailers includes one CPCS trailer attached with respect to the entire data region, and another CPCS trailer attached with respect to the entire FEC redundancy region. For the former, the last 8 octets part of the data region of the interleaver is left unused by the interleaver module 8*t* in advance in order to minimize an amount of padding, so that when the CPCS trailer is attached to the data given from the SSCS layer, it becomes exactly an integer multiple of 48 octets, and it becomes unnecessary to make any padding at a time of the SAR processing. On the other hand, at a time of attaching the CPCS trailer with respect to the FEC redundancy region, it is impossible to secure an unused portion in advance at the interleaver module 8*t*, so that when a length of one column of the interleaver is set equal to 47 octets as shown in FIG. 9, the padding for 40 octets is necessary. However, compared with a case of FIG. 8, it is possible to reduce an overhead as much as a number of AAL5 trailers is less, and the packing efficiency can be increased accordingly. On the other hand, when it is desired to reduce an amount of padding, it is also possible to change a length of the interleaver in FIG. 9 to such a length for which a sum of lengths an SSCS-PDU containing the FEC redundancy region and a CPCS trailer divided by 48 octets yields a remainder equal to zero or a value sufficiently close to 48 octets. Further details for this case will be described later in conjunction with the SSCS header/trailer checking module 12*r* on the receiving side.

(F) Processings at the SAR Processing Module 20*t*

At the SAR processing module 20*t*, a segmentation processing is applied to the data (CPCS-PDU) received from the CPCS processing module 14*t*. Here, however, if a sum of a vertical size of the interleaver, a size of an SSCS header/trailer, and a size of a CPCS trailer is 48 octets, the segmentation is not carried out. On the other hand, the segmentation is carried out when the CPCS-PDU is in a form shown in a part (b) of FIG. 9 in which one CPCS trailer is attached to each of the data region and the FEC redundancy region.

The SAR-PDU segmented in 48 octets are then given to the ATM header attaching module 22*t*. At this point, when the SAR-PDU given to the ATM header attaching module 22*t* is the data corresponding to the last portion of the CPCS-PDU, this fact is notified to the ATM header attaching module 22*t*.

(G) Processings at the ATM Header Attaching Module 22*t*

At the ATM header attaching module 22*t*, an ATM header determined at a time of call set up is attached to the data given from the SAR processing module 20*t*, and the data assembled into ATM cells through the processing at the physical layer are outputted to the ATM network 1. At a time of receiving data (SAR-PDU) from the SAR processing module 20*t*, if the fact that this is the last portion of the CPCS-PDU is notified, a bit for indicating this fact is erected in a UUI field of the payload of the ATM cell header.

Next, the processings at the receiving side terminal 2*r* will be described in an ascending order of layers, i.e., in an order in which processing modules are actually operated.

(H) Processings at the ATM Header Deleting Module 22*r*

At the ATM header deleting module 22*r*, after the physical layer processing is carried out with respect to the cell flow received from the ATM network 1, cells having ATM cell headers determined at a time of call set up are filtered out and received while other cells are ignored. Then, the ATM cell headers are deleted from the received cells, and the resulting data are given to the SAR processing module 20*r*.

Here, if a bit indicating the fact hat this is the last portion of the CPCS-PDU is erected in UUI field of the payload of the ATM cell header, this act is notified to the SAR processing module 20r.

Figure 21:
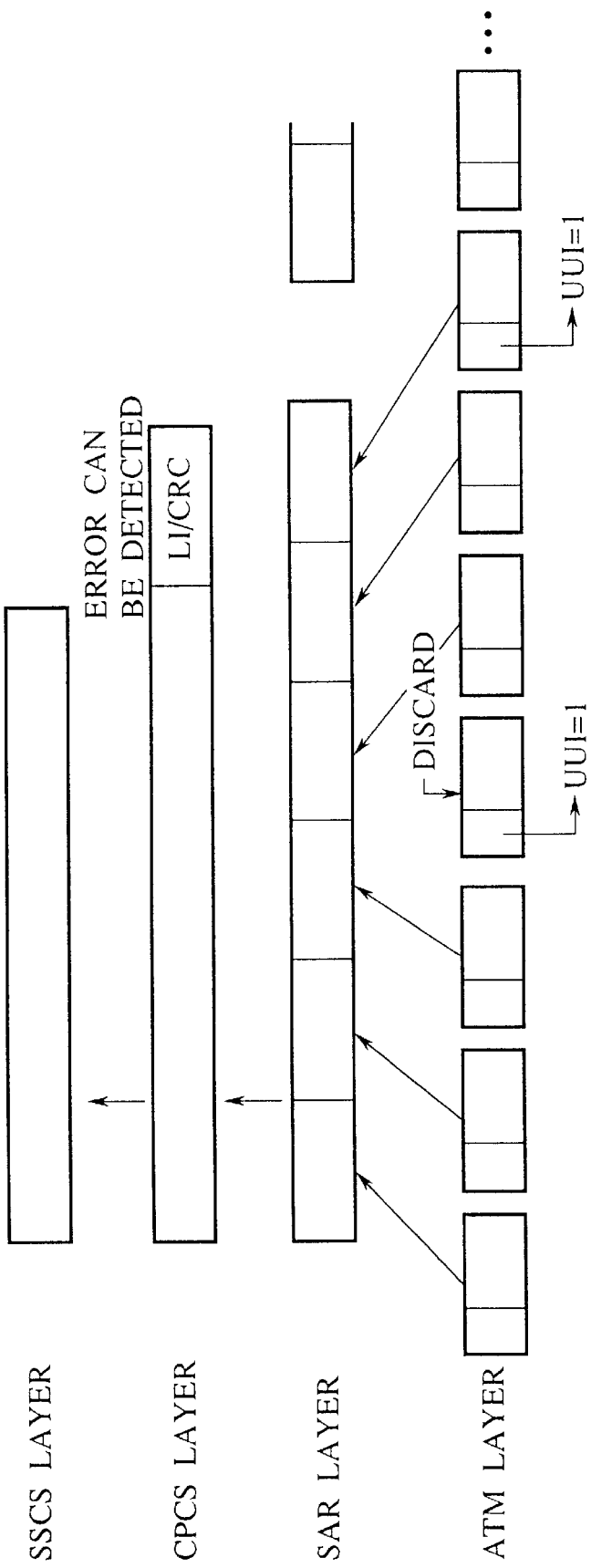
FIG. 21 is a diagram showing an exemplary processing at an ATM header deleting module of a receiving side terminal in the first embodiment of an error control scheme according to the present invention.

When a cell containing a bit indicating that this is a cell that constitutes the last portion of the CPCS-PDU is discarded, the cells received before this discarded cell will be given to the upper layer as cells belonging to the same CPCS-PDU as the next arriving CPCS-PDU, as indicated in FIG. 21. However, this error can be detected by checking the CPCS trailer. In addition, by having this CPCS-PDU which contains an error sent to the SSCS processing module 6t, it becomes possible to correct this error using of FEC.

(I) Processings at the SAR Processing Module 20r

At the SAR processing module 20r, the data reassembly processing is applied to the data (SAR-PDU) given from the ATM header deleting module 22r by referring to an indication that it is the last portion of the CPCS-PDU. After the data reassembly processing, the obtained CPCS-PDU is given to the CPCS processing module 14r.

(J) Processings at the CPCS Processing Module 14r

At the CPCS processing module 14r, the AAL5 processings including the CRC calculation and the length indication check are sequentially carried out with respect to the CPCS-PDU received from the SAR processing module 20r.

Here, whether any error is detected in either one of the CRC calculation and the length indication value or not is notified to the SSCS processing module 6r. In this case, it is not absolutely necessary to notify which one of the CRC calculation and the length indication value contained this error.

(K) Processings at the SSCS Header/Trailer Checking Module 12r

At the SSCS header/trailer checking module 12r, the header/trailer is removed while mainly checking whether there is any skip in SN, and also receiving a notice in a case an error has been detected in the CPCS trailer.

In a case where the fact that an error has been detected in the CPCS trailer is notified, there is a high possibility for some SSCS-PDU contained in that CPCS-PDU to have been discarded, so that it is necessary to identify a location of a cell loss by checking SN.

As an error in the SSCS header/trailer (including a bit error), a variety of cases can be considered. Here, manners to deal with an error in the exemplary header/trailer having fields as shown in FIG. 19 will be described.

The synchronization bit in the field (a) is a bit indicating a top of the interleaver. When an SSCS-PDU contains data at a top of the interleaver, this bit is erected to take a value "1", whereas otherwise this bit is set to a value "0". If there is an error which inverts this synchronization bit, the fact that a new interleaver starts from this SSCS-PDU may not be recognized. However, it is still possible to detect a top of a new interleaver even when the synchronization bit is inverted, according to the indication of the D/F bit in the field (d) of the immediately preceding SSCS-PDU which indicates that it is the FEC redundancy region, and the indication of the B/E bit in the field (e) of the immediately preceding SSCS-PDU which indicates that it is the end of this region.

When a bit error occurs in the sequence number in the field (b), this error can be detected by using SNP (such as an even parity) in the subsequent field (c). If the immediately preceding and following sequence numbers can be ascertained as correct, it is possible to write the payload section of the SSCS-PDU into a corresponding location in the interleaver after the header/trailer is removed. Alternatively, it is also possible to discard the doubtful data to regard this as a case of a cell loss, and reproduce the correct data by using the FEC redundancy code.

The D/F bit in the field (d) indicates a payload type, in such a manner in which it takes a value "1" when the bit sequence contained in the payload section is data, or it takes a value "0" when the bit sequence contained in the payload section is FEC redundancy code. Also, the B/E bit in the field (e) indicates that this is the last SSCS-PDU among a plurality of consecutive SSCS-PDU, for each of the data region and the FEC redundancy region. When there is a bit error in this B/E bit which should have indicated a value "1" (i.e., the fact that this SSCS-PDU is the last data), it is still possible to correctly recognize this fact at the SSCS header/trailer checking module 12r according to the fact that the D/F bit value changes from "1" to "0" starting from the next SSCS header/trailer, indicating that the subsequent region is the FEC redundancy region.

In the above, it has been assumed that two or more bit errors do not occur simultaneously among an SSCS header/trailer of interest and SSCS headers/trailers immediately preceding and following this SSCS header/trailer of interest, as the network is assumed to have a small bit error rate such as less than $10^{-10}$ in a transmission path. However, in practice, though it is very rare, there is a case in which two or more bit errors are contained in these SSCS headers/trailers. In such a case, it is still possible to reproduce the SSCS headers/trailers accurately by accounting for the other conditions such as the fact that a size of the FEC redundancy region in the interleaver is fixed, the fact that the sequence numbers are consecutive, etc. In addition, by setting a length of an entire SSCS header/trailer to be 2 octets for example, and applying an error correction encoding to a part or a whole of this SSCS header/trailer, it is possible to provide a nearly perfect measure against a bit error.

Next, taking the above described manners for dealing with an error into account, the processing in a case of receiving the transmission data shown in FIG. 8 and a case of receiving the transmission data shown in FIG. 9 will be described as concrete examples. In each case, a manner to deal with a situation in which the fact that an error has been detected in the CPCS trailer is notified from the CPCS processing module 14r will be described.

First, a case of the transmission data shown in FIG. 8 will be described.

In this case, one CPCS trailer is attached to one SSCS data in a relatively small unit within the interleaver such as one column. Here, it is possible to carry out the check using the CRC and the length indication for each column, and when they are correct, a reliability of each payload section can be guaranteed and consequently a reliability of the SSCS header/trailer contained in each payload is also guaranteed. Of course, there are some error patterns which can be overlooked by the CRC check, but a possibility for such error patterns to occur is ignorably low in view of an error detection level on this layer, because these error patterns correspond to very rare cases in which four or more bits of errors occur in the data and a pattern of these errors cannot be detected by the even CRC check.

Moreover, in this CPCS trailer attaching scheme, the CRC is calculated for each cell, so that it also becomes possible to detect a bit error within a cell. For this reason, by regarding the cell in which a bit error has been detected as a discarded cell, it becomes possible to make an error correction in a form of a cell loss error with respect to this bit error at unknown location. In the FEC code, a twice higher correction performance can be realized for a case of a cell loss error at a known location compared with a case of a random bit error at unknown location, so that this scheme is quite effective in realizing a necessary correction performance by a smaller FEC redundancy portion.

In the above, a variation of this case of FIG. 8 in which one CPCS trailer is attached to a plurality of columns in the interleaver has been described. In this variation, when one CPCS-PDU does fit into one cell, the check by the CPCS trailer is carried out with respect to a plurality of cells. In such a case, if a bit error is discovered by the check such as the CRC check, it is impossible to know which one of a plurality of columns in the interleaver has this bit error. Consequently, either all of a plurality of columns in the interleaver belonging to this CPCS-PDU are to be regarded as discarded, or an error correction for a random bit error at unknown location is to be carried out. Of course, in either case, there is a need to have the FEC redundancy region which is sufficient to make the required correction.

Now, a case of FIG. 8 in which no error in the CPCS trailer is notified for all the CPCS-PDUs for the data regions contained in one interleaver will be considered.

In this case, it can be Judged that there is no error in the data region of this interleaver as described above. Consequently, the SSCS header/trailer checking module 12r carries out the processing with respect to these data according to the following procedure.

The SSCS-PDUs are sequentially given to the deinterleaver module 8r starting from the top SSCS-PDU, while checking that the D/F bit of the SSCS header/trailer indicates D. As no error has been detected in the CPCS trailer, the SSCS header/trailer checking module 12r notifies not to store the data in the data region of the deinterleaver module 8r but to give the data directly to the upper layer, that is, the application layer.

Then, the SSCS header/trailer checking module 12r issues a command to discard all CPCS-SDUs for the FEC redundancy region which arrive after a plurality of CPCS-SDUs for the data region. This can be done here because the error correction is no longer necessary in this case so that the CPCS-SDUs for the FEC region are unnecessary.

Here, of course, the SSCS header/trailer is removed while the check of SN is carried out to confirm an absence of a cell loss, as this is the basic operation of this SSCS header/trailer checking module 12r. This basic operation is carried out similarly in all the cases described below.

Next, a case of FIG. 8 in which an error is detected in some CPCS-PDU will be considered.

The SSCS-PDUs are sequentially given to the deinterleaver module 8r starting from the top SSCS-PDU, while checking that the D/F bit of the SSCS header/trailer indicates D, so as to store the data in the data region of the which contains the last column of the data region is marked with an end bit, and in addition, the D/F bit of the SSCS-PDU Is changed from D to F starting from the next SSCS-PDU so that the SSCS header/trailer checking module 12r notifies the deinterleaver module 8r that the subsequent SSCS-PDUs are for the FEC redundancy region. According to this notification, the deinterleaver module 8r stores the data and the FEC redundancy code into appropriate locations in the deinterleaver. For a cell loss present In a middle, a location of a discarded cell can be identified by SN in the SSCS header/trailer.

The detail concerning the error correction for the data stored in the deinterleaver in this manner will be described later in conjunction with the processings at the deinterleaver module 8r.

Next, a case of the transmission data shown in FIG. 9 will be described.

Figure 22:
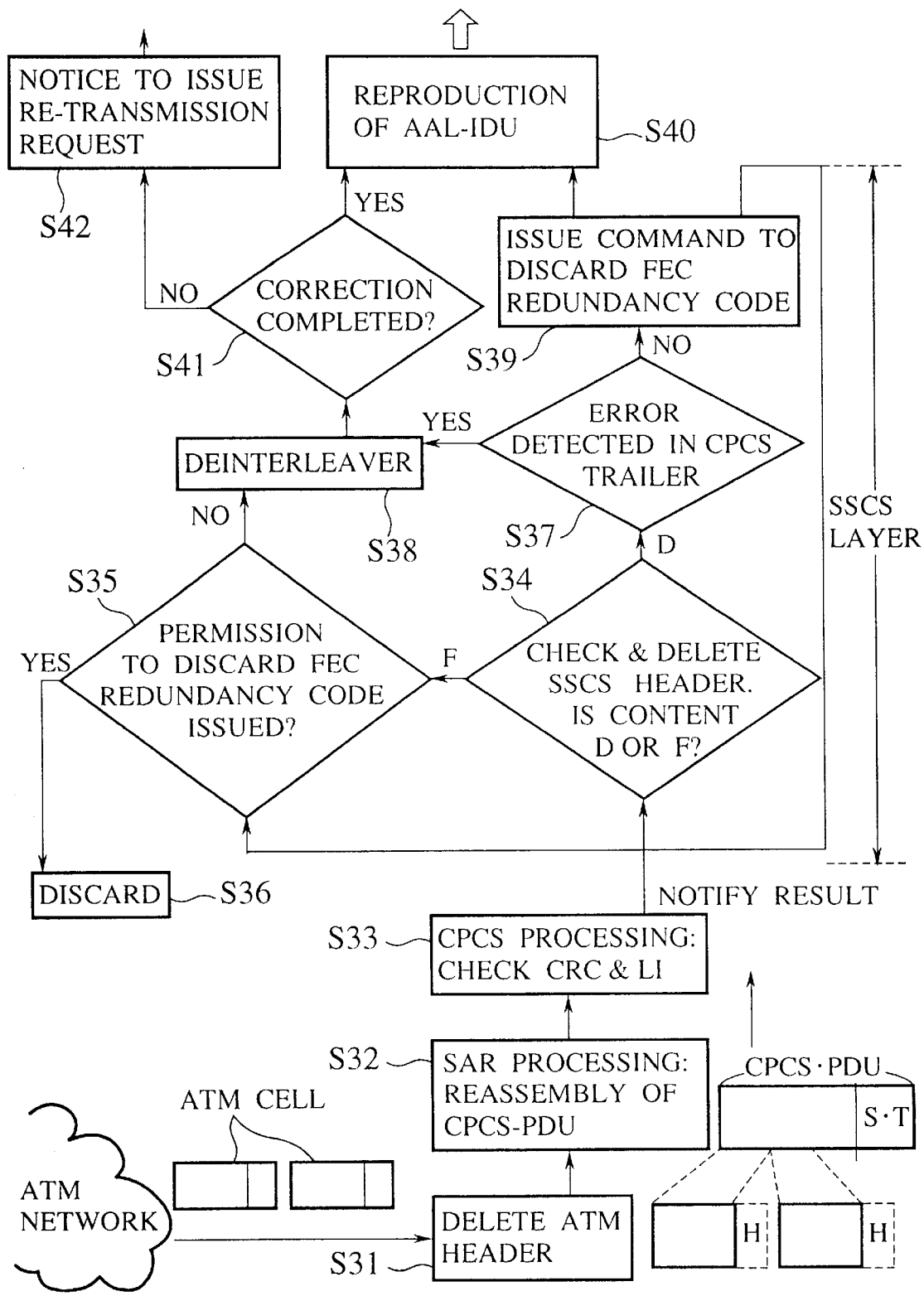
FIG. 22 is a flow chart for a processing at a receiving side terminal in a case of FIG. 9.

This is a case in which one CPCS trailer is attached to each of the data region and the FEC redundancy region within the interleaver. In this case, the processings at the receiving side terminal 2r proceed according to the flow chart of FIG. 22 as follows.

The ATM header of the ATM cell transferred from the ATM network is deleted (S31), and the SAR processing to reassemble CPCS-PDU (S32) and the CPCS processing to check CRC and LI (S33) are carried out. The result of the CRC and LI check for the CPCS-PDU is then notified from the CPCS processing module 14r to the SSCS layer.

Similarly as in a case of FIG. 8, when no error has been detected, a notice of this fact has been received at the SSCS header/trailer checking module 12r from the CPCS processing module 14r. Thus, when the content of the CPCS-SDU is the data (S34 D) and the error has not been detected in the CPCS trailer (S37 No), a command to discard the FEC redundancy code is issued (S39), and the AAL-IDU is reproduced (S40). Then, when the CPCS-SDU containing the FEC redundancy region is given from the CPCS layer next (S34 F), a permission to discard the FEC redundancy code has been issued in this case (S35 Yes), so that this CPCS-SDU can be discarded regardless of presence or absence of an error (S36). In this manner, the processing can be realized with an overhead due to the deletion of the SSCS header/trailer alone, in comparison with a case of not attaching the FEC.

Namely, because the FEC redundancy region and the data region belong to different CPCS-PDUs, when there is no error in the CPCS-PDU for the data region, there is no need to carry out a wasteful SSCS processing for the FEC redundancy region, so that a reduction of the processing can be effectively realized. This fact is actually applicable not only to a case of allocating one CPCS-PDU for each of the data region and the FEC redundancy region as in FIG. 9, but also to any case in which the data region and the FEC redundancy region of the interleaver are not mixedly present within one CPCS-PDU as in FIG. 8.

Next, a case of FIG. 9 in which an error is detected in some CPCS-PDU will be considered.

First, the SSCS header/trailer located at a top of the data sequence in which an error was detected in the CPCS trailer is checked, and if this SSCS header/trailer indicates the content of the payload as the data region, i.e., if the D/F bit indicates D (S34 D), because an error is detected in the CPCS trailer in this case (S37 Yes), there is a need to carry out the error correction at the deinterleaver (S38). When the error correction is completed (S41 Yes), the AAL-IDU is reproduced (S40), whereas otherwise (S41 No), a notice to issue the re-transmission request is made (S42). On the other hand, if this SSCS header/trailer indicates the content of the payload as the FEC redundancy region, i.e., if the D/F bit indicates F (S34 F), unless an error has been detected in the CPCS-SDU for the data region corresponding to this FEC redundancy region, it is the same as the case already described above, so that the CPCS-SDU for the FEC redundancy region is no longer necessary, and there is no need for an error correction.

The SSCS-PDUs are sequentially given to the deinterleaver module 8r starting from the top SSCS-PDU, while checking that the D/F bit of the SSCS header/trailer indicates D, so as to store the data in the data region of the deinterleaver. The header/trailer attached to the SSCS-PDU which contains the last column of the data region is marked with an end bit, and in addition, the D/F bit of the SSCS-PDU is changed from D to F starting from the next SSCS-PDU so that the SSCS header/trailer checking module 12r notifies the deinterleaver module 8r that the subsequent SSCS-PDUs are for the FEC redundancy region. According to this notification, the deinterleaver module 8r stores the data and the FEC redundancy code into appropriate locations in the deinterleaver. For a cell loss present in a middle, a location of a discarded cell can be identified by SN in the SSCS header/trailer.

Here, however, unlike the case of FIG. 8, if a usual random error is contained, it is impossible to identify a particular one or a plurality of columns as an error location. Consequently, in this case, there is a need to carry out an error correction processing for a case containing a random error at unknown location. This random error correction generally requires a larger amount of processing than a loss error correction, so that the following measure can be provided in order to prevent this random error correction.

Namely, in order to detect a random error (a bit error at unknown location) contained within a cell, there is a need to provide CRC for the entire cell in each cell. Such CRC can be most appropriately provided by being included in the SSCS header/trailer, but in such a case, the SSCS header/trailer can be larger than the exemplary one shown in FIG. 19. For this reason, this embodiment adopts a measure in which, when an occurrence of an error within a certain cell is discovered, this cell is regarded as discarded and the deinterleaver is notified that this cell has been discarded. Then, the error correction for a loss error is carried out by regarding this random error as a loss error. In this manner, it is possible to prevent an increase of an amount of processing.

Now, when the CPCS processing and the SSCS processing at the receiving side are realized by using cooperatively operating softwares, even faster processing speed can be realized. In this case, the length check and the CRC check usually carried out by the CPCS processing with respect to the data region are executed in parallel, while the deletion of the SSCS header/trailer as the SSCS processing is also executed in parallel. In this manner, when no error is detected by the CPCS processing, the data with the SSCS header/trailer removed are already written into the memory, so that the data can be given to the upper layer instantaneously by giving pointers. Here, of course, the subsequent CPCS-SDU containing the FEC redundancy region will be unnecessary and can be discarded.

On the other hand, when an error is detected by the check of the CPCS-PDU for the data region, it is necessary to notify this fact to the SSCS processing module 6r, check the CPCS-PDU for the FEC redundancy region to be processed next by the CPCS processing module 14r, and give both CPCS-PDUs to the SSCS processing module 6r. Then, at the SSCS processing module 6r, when a notice for a detection of an error is received, SN in the header/trailer is checked, and a skipped location is notified to the deinterleaver so as to make the error correction there.

It is to be noted that, in the above, exemplary cases in which the data region and the corresponding FEC redundancy region are contained in separate CPCS-PDUs have been described, but in general, there are cases in which the data region and the corresponding FEC redundancy region are contained in a common CPCS-PDU. Furthermore, there are even more general cases in which a plurality of data regions and a plurality of corresponding FEC redundancy regions are contained in an identical CPCS-PDU. Here, the processing in a case in which one data region and one FEC redundancy region are contained in one CPCS-PDU will be described as an example of these general cases.

In this case, there is a need to negotiate in advance whether or not to secure a space for the CPCS trailer in the deinterleaver in SSCS, between the terminals which make a communication.

When this space is secured, the interleaver and the cell length match well on SSCS, so that PAD for 40 octets as required in FIG. 9 will be unnecessary. Here, however, depending on a manner of attaching FEC, there are possibilities for a case in which the data and the FEC code are mixedly present in one cell for example, or a case in which the SSCS header/trailer for the FEC redundancy region is attached in a middle of a cell rather than at a top of a cell.

On the other hand, when this space is not secured, the SSCS header/trailer will be attached at a top of each cell, but the last cell which contains the CPCS trailer is going to be a cell with only 40 octets of PAD region and no data or FEC code.

When the CPCS processing module 14r receives such a CPCS-PDU, if an error is detected, this fact is notified to the SSCS processing module 6r, Just as in cases of FIG. 8 and FIG. 9.

When there is no notice for a detection of an error, the SSCS header/trailer checking module 12r deletes the SSCS header/trailer, and if the content is data, it is sequentially given to the application processing module 4r by passing through the deinterleaver module 8r, whereas if the content is FEC code, it is discarded without being given to the upper layer.

When there is a notice for a detection of an error, the SSCS header/trailer checking module 12r checks the SSCS header/trailer, and returns data into appropriate locations in the deinterleaver module 8r such that the decoding processing using FEC is carried out there. In this case, even when there is no error in the data region and an error is only present in the FEC redundancy region, this fact cannot be explicitly recognized in general, even with a help of an information in the SSCS header/trailer. In such a case, it is necessary to apply the error correction processing even if it might turn out to be wasteful, and this is a point which differs from an example of FIG. 9 in which the data region and the FEC redundancy region are separately contained in separate CPCS-PDUs.

When the correct data are decoded in this manner, the decoded data are sequentially given to the application processing module 4r.

(L) Processings at the Deinterleaver Module 8r

At the deinterleaver module 8r, if there is no error in the data region according to the information from the SSCS header/trailer checking module 12r, the data sequence are passed through and given to the application processing module 4r, without writing it into the deinterleaver. Here, there are data which appear to be randomly arranged on the interleaver as in a case shown in FIG. 6, but the order of transmission and reception of these data has an order transparency from a viewpoint of the upper application. Consequently, the data received from the CPCS layer can be directly given to the application processing module 4r by passing through the deinterleaver module 8r, if the overhead at the SSCS layer is ignored.

On the other hand, if there is an error detected in the data region according to the information from the SSCS header/trailer checking module 12r, the data containing the error are returned into the appropriate locations in the deinterleaver, the bit sequence for the FEC redundancy region corresponding to that data region is received from the SSCS header/trailer checking module 12r and returned into the FEC redundancy region in the deinterleaver, and the error correction using the FEC is carried out.

At this point, it is likely for the last SSCS-SDU of the data region to be partially filled with dummy data, and not completely filled with data. Here, up to which part of one column is filled with data will be detected by receiving at the deinterleaver a result of recognition of the fact that this is the last SSCS-SDU containing data which is obtained from the SSCS header/trailer.

In a case of FIG. 9, when the last SSCS-SDU for the data region arrives, the deinterleaver looks at the ninth symbol from the last of that column which is the LI field. A value indicated there indicates a number of octets counted backwards from the LI field for which the padding is inserted. On the other hand, in a case of FIG. 8, the last symbol of the last column of the data region is the LI field, and a value indicated there indicates a number of octets counted backwards from the LI field for which the padding is inserted, or a number of octets counted from a top row of that last column which contain actual data.

After that, the corrected data written in the data region are given to the application processing module 4r. Here, the data are read out in the vertical direction, in the same order as that of writing data in the interleaver module 8t at the transmitting side terminal 2t. As the data length is accurately comprehended as a result of the deinterleaver processing, the dummy data for padding are not going to be given to the upper layer. When an error is not detected in the SSCS-PDU for the data region, it is also necessary to give only the data other than the dummy data to the upper layer, so that it is also necessary to comprehend the data length accurately. In this case, at a time of issuing a command to discard the FEC redundancy code, the accurate data length can be learned by receiving a notice for the last SSCS-SDU for the data region at a time of the SSCS header/trailer checking Just as in a case of carrying out the deinterleaver processing described above. The padding portion will be removed before the data are given to the upper layer.

(M) Processings at the Application Processing Module 4r

Finally, the application processing module 4r receives the application data from the SSCS processing module 6r, and carried out a desired application processing on the application data.

Next, concrete examples of the FEC scheme to be used in the FEC attaching module 10t and the FEC correcting module 10r will be described in detail.

At the FEC attaching module 10t on the transmitting side, data to be attached in the FEC redundancy region of the interleaver are calculated according to the data in the data region given of the interleaver given from the interleaver module 8t, and the calculation result is returned to the interleaver module 8t. Then, at the interleaver module 8t, the received data for the FEC redundancy region are given to the SSCS header/trailer attaching module 12t after the data for the data region. Then, at the SSCS header/trailer attaching module 12t, the header/trailer is attached according to the data for each region.

On the other hand, the FEC correcting module 10r on the receiving side is operated only when it is necessary to make an error correction for an interleaver. Namely, when an error such as a cell loss or a bit error was detected at the CPCS processing module 14r on the lower side, the data containing this error are given to the SSCS processing module 6r and stored in the deinterleaver module 8r.

Then, at the SSCS header/trailer checking module 12r, a location of a cell loss or a bit error within the deinterleaver is detected in most cases. Depending on the protocol specification, there may be a bit error whose location cannot be identified accurately, and even in such a case, it is possible to adopt a configuration in which the FEC correcting module 10r can make an error correction, although a correction performance is going to be limited in such a case compared with a case of dealing with an error with the identified location. In this embodiment, however, for the sake of simplicity, when a bit error occurs, it is assumed that an error symbol location can be identified, by information indicated by various bits provided in the SSCS header/trailer. For such an error, at the FEC correcting module 10r, a recovery of a skipped data portion or a correction of a bit error is carried out by referring to the data in the deinterleaver module 8r. Then, the correction data are returned to the deinterleaver module 8r.

Specific configurations of the FEC attaching module 10t and the FEC correcting module 10r can vary according to the above described factors such as a size of an interleaver module itself, a number of columns to which one SSCS header/trailer is to be attached for each interleaver, a position of writing into each interleaver, etc.

Consequently, in the following, examples of these modules will be described in relation to the interleaver module 8t and the deinterleaver module 8r. In the following, examples of an FEC redundancy symbol construction scheme to be used on the transmitting side will be described first, and corresponding examples of an error correction scheme to be used on the receiving side will be described later.

First, a scheme in which one column of the interleaver such as that shown in FIG. 8 or FIG. 9 is completely fitted into a payload of one cell, and this one column alone forms a payload on the SSCS layer will be described. In this scheme, an interleaver should have a vertical length of either 39 octets or 47 octets, and a maximum horizontal length less than or equal to $2^k-1$ symbol length, assuming that one symbol of an RS code is k bits. When a size of a symbol is made variable in this manner, a size of an interleaver also varies correspondingly, and there is a need to consider the interleave processing as mainly operations on softwares, so that a number of bits for one symbol is preferably $2^n$ where n is an integer, such as 4 bits, 8 bits, 16 bits, etc., in order to make an interleaver length suitable for software processing. Among these, in AAL1, a specification to set one symbol equal to 8 bits has already been determined. Consequently, in the following, only a case in which one symbol is 8 bits will be described, although the following description is similarly applicable to any other case using any other number of bits for one symbol.

With one symbol equal to 8 bits, in an example of FIG. 8, the interleaver has a vertical length of 39 octets and a horizontal length of an arbitrary octet length within a range of zero to 255 octets, whereas in an example of FIG. 9, the interleaver has a vertical length of 47 octets and a horizontal length of an arbitrary octet length within a range of zero to 255 octets. In either case, 124 octets at maximum are allocated to the data region, while 4 octets are allocated to the FEC redundancy region. In practice, the interleaver can be designed such that a total of the data region and the FEC redundancy region does not exceed 255 octets, but in the following, an exemplary case of using an interleaver with a horizontal size as adopted in AAL1 will be described, for both cases of FIG. 8 and FIG. 9. Consequently, features such as a generating function used in the following examples are also assumed to be identical to those adopted in AAL1.

More specifically, a generating function is assumed to be given by the following equation (1).

$$G(X) = (X - \alpha^{120})(X - \alpha^{121})(X - \alpha^{122})(X - \alpha^{123}) \tag{1}$$

-continued $$= X^3 - \alpha^{162} \cdot X^2 + \alpha^{35} \cdot X^2 - \alpha^{150} \cdot X + \alpha^{231}$$

where α is a root of the eighth degree primitive polynomial. Here, it should be noted that this equation (1) and all the following equations are valid on the Galois field GF($2^8$).

The actual FEC processing schemes available for cases of FIG. 8 and FIG. 9 include a scheme illustrated by FIGS. 14A, 14B and 15, a scheme illustrated by FIG. 17, a scheme illustrated by FIG. 6.

Now, each of these schemes will be described in detail one by one.

(1) Transmitting Side FEC Processing Scheme 1

Here, an FEC redundancy data generation scheme corresponding to a scheme for inserting data into an interleaver at the transmitting side as illustrated in FIGS. 13A, 13B and 14 will be described.

As shown in FIG. 15, this scheme is characterized by the fact that the data inserted into the interleaver are packed toward the right side of the interleaver. Consequently, in a case of the interleaver of FIG. 8, if the data completely fill the entire data region of the interleaver, data for 39×124 symbols will be entered, but if the data for only m columns are present, (124-m) columns from the left side of the interleaver will be empty (i.e., without any data). Then, the data are entered from a top of the remaining m columns, and here, there are a case in which the last column of the data region contains only the actual data, and a case in which the last column of the data region contains dummy data for padding.

As for the top (124-m) columns without data, this portion will not be used for transmission by assembling cells, so that this portion will not be included in a data portion to be encoded at a time of the FEC encoding. Here, however, there may be a case in which it is difficult for at least one of the transmitting side and the receiving side to use an interleaver with a variable size in an actual implementation. In such a case, it is possible to adopt a scheme in which the transmitting side and the receiving side negotiate in advance to decide a manner of the FEC encoding and decoding in which what kind of dummy data are to be inserted into an empty portion in the interleaver, even if the actual data transmission does not takes place.

As for the interleaver, the encoding is to be carried out for each row. In this case, the code words comprising the data portion for m symbols (octets) and the redundant portion for 4 symbols (octets) are going to be produced for 39 rows. The encoding/decoding of different rows are carried out in parallel, and the same operation is going to be carried out for each row, so that only the operation for one row will be described in the following.

Now, one row of the interleaver contains m pieces (1≦m23 124) of message symbols, and these message symbols will be denoted as:

$$M=(M[m-1], M[m-2], M[m-3], \ldots, M[0]) \qquad (2)$$

starting from the left side of the interleaver. Occasionally, there exists a row without any message symbol, and in such a case, there will be no M[*] corresponding to that row.

Also, there are (m+4) symbols for the code words, and these symbols of the code word will be denoted as:

$$C=(C[m+3], C[m+2]), C[m+1], \ldots, C[4], C[3], C[2], C[1], C[0(\beta)$$

starting from the left side of the interleaver. Note that the message M and the code word C is in one-to-one correspondence, so that it is not absolutely necessary for the corresponding ones to share the same symbol value, but it is preferable for the corresponding ones to share the same symbol value as much as possible especially in a case of trying to suppress an increase of delay by the interleaving as in this embodiment.

Consequently, the message symbols of the above equation (2) will be used as the code word symbols of the above equation (3) according to the following correspondence:

$$C[m+3] = M[m-1] \qquad (4)$$
$$C[m+2] = M[m-2]$$
$$C[m+1] = M[m-3]$$
$$\vdots$$
$$C[4] = M[0]$$

and C[3], C[2], C[1], and C[0] will be used as the redundant portion.

By doing this, it becomes possible to send messages directly from the upper layer to the lower layer at a time of transmission. Namely, there will be no need to write the messages into the interleaver once, and the messages can be sent through the interleaver from the upper layer, so that there is an advantage that the delay can be reduced. Here, however, the data sent from the upper layer to the lower layer will be used for the purpose of calculation processing for the redundant symbol generation.

One the other hand, at a time of reception, the error check using CRC will be carried out at the lower layer with respect to the entire data region of the deinterleaver or each divided portion obtained by dividing the entire data region of the deinterleaver. When it is judged that there is no error in the data region of the deinterleaver as a result of this error check, the data in the data region can be sent to the upper layer without writing into the deinterleaver, by applying the SSCS header/trailer processing alone, at the SSCS layer. Also, the redundant portion can be discarded immediately without any processing as it is unnecessary. In this manner, there is an advantage that the throughput of the receiving side processing as a whole-can be improved. Here, if the original message and the code word are not in a form of the above equations (4) for sharing the same symbol value, the original message cannot be recovered unless all the code words are received, so that this advantage concerning the throughput of the receiving side processing cannot be realized.

In the above, the data in the interleaver module 8*t* concerning a case of FIG. 14 have been mainly described. In this case, by using the above described equations (4), C[m+3] to C[4] can be generated quite easily.

Next, a scheme for generating the remaining redundant portion will be described. This redundant portion is generated at the FEC attaching module 10*t* after receiving the data from the interleaver module 8*t* in the configuration as described above.

Here, it is assumed that the RS code as used in AAL1 is to be used, so that as the first step of calculation, the message M is expressed in a polynomial representation M(X) given by the following equation (5):

$$M(X)=M[m-1] \cdot X^{(m-1)}+M[m-2] \cdot X^{(m-2)}+\ldots+M[1] \cdot X+M[0] \qquad (5)$$

and then, the coefficients a[m], b[m], c[m] and d[m] which satisfy the following equation (6) will be obtained.

$$M(X) \cdot X^4 = Q(X) \cdot G(X) + a[m] \cdot X^3 + b[m] \cdot X^2 + c[m] \cdot X + d[m] \qquad (6)$$

where Q(X) is a quotient obtained by dividing M(X)·$X^4$ by G(X), and terms on the right hand side of the equation (6)

other than Q(X)·G(X) are the remainder. Thus, when M(X) is determined, it suffices to divide the left hand side of the equation (6) by G(X). The coefficients a[m], b[m], c[m] and d[m] correspond to C[3], C[2], C[1] and C[0], respectively, that is:

$$C[3]=a[m]$$

$$C[2]=b[m]$$

$$C[1]=c[m]$$

$$C[0]=d[m] \qquad (7)$$

As already explained above, a size of the interleaver is variable within a limit of the maximum size, and how large it is going to be depends on an amount of data from the upper layer. Consequently, the calculation is going to be wasteful if it is not equally applicable to a case of many data and a case of little data. The use of the above equation (6) is fine once M(X) is ascertained, but usually, the message M is not given from the upper layer entirely all at once. Normally, the data are sequentially given from the upper layer in units of several octet lengths, for example. The message length of the data given from the upper layer can be ascertained only after all the data are received. Consequently, if the FEC calculation processing is not started until M(X) is ascertained, it is going to require as much of delay as required in a case of reading/writing data in AAL1. For this reason, there is a need to adopt a calculation scheme in which the calculation of the FEC redundancy region can be started as soon as the sending of the data from the upper layer begins, and there is always a form of the equation (6) at hand no matter when the sending of the data from the upper layer ends.

To this end, in this embodiment, a scheme utilizing shift registers used in the encoding by the hardware (even in a case of realizing the FEC calculation by the software). Namely, M[m−1] comes from the upper layer first, so that the following calculation is applied to this M[m−1] by regarding this M[m−1] as if it is a symbol of the last column.

$$M[m-1] \cdot X^4 = (a[1] \cdot X^3 + b[1] \cdot X^2 + c[1] \cdot X + d[1]) \bmod G(X) \qquad (8)$$

Here, when the coefficients of the equation (1) are used, the coefficients in this equation (8) can be easily obtained as follow.

$$a[1]=M[m-1]\cdot\alpha^{162}$$

$$b[1]=M[m-1]\cdot\alpha^{35}$$

$$c[1]=M[m-1]\cdot\alpha^{150}$$

$$d[1]=M[m-1]\cdot\alpha^{231} \qquad (9)$$

These values may be actually calculated, or may be obtained by looking up a multiplication table provided in advance.

If m=1 so that M[m−1] is the last, the values of four coefficients on the right hand side of the equation (8) correspond to the coefficients "a", "b", "c" and "d" of the equation (6). In other words, M[0] itself gives C[4], and C[3], C[2], C[1] and C[0] are given as follows.

$$C[3]=a[1]$$

$$C[3]=b[1]$$

$$C[3]=c[1]$$

$$C[3]=d[1] \qquad (10)$$

In this manner, for the first symbol, the equation (8) is consistent with the equation (6).

Next, a case in which the second symbol arrives will be considered. This case can be expressed in a manner consistent with the equation (6) as follows.

$$M[m-1] \cdot X^5 + M[m-2] \cdot X^4 = (a[2] \cdot X^3 + b[2] \cdot X^2 + c[2] \cdot X + d[2]) \bmod G(X) \qquad (11)$$

In this case, there is a scheme for separating the $X^5$ term and the $X^4$ term, calculating a remainder for a division by G(X) separately, and add the remainders later on. However, such a scheme has a problem in that, as a number of symbols increases, a number of calculations increases in proportion to a number of symbols. Even in a case of looking up a table, a number of times for looking up the table increases in proportion to a number of symbols.

For this reason, the equation (8) is utilized ingeniously as follows. Namely, by utilizing the equation (8), the equation (11) can be rewritten as follows.

$$(a[1]\cdot X^3+b[1]\cdot X^2+c[1]\cdot X+d[1])\cdot X+M[m-2]\cdot X^4(a[2]\cdot X^3+b[2]\cdot X^2+c[2]\cdot X+d[2]) \bmod G(X) \qquad (12)$$

Then, by expanding the left hand side of this equation (12), the following equation (13) can be obtained.

$$(a[1]+M[m-2])\cdot X^4+b[1]\cdot X^3+c[1]\cdot X^2+d[1]\cdot X = [\{(a[1]+ \qquad (13)$$
$$M[m-2])\cdot\alpha^{162}+b[1]\}\cdot X^3 +$$
$$\{(a[1]+M[m-2])\cdot\alpha^{35}+c[1]\}\cdot X^2 +$$
$$\{(a[1]+M[m-2])\cdot\alpha^{150}+d[1]\}\cdot X +$$
$$(a[1]+M[m-2])\cdot\alpha^{231}] \bmod G(X)$$

Consequently, the symbol value for the FEC redundancy region in a case where the message has two symbols can be obtained from the following.

$$a[2]=(a[1]+M[m-2])\cdot\alpha^{162}+b[1]$$

$$b[2]=(a[1]+M[m-2])\cdot\alpha^{35}+c[1]$$

$$c[2]=(a[1]+M[m-2])\cdot\alpha^{150}+b[1]$$

$$d[2]=(a[1]+M[m-2])\cdot\alpha^{231}+b[1] \qquad (14)$$

These equations (14) can be utilized recursively. Namely, for a symbol subsequent to the second symbol, the symbol value can be calculated easily from the symbol value obtained up to an immediately preceding symbol. Thus, when the k-th symbol arrives, it suffices to calculate the following.

$$a[k]=(a[k-1]+M[m-k])\cdot\alpha^{162}+b[k-1]$$

$$b[k]=(a[k-1]+M[m-k])\cdot\alpha^{35}+c[k-1]$$

$$c[k]=(a[k-1]+M[m-k])\cdot\alpha^{150}+c[k-1]$$

$$d[k]=(a[k-1]+M[m-k])\cdot\alpha^{231}(k=2,3,\ldots,m) \qquad (15)$$

In this manner, the calculation is carried out until the last symbol arrives, or until the symbol value up to the maximum column (124-th column in this embodiment) of the data region contained in the interleaver is calculated. Then, at a next timing, the calculated symbol value is sent from the FEC attaching module 10t to the interleaver module 8t as the FEC redundancy region data, along with the other symbol values calculated for the other rows. Here, data are sent in an order of a[m], b[m], c[m], d[m].

In Figs. 11A and 11B, there is a padding portion in the last column, and it is possible to realize a scheme in which no data for the FEC encoding is added to this portion. However, it is desirable to add at least a symbol for LI to the data for the FEC encoding, so that the actual implementation is expected to be easier by adding something (even if it is all "0" data) to the padding portion as well. If the FEC encoding which does not include any padding portion is to be carried out, there can be a row with no data at all (that is, the message M is null). In such a case, the FEC attaching module $10t$ is going to return data of $a[0]=b[0]=c[0]=d[0]=0$ to the interleaver module $8t$.

(2) Transmitting Side FEC Processing Scheme 2

Here, an FEC redundancy data generation scheme corresponding to a scheme for inserting data into an interleaver from an upper left corner at the transmitting side as illustrated in FIG. 17 will be described.

As shown in FIG. 17, this scheme is characterized by the fact that the data inserted into the interleaver are packed toward the left side of the interleaver. Consequently, in a case of the interleaver of FIG. 8, if the data completely fill the entire data region of the interleaver, data for 39×124 symbols will be entered, but if the data for only m columns are present, (124-m) columns from the right side of the interleaver will be empty (i.e., without any data). There are a case in which the last column of the data region contains only the actual data, and a case in which the last column of the data region contains dummy data for padding.

As for the remaining (124-m) columns of the data region, this portion will not be used for transmission by assembling cells, because the transmission of this portion would increase wasteful traffic. At a time of the FEC encoding, this portion will be treated as if it is filled with all "0" data.

Alternatively, it is possible to adopt a scheme in which the transmitting side and the receiving side negotiate in advance to decide a manner of the FEC encoding and decoding in which what kind of dummy data are to be inserted into an empty portion in the interleaver, even if the actual data transmission does not takes place. In this case, it is not absolutely necessary to insert all "0" data in the empty portion, and it suffices to encode this portion using a suitable bit pattern determined by the negotiation. However, in general, if such a bit pattern is determined, the calculation time for the FEC encoding would rather increase. Consequently, the use of all "0" data is assumed in the following.

At the interleaver, the encoding is to be carried out for each row, as in the transmitting side FEC processing scheme 1 described above. In this case, the code words comprising the data portion for m symbols (octets), all "0" data for (124-m) symbols, and the redundant portion for 4 symbols (octets) are going to be produced for 39 rows. The encoding/decoding of different rows are carried out in parallel, and the same operation is going to be carried out for each row, so that only the operation for one row will be described in the following.

Now, one row of the interleaver contains m pieces ($1 \leq m \leq 124$) of message symbols, and these message symbols will be denoted as:

$$M=(M[m-1], M[m-2], M[m-3], \ldots, M[0]) \quad (16)$$

starting from the left side of the interleaver.

Occasionally, there exists a row without any message symbol, and in such a case, there will be no M[*] corresponding to that row.

Also, there are 128 symbols for the code words, and these symbols of the code word will be denoted as:

$$C=(C[127], C[126], C[125], \ldots, C[3], C[2], C[1], C[0]) \quad (17)$$

starting from the left side of the interleaver. Note that the message M and the code word C is in one-to-one correspondence, so that it is not absolutely necessary for the corresponding ones to share the same symbol value, but it is preferable for the corresponding ones to share the same symbol value as much as possible especially in a case of trying to suppress an increase of delay by the interleaving as in this embodiment.

Consequently, the message symbols of the above equation (16) will be used as the code word symbols of the above equation (17) according to the following correspondence:

$$\begin{aligned} C[127] &= M[m-1] \\ C[126] &= M[m-2] \\ C[125] &= M[m-3] \\ &\vdots \\ C[127-m+2] &= M[1] \\ C[127-m+1] &= M[0] \\ C[127-m] &= 0 \\ C[127-m-1] &= 0 \\ &\vdots \\ C[4] &= 0 \end{aligned} \quad (18)$$

and C[3], C[2], C[1], and C[0] will be used as the redundant portion. Here, in the equations (18), C[127-m] to C[4] will not be actually outputted to the network.

By doing this, it becomes possible to send messages directly from the upper layer to the lower layer at a time of transmission. Namely, there will be no need to write the messages into the interleaver once, and the messages can be sent through the interleaver from the upper layer, so that there is an advantage that the delay can be reduced. Here, however, the data sent from the upper layer to the lower layer will be used for the purpose of calculation processing for the redundant symbol generation.

One the other hand, at a time of reception, the error check using CRC will be carried out at the lower layer with respect to the entire data region of the deinterleaver or each divided portion obtained by dividing the entire data region of the deinterleaver. When it is judged that there is no error in the data region of the deinterleaver as a result of this error check, the data in the data region can be sent to the upper layer without writing into the deinterleaver, by applying the SSCS header/trailer processing alone, at the SSCS layer. Also, the redundant portion can be discarded immediately without any processing as it is unnecessary. In this manner, there is an advantage that the throughput of the receiving side processing as a whole can be improved. Here, if the original message and the code word are not in a form of the above equations (18) for sharing the same symbol value, the original message cannot be recovered unless all the code words are received, so that this advantage concerning the throughput of the receiving side processing cannot be realized.

In the above, the data in the interleaver module $8t$ concerning a case of FIG. 17 have been mainly described. In this case, by using the above described equations (18), C[127] to C[4] can be generated quite easily.

Next, a scheme for generating the remaining redundant portion will be described. This redundant portion is generated at the FEC attaching module $10t$ after receiving the data from the interleaver module $8t$ in the configuration as described above.

Here, it is assumed that the RS code as used in AAL1 is to be used, so that as the first step of calculation the message M is expressed in a polynomial representation M(X) given by the following equation (19):

$$M(X)=M[m-1]\cdot X^{123}+M[m-2]\cdot X^{122}+\ldots,+M[1]\cdot X^{(123-m+2)}+M[0]\cdot X^{(123-m+1)} \quad (19)$$

and then, the coefficients e[m], f[m], g[m] and h[m] which satisfy the following equation (20) will be obtained.

$$M(X)\cdot X^4=Q(X)\cdot G(X)+e[m]\cdot X^3+f[m]\cdot X^2+g[m]\cdot X+h[m] \quad (20)$$

where Q(X) is a quotient obtained by dividing $M(X)\cdot X^4$ by G(X), and terms on the right hand side of the equation (20) other than $Q(X)\cdot G(X)$ are the remainder. The dummy portion in the data region of the interleaver has values "0", which are not relevant to the FEC encoding calculation, so that they are already omitted in the equation (20). Thus, when M(X) is determined, it suffices to divide the left hand side of the equation (20) by G(X). The coefficients e[m], f[m], g[m] and h[m] correspond to C[3], C[2], C[1] and C[0], respectively, that is:

$$C[3]=e[m]$$

$$C[2]=f[m]$$

$$C[1]=g[m]$$

$$C[0]=h[m] \quad (21)$$

In this transmitting side FEC processing scheme 2, unlike the transmitting side FEC processing scheme 1 described above, a coefficient and a degree of each term constituting M(X) do not vary regardless of a value of m in M(X). Namely, the data M[m−1] of the first column of the interleaver always corresponds to $X^{123}$, and this remains true even when data for the second column, data for the third column, etc. are present. Of course, it is similar for the second and subsequent columns as well. Consequently, in the equation (20), there is a relationship:

$$L.H.S. = M(X)\cdot X^4 \quad (22)$$
$$= M[m-1]\cdot X^{127} + M[m-2]\cdot X^{126} +$$
$$M[1]\cdot X^{(127-m+2)} + M[0]\cdot X^{(127-m+1)}$$

so that it is possible to divide each term in the equation (22) by G(X) separately, regardless of a value of m.

Therefore, as the redundancy region calculation scheme in this form, it is possible to use a scheme in which a division by G(X) is carried out with respect to each data of one symbol that arrives from the interleaver, and add a resulting remainder to a total remainder calculated up to that point.

This calculation scheme will be described in detail now.

First, when the first data of the interleaver arrives, e[1], f[1], g[1] and h[1] which satisfy the following equation (23) are calculated.

$$M[m-1]\cdot X^{127}=(e[1]\cdot X^3+f[1]\cdot X^2+g[1]\cdot X+h[1]) \bmod G(X) \quad (23)$$

Then, when the second data of the interleaver arrives, the following equation (24) is calculated similarly as the equation (23):

$$M[m-2]\cdot X^{126}=(e[2]\cdot X^3+f[2]\cdot X^2+g[2]\cdot X+h[2])\bmod G(X) \quad (24)$$

and then, the redundancy for the data of two symbols is calculated by taking an exclusive OR as in the following equations (25).

$$e[2]=e[1]+e'[2]$$

$$f[2]=f[1]+f'[2]$$

$$g[2]=g[1]+g'[2]$$

$$h[2]=h[1]+h'[2] \quad (25)$$

Thereafter, the similar calculation is carried out, and eventually e[m], f[m], g[m] and h[m] are obtained. By calculating one by one in this manner, when the last symbol arrives, the calculated values at that point can be obtained.

Note that the calculation in modulo G(X) as appearing in the equation (23) and the equation (24) will require a considerable amount of calculation time if carried out every time. Consequently, usually, it is preferable to have a table of values in modulo G(X) with respect to each power of X.

In this table, values of E[k], F[k], G[k] and H[k] obtained by calculating the following equation (26):

$$X(128-k) = (E[k]\cdot X^3 + F[k]\cdot X^2 + G[k]\cdot X + H[k]) \bmod G(X) \quad (26)$$
$$(k = 1, 2, \ldots, 124)$$

and the powers of X corresponding to them should be registered. Namely, this table has a content as shown in FIG. 23.

When this table of FIG. 23 is used, for an arbitrary input data M[m−k+1], the following equation (27) can be obtained:

$$M[m-k]\cdot X^{(128-k)} = M[m-k]\cdot(E[k]\cdot X^3 + F[k]\cdot X^2 + \quad (27)$$
$$G[k]\cdot X + H[k]) \bmod G(X)$$
$$= (e'[k]\cdot X^3 + f'[k]\cdot X^2 +$$
$$g'[k]\cdot X + h'[k]) \bmod G(X)$$

$$(k = 1, 2, \ldots, m)$$

so that the value of the remainder for each symbol can be easily calculated by the calculation of the following equations (28).

$$e'[k]=M[m-k]\cdot E[k]$$

$$f'[k]=M[m-k]\cdot F[k]$$

$$g'[k]=M[m-k]\cdot G[k]$$

$$h'[k]=M[m-k]\cdot H[k](k=1,2,\ldots,mm) \quad (28)$$

where e[1]=e'[1], f[1]=f'[1], g[1]=g'[1], and h[1]=h'[1].

In this manner, the calculation is carried out until the last symbol arrives, or until the symbol value up to the maximum column (124-th column in this embodiment) of the data region contained in the interleaver is calculated. Then, at a next timing, the calculated symbol value is sent from the FEC attaching module 10t to the interleaver module 8t as the FEC redundancy region data, along with the other symbol values calculated for the other rows. Here, data are sent in an order of e[m], f[m], g[m], h[m].

In FIG. 17, as in a case of the transmitting side FEC processing scheme 1 described above, there is a padding portion in the last column, and it is possible to realize a scheme in which no data for the FEC encoding is added to this portion. However, it is desirable to add at least a symbol for LI to the data for the FEC encoding, so that the actual implementation is expected to be easier by adding something (even if it is all "0" data) to the padding portion as well. If the FEC encoding which does not include any padding portion is to be carried out, there can be a row with no data at all (that is, the message M is null). In such a case, the FEC attaching module 10t is going to return data of e[0]=f[0]=g[0]=h[0]=0 to the interleaver module 8t.

(3) Transmitting Side FEC Processing Scheme 3

Here, an FEC redundancy data generation scheme corresponding to a scheme for inserting data into an interleaver at the transmitting side as illustrated in FIG. 6 will be described.

In a case in which the writing into the interleaver is made randomly as in FIG. 6, the systematic scheme such as the transmitting side FEC processing scheme 1 described above is not applicable. For this reason, this transmitting side FEC processing scheme 3 is a scheme in which the remainder for each symbol is calculated by using a table similar to that used in the transmitting side FEC processing scheme 2 described above, and the remainders for symbols are summed together to obtain the FEC redundancy region value.

In the following, an FEC redundancy data generation scheme for a part (a) and a part (b) of FIG. 6 will be described briefly.

In the transmitting side FEC processing scheme 2 described above, the data are inserted into the interleaver from the upper left corner systematically, so that the table content also appears to be systematically arranged as in FIG. 23. However, in cases of a part (a) and a part (b) of FIG. 6, there is no systematic order, so that the table similar to that of FIG. 23 can be produced only after the advance negotiation between the transmitting ride and the receiving side.

In a case of a part (b) of FIG. 6, only an order of writing columns is at random, and the manner of writing in the vertical direction is determined in advance, so that it suffices to use the table of FIG. 23 similarly as in the transmitting side FEC processing scheme 2 described above, but in a case of a part (a) of FIG. 6, not only an order of writing columns but also an order of writing within one column is at random, so that there is a need to provide a table concerning these orders in addition.

First, a case of a part (b) of FIG. 6 will be described. Here, it is assumed that there are 7 columns of data region at the right side and 4 columns of the FEC redundancy region. Starting from the left end, data on the first row include fifth, second, seventh (which is actually null), fourth, first, third, and sixth (which is actually null) data.

In this case, similarly as in the transmitting side FEC processing scheme 2 described above, the message symbols for the first row can be denoted by the polynomial representation M(X) as in the following equation (29).

$$M(X)=M[4]\cdot X^6+M[3]\cdot X^9+M[2]\cdot X^5+M[1]\cdot X^7+M[0]\cdot X^{10} \quad (29)$$

The subsequent processing is basically the same as a process from the equation (20) to the equation (28) in the transmitting side FEC processing scheme 2 described above, except for the values of the coefficients M[*], e[*], f[*], g[*] and h[*]. Consequently, by using the table of FIG. 23, the coefficient "e" for M[4] can be obtained as:

$$e[122]=M[4]\cdot E[122] \quad (30)$$

by the above equation (28), and then, by taking an exclusive OR in an order as in the following equations (31):

$$e[119]=e[122]+M[3]\cdot E[119]$$

$$e[123]=e[119]+M[2]\cdot E[123]$$

$$e[121]=e[123]+M[1]\cdot E[121]$$

$$e[118]=e[121]+M[0]\cdot E[118] \quad (31)$$

it is possible to obtain the last e[118]. The other coefficients "f", "g" and "h" are also obtained by the similar calculations. In this manner, values of e[118], f[118], g[118] and h[118] can be obtained as the redundancy symbols.

Next, a case of a part (a) of FIG. 6 will be described, In this case, assuming that the writing is done in unit of symbol as indicated in the figure, the calculation can be carried out by using a table of FIG. 23 along with a table of FIG. 24 which register a row number and a column number for each symbol. Here, it is assumed that there are 7 columns of data region at the right side and 4 columns of the FEC redundancy region. In this case, it is also assumed that a row number is assigned in an ascending order from the uppermost row to the lowermost row.

According to the table of FIG. 24, the message symbols for the fourth row in a part (a) of FIG. 6 can be denoted by the polynomial representation M(X) as in the following equation (32).

$$M(X)=M[1]\cdot X^7+M[11]\cdot X^5+M[18]\cdot X^8+M[19]\cdot X^9 \quad (32)$$

Then, by using the table of FIG. 23 just as in a case of a part (b) of FIG. 6 described above, the coefficient "e" for $X^3$ can be obtained by taking an exclusive OR in an order as in the following equations (33):

$$e[121]=M[1]\cdot E[121]$$

$$e[124]=e[121]+M[11]\cdot E[124]$$

$$e[120]=e[124]+M[18]\cdot E[120]$$

$$e[119]=e[120]+M[19]\cdot E[119] \quad (33)$$

The other coefficients "f", "g" and "h" are also obtained by the similar calculations.

In this manner, values of e[119], f[119], g[119] and h[119] can be obtained as the redundancy symbols for the fourth row in a part (a) of FIG. 6. The redundancy symbols for the other rows can also be obtained by the similar calculations, using different symbol numbers in the message M of the above equations (33).

As described, the FEC redundancy region calculation for a part (a) and a part (b) of FIG. 6 can be realized by slightly modifying the transmitting side FEC processing scheme 2 described above.

Apart from the configurations of FIG. 8 and FIG. 9, it is also possible to consider a configuration in which one column of the interleaver is larger than one cell, or a configuration in which an SSCS header is attached to a plurality of columns of the interleaver, and even in these configurations, the FEC redundancy symbols can be calculated by the similar calculations, for each one of a case of FIGS. 14A and 14B, a case of FIG. 17, and a case of FIG. 5, as described above.

Up to this point, three examples of the FEC redundancy region calculation scheme at the transmitting side have been described. From here on, examples of the decoding and error encoding scheme at the receiving side corresponding to each of the above described transmitting side FEC processing schemes 1 to 3 will be described in detail.

The data outputted from the interleaver module 8t on the transmitting side are transmitted as cells and reach to the receiving side. At the receiving side, after the cell disassembly, the data are entered into the deinterleaver module 8r. The received data from a certain transmitting side interleaver comprises one or more CPCS-PDUs containing a certain number of columns of the data region in the payload, and one or more CPCS-PDUs containing a certain number of columns of the FEC redundancy region in the payload. When all the CPCS-PDUs for the data region are judged as entirely error free by the CRC check at the CPCS layer, only the SSCS header/trailer is removed at the SSCS layer, and the data are given to the upper level application module $4r$ without any further processing. Then, all the CPCS-PDUs for the FEC redundancy region can be discarded without writing into a memory of the deinterleaver.

Here, however, when an error is detected by the CRC check in even one of a plurality of the CPCS-PDUs for the data region, all the data for that deinterleaver including those of the FEC redundancy region are going to be necessary for the error correction at the deinterleaver.

In a case of FIG. 8, one CPCS-PDU is formed from one column in the deinterleaver, and in addition this one CPCS-PDU forms one cell. For this reason, when the CRC check of the CPCS trailer in the received CPCS-PDU yields an abnormal result, it implies that there is a bit error occurring within that CPCS-PDU. At this point, the column in which the error has been discovered is treated on the deinterleaver module $8r$ in the same manner as a case of a cell loss during the transmission. Namely, it is regarded as if no cell has arrived for that one column. Then, a location of a skipped cell resulting from this is ascertained by checking SN in the SSCS header.

On the other hand, in a case of FIG. 9, one column of the deinterleaver forms one cell, but one CPCS-PDU is formed over a plurality of columns. Consequently, a state of a random bit error and a cell skipping remains uncertain by the check of the CPCS trailer alone. If there is a cell skipping in a certain CPCS-PDU, it is impossible to guarantee that the other columns of the deinterleaver belonging to that CPCS-PDU are error free by the function of the CPCS trailer alone.

For this reason, a cell skipping is ascertained by using SN in the SSCS header/trailer. When an error check bit is added to SN itself, a certainty for being able to identify a skipped location can be increased. Also, for a random bit error, an error detection function with respect to an entire SSCS-PDU is provided in the SSCS header/trailer which is attached to each column of the deinterleaver. Then, only when the error detection function of the CPCS trailer does not work effectively due to the cell loss during the transmission, or when an error is discovered in the CRC check of the CPCS trailer due to a bit error, the error check in unit of the deinterleaver column at the SSCS layer is carried out, and a presence or absence of an error in each column is checked. In this manner, regardless of a size of CPCS-PDU, it becomes sufficient to make a correction for only a symbol which belongs to an interleaver column in which a bit error or a cell loss is actually discovered.

Also, it is possible to consider another case in which one column of the deinterleaver forms a plurality of cells, and SSCS-PDU and CPCS-PDU containing that one column in the payload are to be formed. Even in this case, when one cell is discarded during the transmission, it becomes impossible to detect a symbol error in the other portion by using the CPCS trailer. In this case, in order to simplify the calculation, it is possible to regard that one column as a whole as discarded and try an error correction for that one column as a whole. In this manner, the error correction capacity will be somewhat lowered compared with a case of FIG. 8 for instance, but the processing delay can be kept small. A location of one column of the deinterleaver that is regarded as discarded can be identified by using the SSCS header/trailer.

The data from which the SSCS header is removed are written into the deinterleaver region in exactly the same order as in the interleaver, This writing order is assumed to be decided by the advance negotiation between the transmitting side and the receiving side. At this point, a portion with a skip can be explicitly indicated in another region, or dummy data can be written there. Then, that data are given to the FEC correcting module $10r$ and a symbol skipping portion is reproduced there. After that, the message data are read out from the deinterleaver module $8r$ in the same order as they are written, and given to the application processing module $4r$ of the receiving side.

In the following, examples of the error correction processing to be carried out at the FEC correcting module $10r$ on the receiving side will be described in correspondence to the transmitting side FEC processing schemes 1 to 3 described above. This FEC correcting module $10r$ is operated when there is a symbol error within a correctable range in any one column of the deinterleaver, and its location is known, so that examples will be described for such a case in the following. Here, a case of FIG. 7 in which one column of the interleaver is entirely contained in the payload of one cell, and the payload on the SSCS layer is formed by one column alone will be described, but the following schemes are equally applicable to the other deinterleaver configurations.

(4) Receiving Side FEC Processing Scheme 1

Here, an error correction scheme using a deinterleaver corresponding to an interleaver in the transmitting side FEC processing scheme 1 described above.

In the transmitting side FEC processing scheme 1, a case with four symbols for the FEC redundancy region has been described, so that this receiving side FEC processing scheme 1 will also be described for such a case. In this case of the FEC redundancy region which has four symbols, when a location of each error symbol is known, errors in up to four symbols can be corrected.

Now, suppose that there are errors or skips at s-th, t-th, u-th and v-th symbols, where $0<s<t<u<v<(m+1)$.

As described in the transmitting side FEC processing scheme 1, a case of FIG. 15 requires the deinterleaver in a configuration in which symbols are packed to the right side of the deinterleaver. An amount of data filling the deinterleaver is variable every time, so that at a time of a start of reception, how many data are going to arrive cannot be predicted. Consequently, similarly as in the transmitting side, there is a need to carry out the decoding processing which can flexibly deal with a variable symbol length.

Assuming that a received symbol sequence contains altogether m symbols for the message symbols and the redundant symbols, it can be expressed as the following equation (34) according to the above equation (17).

$$R = (C[m-1], c[m-2], \ldots , C[m-s+1], \quad (34)$$
$$E[m-s], C[m-s-1], \ldots , C[m-t+1], E[m-t],$$
$$C[m-t-1], \ldots , C[m-u+1], E[m-u], C[m-u-1],$$
$$\ldots , C[m-v+1], E[m-v], C[m-v-1], \ldots , C[0])$$

where $E[*]$ represents a portion with an error, and $C[*]$ represents a portion at which the data of the transmitting side are correctly received. This equation (34) is written for a general case, but $E[*]$ may very well be a top or a last symbol, and a plurality of $E[*]$ may very well be consecutive.

Now, before the processing at the FEC correcting module $10r$, the presence or absence of an error in each symbol has already been ascertained. When there is no symbol with an error, the equation (34) becomes:

$$C=(C[m-1], C[m-2], \ldots, C[0]) \quad (35)$$

and the polynomial C(X) according to this expression can be divided by the generator polynomial G(X) without a remainder. This implies that:

$$C(\alpha^{120})=C(\alpha^{121})=C(\alpha^{122})=C(\alpha^{123})=0 \quad (36)$$

However, when the polynomial R(X) according to the received symbol sequence R with error symbols is divided by G(X), the remainder is not zero. Here, the remainder due to each error will be denoted as a syndrome S[i] (i =1, 2, 3, 4), as follows.

$$S[1]=R(\alpha^{120})$$
$$S[2]=R(\alpha^{121})$$
$$S[3]=R(\alpha^{122})$$
$$S[4]=R(\alpha^{123}) \quad (37)$$

Here, it is assumed that, in order to simplify the correction, the coefficients for E[*] portions in R(X) are set as follows.

$$E[m-s]=E[m-t]=E[m-u]=E[m-v]=0 \quad (38)$$

Then, the syndrome S[i] (i =1, 2, 3, 4) can be calculated by the following procedure.

Step 1: Set S[1]=S[2]=S[3]=S[4]=0

Step 2: Whenever one symbol arrives (i.e., whenever one column of the deinterleaver arrives), the syndrome S[i] is updated according to the following rules:

(i) when the arrived symbol is correct, $S[i] \leftarrow S[i] \cdot \alpha^{(119+i)} + C[m-k]$ (ii) when the arrived symbol is error, $S[i] \leftarrow S[i] \cdot \alpha^{(119+i)} + E[m-k]$ $$(i=1, 2, 3, 4), (k=1 \text{ to } m) \quad (39)$$

where + denotes an exclusive OR. Note here that, by the above equation (38), E[m-k]=0.

Step 3: A syndrome value can be obtained as a value of S[i] (i=1, 2, 3, 4) at a time of carrying out the step 2 up to the last symbol.

In the following, the step 2 in the above procedure will be described in detail. Eventually, it is required to obtain a value of the equation (37), but until the reception is finished, how many symbols there are remains unknown. Consequently, there is a need for the calculation to be carried out whenever one symbol is received, and there is a need for the calculation result of the syndrome S[i] (i=1, 2, 3, 4) to be always indicating a syndrome value up to that point, so that the syndrome value is at hand no matter when the symbol reception is finished.

Actually, in the above step 2, the calculations equivalent to the following are carried out. First, when the first symbol C[m-l] arrives, the syndrome value is given by:

$$S[i]=C[m-1](i=1, 2, 3, 4) \quad (40)$$

Next, when the second symbol C[m-2] arrives, the syndrome value is given by:

$$S[i]=C[m-1]\cdot\alpha^{(119+i)}+C[m-2](i=1, 2, 3, 4) \quad (41)$$

In the similar manner, the syndrome value eventually becomes:

$$S[i] = C[m-1] \cdot (\alpha^{(119+i)})^{(m-1)} + \quad (42)$$
$$C[m-2] \cdot (\alpha^{(119+i)})^{(m-2)} + \ldots + C[1] \cdot (\alpha^{(119+i)}) + C[0]$$
$$(i = 1, 2, 3, 4)$$

which is the same as the above equation (37).

In this manner, when the k-th symbol arrives, the syndrome S[i] (i=1, 2, 3, 4) takes a form in which $\alpha^{(119+i)}$ is substituted into the (k-1) degree polynomial, so that no matter when the symbol arrival from the deinterleaver ends, the correct syndrome value in the deinterleaver configuration of this embodiment at that timing can always be indicated. In the above equations (40) to (42), those portions which received symbols with errors can be rewritten from C[*] to E[*].

Next, a meaning of the syndrome value obtained in this manner will be described. When a symbol with an error has been correctly received, this can be expressed as C[m-k] (k=s, t, u, v). Then, using these symbols, the syndrome S[i] of the above equation (37) can be expressed as follows.

$$S[1] = R(\alpha^{120}) \quad (43)$$
$$= C(\alpha^{120}) + (E[m-s] - C[m-s]) \cdot \alpha^{120(m-s)} +$$
$$(E[m-t] - C[m-t]) \cdot \alpha^{120(m-t)} +$$
$$(E[m-u] - C[m-u]) \cdot \alpha^{120(m-u)} +$$
$$(E[m-v] - C[m-v]) \cdot \alpha^{120(m-v)}$$
$$= -C[m-s] \cdot \alpha^{120(m-s)} - C[m-t] \cdot \alpha^{120(m-t)} -$$
$$C[m-u] \cdot \alpha^{120(m-u)} - C[m-v] \cdot \alpha^{120(m-v)}$$

Similarly, the other syndromes S[2], S[3] and S[4] can be expressed as follows.

$$S[2] = -C[m-s] \cdot \alpha^{121(m-s)} - C[m-t] \cdot \alpha^{121(m-t)} - \quad (44)$$
$$C[m-u] \cdot \alpha^{121(m-u)} - C[m-v] \cdot \alpha^{121(m-v)}$$
$$S[3] = -C[m-s] \cdot \alpha^{122(m-s)} - C[m-t] \cdot \alpha^{122(m-t)} -$$
$$C[m-u] \cdot \alpha^{122(m-u)} - C[m-v] \cdot \alpha^{122(m-v)}$$
$$S[4] = -C[m-s] \cdot \alpha^{123(m-s)} - C[m-t] \cdot \alpha^{123(m-t)} -$$
$$C[m-u] \cdot \alpha^{123(m-u)} - C[m-v] \cdot \alpha^{123(m-v)}$$

Here, only a use of the binary signal (0, 1) is assumed, so that + and − are both the exclusive OR. Thus, by combining the equations (43) and (44), the syndrome can be expressed as follows.

$$S[i] = C[m-s] \cdot \alpha^{(119+i)(m-s)} + C[m-t] \cdot \alpha^{(119+i)(m-t)} + \quad (45)$$
$$C[m-u] \cdot \alpha^{(119+i)(m-u)} + C[m-v] \cdot \alpha^{(119+i)(m-v)}$$
$$(i = 1, 2, 3, 4)$$

When values of S[i] (i=1, 2, 3, 4) are obtained by the step 2 in this manner, the equation (45) becomes a simultaneous equations for C[m−s], C[m−t], C[m−u] and C[m−v]. Then, by solving this simultaneous equations, the correct symbol value for each symbol can be obtained. In this embodiment, it is assumed that there is no overlook of an error symbol (that is, a symbol with an error is surely detected by the SSCS layer and below, and there is no other symbol with an error), so that these simultaneous equations always have a unique set of solutions.

The solutions in this case are as follows.

$$C[m-s] = \{S[4] + (\alpha^{(m-t)} + \alpha^{(m-u)} + \alpha^{(m-v)}) \cdot S[3] + \qquad (46)$$
$$(\alpha^{(2m-t-u)} + \alpha^{(2m-t-v)} + \alpha^{(2m-t-v)}) \cdot S[2] + \alpha^{(3m-t-u-v)} \cdot S[1]\}/$$
$$\{\alpha^{120(m-s)} \cdot (\alpha^{(m-t)} + \alpha^{(m-v)}) \cdot (\alpha^{(m-t)} + \alpha^{(m-u)}) \cdot (\alpha^{(m-u)} + \alpha^{(m-v)})\}$$

$$C[m-t] = \{S[4] + (\alpha^{(m-s)} + \alpha^{(m-u)} + \alpha^{(m-v)}) \cdot S[3] +$$
$$(\alpha^{(2m-s-u)} + \alpha^{(2m-s-v)} + \alpha^{(2m-s-v)}) \cdot S[2] + \alpha^{(3m-s-u-v)} \cdot S[1]\}/$$
$$\{\alpha^{120(m-t)} \cdot (\alpha^{(m-s)} + \alpha^{(m-v)}) \cdot (\alpha^{(m-s)} + \alpha^{(m-u)}) \cdot (\alpha^{(m-u)} + \alpha^{(m-v)})\}$$

$$C[m-u] = \{S[4] + (\alpha^{(m-t)} + \alpha^{(m-s)} + \alpha^{(m-v)}) \cdot S[3] +$$
$$(\alpha^{(2m-t-s)} + \alpha^{(2m-t-v)} + \alpha^{(2m-s-v)}) \cdot S[2] + \alpha^{(3m-t-s-v)} \cdot S[1]\}/$$
$$\{\alpha^{120(m-u)} \cdot (\alpha^{(m-t)} + \alpha^{(m-v)}) \cdot (\alpha^{(m-t)} + \alpha^{(m-s)}) \cdot (\alpha^{(m-s)} + \alpha^{(m-v)})\}$$

$$C[m-v] = \{S[4] + (\alpha^{(m-t)} + \alpha^{(m-u)} + \alpha^{(m-s)}) \cdot S[3] +$$
$$(\alpha^{(2m-t-u)} + \alpha^{(2m-t-s)} + \alpha^{(2m-u-s)}) \cdot S[2] + \alpha^{(3m-t-u-s)} \cdot S[1]\}/$$
$$\{\alpha^{120(m-v)} \cdot (\alpha^{(m-t)} + \alpha^{(m-s)}) \cdot (\alpha^{(m-t)} + \alpha^{(m-u)}) \cdot (\alpha^{(m-u)} + \alpha^{(m-s)})\}$$

In the equation (45), if there is only one error symbol (which is assumed to be E[m−s]), then the equation (45) is reduced to:

$$S[i] = C[m-s] \cdot \alpha^{(119+i)(m-s)} (i=1, 2, 3, 4) \qquad (47)$$

and from this, it follows that:

$$C[m-s] = \alpha^{(119+i)(m-s)}/S[i] (i=1, 2, 3, 4) \qquad (48)$$

This is true regardless of a value of i, so it suffices to calculate for one i. This implies that, in the formulas (37), it suffices to calculate only one of them, such as S[1] for instance, and there is no need to carry out any other syndrome calculation, so that an amount of calculations can be reduced as much.

Also, if there are only two error symbols (which are assumed to be E[m−s] and E[m−t]), then the equation (45) is reduced to:

$$S[i] = C[m-s] \cdot \alpha^{(119+i)(m-s)} + C[m-t] \cdot \alpha^{(119-i)(m-t)} (i=1, 2, 3, 4) \qquad (49)$$

Similarly, in this case, it suffices to calculate only two syndromes such as S[1] and S[2] for instance, so that an amount of calculations can be reduced as much as that would be required for the other symbols otherwise.

In this case, the solutions are as follows.

$$C[m-s] = (S[2] + \alpha^{(m-t)} \cdot S[1]) / \{\alpha^{120(m-s)} \cdot (\alpha^{(m-s)} + \alpha^{(m-t)})\} \qquad (50)$$

$$C[m-t] = (S[2] + \alpha^{(m-s)} \cdot S[1]) / \{\alpha^{120(m-t)} \cdot (\alpha^{(m-s)} + \alpha^{(m-t)})\}$$

Also, if there are only three error symbols (which are assumed to be E[m−s], E[m−t] and E[m−u]), then the equation (45) is reduced to:

$$S[i] = C[m-s] \cdot \alpha^{(119+i)(m-s)} + \qquad (51)$$
$$C[m-t] \cdot \alpha^{(119+i)(m-t)} +$$
$$C[m-u] \cdot \alpha^{(119+i)(m-u)}$$
$$(i = 1, 2, 3, 4)$$

Similarly, in this case, it suffices to calculate only three syndromes such as S[1], S[2] and S[3] for instance, so that an amount of calculations can be reduced as much as that would be required for S[4] otherwise.

In this case, the solutions are as follows.

$$C[m-s] = \{S[3] + (\alpha^{(m-t)} + \alpha^{(m-u)}) \cdot S[2] + \alpha^{(2m-t-u)} \cdot S[1]\}/ \qquad (52)$$
$$\{\alpha^{120(m-s)} \cdot (\alpha^{(m-s)} + \alpha^{(m-t)}) \cdot (\alpha^{(m-s)} + \alpha^{(m-u)})\}$$

$$C[m-t] = \{S[3] + (\alpha^{(m-s)} + \alpha^{(m-u)}) \cdot S[2] + \alpha^{(2m-s-u)} \cdot S[1]\}/$$
$$\{\alpha^{120(m-t)} \cdot (\alpha^{(m-s)} + \alpha^{(m-t)}) \cdot (\alpha^{(m-t)} + \alpha^{(m-u)})\}$$

$$C[m-u] = \{S[3] + (\alpha^{(m-t)} + \alpha^{(m-s)}) \cdot S[2] + \alpha^{(2m-t-s)} \cdot S[1]\}/$$
$$\{\alpha^{120(m-u)} \cdot (\alpha^{(m-u)} + \alpha^{(m-t)}) \cdot (\alpha^{(m-s)} + \alpha^{(m-u)})\}$$

In the above calculations, many calculations of powers of α are required. For this reason, the faster calculation can be realized by preparing a table for the frequently encountered calculation such as $\alpha^{120}$ for instance.

(5) Receiving Side FEC Processing Scheme 2

Here, an error correction scheme using a deinterleaver corresponding to an interleaver in the transmitting side FEC processing scheme 2 described above.

Similarly as in the receiving side FEC processing scheme 1 described above, a case with four symbols for the FEC redundancy region is assumed here so that, when a location of each error symbol is known, errors in up to four symbols can be corrected.

Here, it is also assumed that there are errors or skips at s-th, t-th, u-th and v-th symbols, where 0<s<t<u<v<(m+5).

As described in the transmitting side FEC processing scheme 2, a case of FIG. 17 requires the deinterleaver in a configuration in which symbols are packed to the left side of the deinterleaver, while the symbols for the FEC redundancy region are entered into four columns at the right end of the deinterleaver. Similarly as in the receiving side FEC processing scheme 1 described above, an amount of data filling the deinterleaver is variable every time, so that at a time of a start of reception, how many data are going to arrive cannot be predicted. Consequently, similarly as in the transmitting side, there is a need to carry out the decoding processing which can be started immediately as the symbol reception begins, and which can proceed to the error correction processing immediately no matter when the symbol reception ends.

Unlike the receiving side FEC processing scheme 1 described above, it is assumed that that a received symbol sequence contains m symbols for the data region (0<m<125) and four symbols for the FEC redundancy region. In this case, the received symbol sequence can be expressed as the following equation (53) according to the above equation (17).

$$R = (C[127], c[126], \cdots, C[128-s+1], E[128-s], \qquad (53)$$
$$C[128-s-1], \cdots, C[128-t+1], E[128-t],$$
$$C[128-t-1], \cdots, C[128-u+1], E[128-u],$$
$$C[128-u-1], \cdots, C[128-v+1], E[128-v],$$
$$C[128-v-1], \cdots, C[128-m], 0, 0, \cdots,$$
$$C[3], C[2], C[1], C[0])$$

where E[*] represents a portion with an error, and C[*] represents a portion at which the data of the transmitting side are correctly received. This equation (53) is written for a general case, but E[*] may very well be a top or a last symbol for the data region or the FEC redundancy region, and a plurality of E[*] may very well be consecutive. Between C[128-m] and C[3] is an empty data region ("0" data portion) on the deinterleaver matrix, which implies that they are not to be transmitted or received. Of course, when m=124, this empty data region does not exist.

Now, before the processing at the FEC correcting module 10r, the presence or absence of an error in each symbol has already been ascertained. Here, it is assumed that, in order to simplify the correction, the coefficients for E[128-s], E[128-t], E[128-u] and E[128-v] are all set to zero in the equation (53), and the corresponding symbols after the correction will be denoted as C[128-s], C[128-t], C[128-u] and C[128-v], respectively.

Similarly as in the receiving side FEC processing scheme 1 described above, when the syndrome S[i] (i=1, 2, 3, 4) is defined by the equation (37), these syndrome can be calculated by the following procedure.

Step 1: Set S[i]=0 (i=1, 2, 3, 4)

Step 2: Whenever one symbols arrives, the syndrome S[i] is updated according to the following rules:

(i) when the arrived symbol is correct, S[i]←S[i]+C[128-k]·α$^{(119+i)(128-k)}$ (ii) when the arrived symbol is error, $$S[i] \leftarrow s[i] \quad (54)$$

$(k = 1, 2, \cdots, m \text{ or } k = 125, 126, 127, 128)$ $(i = 1, 2, 3, 4)$

Step 3: A syndrome value can be obtained as a value of S[i] (i =1, 2, 3, 4) at a time of carrying out the step 2 up to the last symbol.

In the above procedure, if the arrival of the correct data region symbol ends at a timing of an arrival of C[127], then S[i] is given by:

$$S[i] = C[127] \cdot \alpha^{127(119+i)} + C[3] \cdot \alpha^{3(119+i)} + \quad (55)$$
$$C[2] \cdot \alpha^{2(119+i)} + C[1] \cdot \alpha^{(119+i)} + C[0]$$

$(i = 1, 2, 3, 4)$

This is exactly the syndrome calculation result for a case in which a symbol of C[127] is located at a left end of the deinterleaver in FIG. 17. Even when this symbol is the only one correct data, by adding a value for the FEC redundancy region to this, the syndrome value for the deinterleaver configuration in this embodiment can be obtained. Namely, this calculation scheme can always obtain the correct syndrome value no matter when the symbol arrival ends.

The syndrome values obtained in this manner become all 0 if there is no error in the received symbols at all. In general, similarly as the equation (45) of the receiving side FEC processing scheme 1 described above, the syndrome can be expressed as follows.

$$S[i] = C[128-s] \cdot \alpha^{(119+i)(128-s)} + \quad (56)$$
$$C[128-t] \cdot \alpha^{(119+i)(128-t)} +$$
$$C[128-u] \cdot \alpha^{(119+i)(128-u)} +$$
$$C[128-v] \cdot \alpha^{(119+i)(128-v)}$$

$(i = 1, 2, 3, 4)$

The error correction processing at the FEC correcting module 10r then becomes a calculation to obtain each symbol C[128-k] (k=s, t, u, v) of the equation (56) by using the syndrome values S[i] (i=1, 2, 3, 4) obtained by the step 2 above.

The solutions of fourth degree simultaneous equations in this case are as follows.

$$C[128-s] = \{S[4] + (\alpha^{(128-t)} + \alpha^{(128-u)} + \alpha^{(128-v)}) \cdot S[3] + \quad (57)$$
$$(\alpha^{(256-t-u)} + \alpha^{(256-t-v)} + \alpha^{(256-u-v)}) \cdot S[2] +$$
$$\alpha^{(384-t-u-v)} \cdot S[1]\} / \{\alpha^{120(128-s)} \cdot (\alpha^{(128-t)} + \alpha^{(128-v)}) \cdot$$
$$(\alpha^{(128-t)} + \alpha^{(128-u)}) \cdot (\alpha^{(128-u)} + \alpha^{(128-v)})\}$$

$$C[128-t] = \{S[4] + (\alpha^{(128-s)} + \alpha^{(128-u)} + \alpha^{(128-v)}) \cdot S[3] +$$
$$(\alpha^{(256-s-u)} + \alpha^{(256-s-v)} + \alpha^{(256-u-v)}) \cdot S[2] +$$
$$\alpha^{(384-s-u-v)} \cdot S[1]\} / \{\alpha^{120(128-t)} \cdot (\alpha^{(128-s)} + \alpha^{(128-v)}) \cdot$$
$$(\alpha^{(128-s)} + \alpha^{(128-u)}) \cdot (\alpha^{(128-u)} + \alpha^{(128-v)})\}$$

$$C[128-u] = \{S[4] + (\alpha^{(128-t)} + \alpha^{(128-s)} + \alpha^{(128-v)}) \cdot S[3] +$$
$$(\alpha^{(256-t-s)} + \alpha^{(256-t-v)} + \alpha^{(256-s-v)}) \cdot S[2] +$$
$$\alpha^{(384-t-s-v)} \cdot S[1]\} / \{\alpha^{120(128-u)} \cdot (\alpha^{(128-t)} + \alpha^{(128-v)}) \cdot$$
$$(\alpha^{(128-t)} + \alpha^{(128-s)}) \cdot (\alpha^{(128-s)} + \alpha^{(128-v)})\}$$

$$C[128-v] = \{S[4] + (\alpha^{(128-t)} + \alpha^{(128-u)} + \alpha^{(128-s)}) \cdot S[3] +$$
$$(\alpha^{(256-t-u)} + \alpha^{(256-t-s)} + \alpha^{(256-u-s)}) \cdot S[2] +$$
$$\alpha^{(384-t-u-s)} \cdot S[1]\} / \{\alpha^{120(128-v)} \cdot (\alpha^{(128-t)} + \alpha^{(128-s)}) \cdot$$
$$(\alpha^{(128-t)} + \alpha^{(128-u)}) \cdot (\alpha^{(128-u)} + \alpha^{(128-s)})\}$$

In the equation (56), if there is only one error symbol (which is assumed to be E[128-s]), then the equation (56) is reduced to:

$$S[i] = C[128-s] \cdot \alpha^{(119+i)(128-s)} (i=1, 2, 3, 4) \quad (58)$$

and from this, it follows that:

$$C[128-s] \cdot \alpha^{(119+i)(128-s)} / S[i] (i=1, 2, 3, 4) \quad (59)$$

This is true regardless of a value of i, so it suffices to calculate for one i. This implies that, in the formulas (54), it suffices to calculate only one of them, such as S[1] for instance, and there is no need to carry out any other syndrome calculation, so that an amount of calculations can be reduced as much.

Also, if there are only two error symbols (which are assumed to be E[128-s] and E[128-t]), then the equation (56) is reduced to:

$$S[i] = C[128-s] \cdot \alpha^{(119+i)(128-s)} + \quad (60)$$
$$C[128-t] \cdot \alpha^{(119+i)(128-t)}$$

$(i = 1, 2, 3, 4)$

Similarly, in this case, it suffices to calculate only two syndromes such as S[1] and S[2] for instance, so that an amount of calculations can be reduced as much as that would be required for the other symbols otherwise.

In this case, the solutions are as follows.

$$C[128-s] = \quad (61)$$
$$(S[2] + \alpha^{(128-t)} \cdot S[1]) / \{\alpha^{120(128-s)} \cdot (\alpha^{(128-s)} + \alpha^{(128-t)})\}$$

-continued
$$C[128-t] = (S[2] + \alpha^{(128-s)} \cdot S[1])/\{\alpha^{120(128-t)} \cdot (\alpha^{(128-s)} + \alpha^{(128-t)})\}$$

Also, if there are only three error symbols (which are assumed to be E[128-s], E[128-t] and E[128-u]), then the equation (56) is reduced to:

$$S[i] = C[128-s] \cdot \alpha^{(119+i)(128-s)} + \qquad (62)$$
$$C[128-t] \cdot \alpha^{(119+i)(128-t)} +$$
$$C[128-u] \cdot \alpha^{(119+i)(128-u)}$$
$$(i = 1, 2, 3, 4)$$

Similarly, in this case, it suffices to calculate only three syndromes such as S[1], S[2] and S[3] for instance, so that an amount of calculations can be reduced as much as that would be required for S[4] otherwise.

In this case, the solutions are as follows.

$$C[128-s] = \{S[3] + (\alpha^{(128-t)} + \alpha^{(128-u)}) \cdot S[2] + \alpha^{(256-t-u)} \cdot S[1]\}/ \qquad (63)$$
$$\{\alpha^{120(128-s)} \cdot (\alpha^{(128-s)} + \alpha^{(128-t)}) \cdot (\alpha^{(128-s)} + \alpha^{(128-u)})\}$$

$$C[128-t] = \{S[3] + (\alpha^{(128-s)} + \alpha^{(128-u)}) \cdot S[2] + \alpha^{(256-s-u)} \cdot S[1]\}/$$
$$\{\alpha^{120(128-t)} \cdot (\alpha^{(128-s)} + \alpha^{(128-t)}) \cdot (\alpha^{(128-t)} + \alpha^{(128-u)})\}$$

$$C[128-u] = \{S[3] + (\alpha^{(128-t)} + \alpha^{(128-s)}) \cdot S[2] + \alpha^{(256-t-s)} \cdot S[1]\}/$$
$$\{\alpha^{120(128-u)} \cdot (\alpha^{(128-u)} + \alpha^{(128-t)}) \cdot (\alpha^{(128-s)} + \alpha^{(128-u)})\}$$

In the above calculations, a significant calculation time will be required in calculating $\alpha^{(119+i)(128-k)}$, (k=1 to 128), (i=1, 2, 3, 4), so that the faster calculation can be realized by preparing a table using parameters i and k for the frequently encountered calculations of the powers of $\alpha$.

(6) Receiving Side FEC Processing Scheme 3

Here, an error correction scheme using a deinterleaver corresponding to an interleaver in the transmitting side FEC processing scheme 3 described above.

Similarly as in the receiving side FEC processing schemes 1 and 2 described above, a case with four symbols for the FEC redundancy region is assumed here so that, when a location of each error symbol is known, errors in up to four symbols can be corrected.

Here, it is also assumed that there are errors or skips at s-th, t-th, u-th and v-th symbols, where 0<s<t<u<v<(m+5).

In a case of FIG. 6, each arrived symbol for the data region is located randomly while the symbols for the FEC redundancy region are located in the four columns in the right end of the deinterleaver Just as in the receiving side FEC processing schemes 1 and 2 described above. In this case, again, an amount of data filling the deinterleaver is variable every time, so that at a time of a start of reception, how many data are going to arrive cannot be predicted. Consequently, similarly as in the transmitting side, there is a need to carry out the decoding processing which can flexibly deal with a variable symbol length.

In general, the received symbols with an error can be expressed by the equation (34) while the received symbols without an error can be expressed by the equation (35). In the following, concrete cases of a part (a) and a part (b) of FIG. 6 will be described.

First, in a case of a part (b) of FIG. 6, when all the symbols are received correctly, the received symbol sequence can be expressed as:

$$C=(C[8], C[7], \ldots, C[0]) \qquad (64)$$

where C[3], C[2], C[1] and C[0] are the symbols for the FEC redundancy region. The polynomial C(X) according to this received symbol sequence can be expressed as follows.

$$C(X)=C[8]\cdot X^6+C[7]\cdot X^9+C(6)\cdot X5+C[5]\cdot X^7+C[4]\cdot X^{10}+C[3]\cdot X^3+C[2]$$
$$\cdot X^2 +C[1]\cdot X+C[0] \qquad (65)$$

In this example, nine symbols are received, but in practice, up to 128 symbols can be received. Similarly as in the transmitting side, there is a need to provide a table indicating which symbol belongs to which column (that is, which powers of X corresponds to each symbol, which is necessary in producing the equation (65)) for each of the received symbols.

Now, it is assumed that maximum four symbols have errors among the symbols in the equation (65). Here, however, when the errors are only in the redundant symbols, the error correction processing will not be carried out, so that it is assumed that at least one error symbol is a symbol belonging to the data region.

Then, similarly as in the receiving side FEC processing schemes 1 and 2 described above, the calculation of the syndrome S[i] is carried out according to a number of errors. By carrying out the calculation of as many syndromes as a number of error symbols, it becomes possible to make an error correction. The syndrome S[i] (i=1, 2, 3, 4) can be calculated by the following procedure.

Step 1: Set S[i] =0 (i=1, 2, 3, 4)

Step 2: Whenever one symbols arrives, the syndrome S[i] is updated according to the following rules:

(i) when the arrived symbol is correct, $S[i] \leftarrow S[i]+C[k]\cdot \alpha^{(119+i)f(k)}$ (ii) when the arrived symbol is error, $S[i] \leftarrow s[i]$ $$(i=1, 2, 3, 4) \qquad (66)$$

Step 3: A syndrome value can be obtained as a value of S[i] (i=1, 2, 3, 4) at a time of carrying out the step 2 up to the last symbol.

In the step 2, f(k) denotes a number of powers on the polynomial which corresponds to C[k]. For example, in a part (b) of FIG. 6, a number of powers corresponding to C[8] is f(8)=6.

The alternative expression of S[i] (i=1, 2, 3, 4) obtained by the above calculation can be given by a modification of the equation (45). Namely, setting a value of a symbol with an error after a correction as C[m-k] (k=s, t,-u, v), because m=8 in this example, it follows that:

$$S[i] = C[8-s] \cdot \alpha^{(119+i)f(8-s)} + C[8-t] \cdot \alpha^{(119+i)f(8-t)} + \qquad (67)$$
$$C[8-u] \cdot \alpha^{(119+i)f(8-u)} + C[8-v] \cdot \alpha^{(119+i)f(8-v)}$$
$$(i = 1, 2, 3, 4)$$

From the equations (66) and (67), the fourth degree simultaneous equations can be formed, and from these, the values of C[8-k] (k=s, t, u, v) can be obtained. When there are four error symbols, the solutions are as follows.

$$C[8-s] = \{S[4] + (\alpha^{f(8-t)} + \alpha^{f(8-u)} + \alpha^{f(8-v)}) \cdot S[3] + \qquad (68)$$
$$(\alpha^{f(8-t)+f(8-u)} + \alpha^{f(8-t)+f(8-v)} + \alpha^{f(8-u)+f(8-v)}) \cdot S[2] +$$
$$\alpha^{f(8-t)+f(8-u)+f(8-v)} \cdot S[1]\}/\{\alpha^{120f(8-s)} \cdot (\alpha^{f(8-t)} + \alpha^{f(8-v)}) \cdot$$
$$(\alpha^{f(8-t)} + \alpha^{f(8-u)}) \cdot (\alpha^{f(8-u)} + \alpha^{f(8-v)})\}$$

-continued $$C[8-t] = \{S[4] + (\alpha^{f(8-s)} + \alpha^{f(8-u)} + \alpha^{f(8-v)}) \cdot S[3] +$$
$$(\alpha^{f(8-s)+f(8-u)} + \alpha^{f(8-s)+f(8-v)} + \alpha^{f(8-u)+f(8-v)}) \cdot S[2] +$$
$$\alpha^{f(8-s)+f(8-u)+f(8-v)} \cdot S[1]\} /$$
$$\{\alpha^{120f(8-t)} \cdot (\alpha^{f(8-s)} + \alpha^{f(8-v)}) \cdot (\alpha^{f(8-s)} + \alpha^{f(8-u)}) \cdot$$
$$(\alpha^{f(8-u)} + \alpha^{f(8-v)})\}$$

$$C[8-u] = \{S[4] + (\alpha^{f(8-t)} + \alpha^{f(8-s)} + \alpha^{f(8-v)}) \cdot S[3] +$$
$$(\alpha^{f(8-t)+f(8-s)} + \alpha^{f(8-t)+f(8-v)} + \alpha^{f(8-s)+f(8-v)}) \cdot S[2] +$$
$$\alpha^{f(8-t)+f(8-s)+f(8-v)} \cdot S[1]\} / \{\alpha^{120f(8-u)} \cdot$$
$$(\alpha^{f(8-t)} + \alpha^{f(8-v)}) \cdot (\alpha^{f(8-t)} + \alpha^{f(8-s)}) \cdot (\alpha^{f(8-s)} + \alpha^{f(8-v)})\}$$

$$C[8-v] = \{S[4] + (\alpha^{f(8-t)} + \alpha^{f(8-u)} + \alpha^{f(8-s)}) \cdot S[3] +$$
$$(\alpha^{f(8-t)+f(8-u)} + \alpha^{f(8-t)+f(8-s)} + \alpha^{f(8-u)+f(8-s)}) \cdot S[2] +$$
$$\alpha^{f(8-t)+f(8-u)+f(8-s)} \cdot S[1]\} / \{\alpha^{120f(8-v)} \cdot$$
$$(\alpha^{f(8-t)} + \alpha^{f(8-s)}) \cdot (\alpha^{f(8-t)} + \alpha^{f(8-u)}) \cdot (\alpha^{f(8-u)} + \alpha^{f(8-s)})\}$$

In the equation (67), if there is only one error symbol (which is assumed to be the s-th symbol), then the equation (67) is reduced to:

$$S[i]=C[8-s] \cdot \alpha^{(119+i)f(8-s)} \quad (i=1,2,3,4) \tag{69}$$

and from this, it follows that:

$$C[8-s]=\alpha^{(119+i)f(8-s)}/S[i](i=1,2,3,4) \tag{70}$$

This is true regardless of a value of i, so it suffices to calculate for one i. This implies that it suffices to calculate only one of them, such as S[1] for instance, and there is no need to carry out any other syndrome calculation, so that an amount of calculations can be reduced as much.

Also, if there are only two error symbols (which are assumed to be the s-th and t-th symbols), then the equation (67) is reduced to:

Similarly, in this case, it suffices to calculate only two syndromes such as S[1] and S[2] for instance, so that an amount of calculations can be reduced as much as that would be required for the other symbols otherwise.

In this case, the solutions are as follows.

$$S[i] = C[8-s] \cdot \alpha^{(119+i)f(8-s)} + \tag{71}$$
$$C[8-t] \cdot \alpha^{(119+i)f(8-t)}$$
$$(i = 1, 2, 3, 4)$$

$$C[8-s] = (S[2] + \alpha^{f(8-t)} \cdot S[1]) / \tag{72}$$
$$\{\alpha^{120f(8-s)} \cdot (\alpha^{f(8-s)} + \alpha^{f(8-t)})\}$$

$$C[8-t] = (S[2] + \alpha^{f(8-s)} \cdot S[1]) /$$
$$\{\alpha^{120f(8-t)} \cdot (\alpha^{f(8-s)} + \alpha^{f(8-t)})\}$$

Also, if there are only three error symbols (which are assumed to be the s-th, t-th, and u-th symbols), then the equation (67) is reduced to:

$$S[i] = C[8-s] \cdot \alpha^{(119+i)f(8-s)} + \tag{73}$$
$$C[8-t] \cdot \alpha^{(119+i)f(8-t)} +$$
$$C[8-u] \cdot \alpha^{(119+i)f(8-u)}$$

$(i = 1, 2, 3, 4)$

Similarly, in this case, it suffices to calculate only three syndromes such as S[1], S[2] and S[3] for instance, so that an amount of calculations can be reduced as much as that would be required for S[4] otherwise.

In this case, the solutions are as follows.

$$C[8-s] = \{S[3] + (\alpha^{f(8-t)} + \alpha^{f(8-u)}) \cdot S[2] + \alpha^{f(8-t)+f(8-u)} \cdot S[1]\} / \tag{74}$$
$$\{\alpha^{120f(8-s)} \cdot (\alpha^{f(8-s)} + \alpha^{f(8-t)}) \cdot (\alpha^{f(8-s)} + \alpha^{f(8-u)})\}$$

$$C[8-t] = \{S[3] + (\alpha^{f(8-s)} + \alpha^{f(8-u)}) \cdot S[2] + \alpha^{f(8-s)+f(8-u)} \cdot S[1]\} /$$
$$\{\alpha^{120f(8-t)} \cdot (\alpha^{f(8-s)} + \alpha^{f(8-t)}) \cdot (\alpha^{f(8-t)} + \alpha^{f(8-u)})\}$$

$$C[8-u] = \{S[3] + (\alpha^{f(8-t)} + \alpha^{f(8-s)}) \cdot S[2] + \alpha^{f(8-t)+f(8-s)} \cdot S[1]\} /$$
$$\{\alpha^{120f(8-u)} \cdot (\alpha^{f(8-u)} + \alpha^{f(8-t)}) \cdot (\alpha^{f(8-s)} + \alpha^{f(8-u)})\}$$

In the above calculations, many calculations of powers of $\alpha$ are required. For this reason, the faster calculation can be realized by preparing a table for the frequently encountered calculation such as $\alpha^{120}$ for instance.

Next, a case of a part (a) of FIG. 6 will be described. This is basically the same as a case of a part (b) of FIG. 6 described above, so that only a concrete example corresponding to what is shown in a part (a) of FIG. 6 will be described.

In a case of a part (a) of FIG. 6, the receiving side has the table of FIG. 24 Just like the transmitting side, and there is a need to comprehend a location in the deinterleaver to which each symbol enters whenever a symbol arrives. Here, an exemplary case of the fourth row used in the above description of the transmitting side will also be described.

When this fourth row has no error at all, the polynomial according to the received symbol sequence can be expressed, in accordance with the equation (32), as follows.

$$C(X)=C[1] \cdot X^7+C[11] \cdot X^5+C[18] \cdot X^6+C[19] \cdot X^9+C[125] \cdot X^3+C[126] \cdot X^2+C[127] \cdot X+C[128] \tag{75}$$

Normally, how many symbols are going to be received is not notified from the transmitting side in advance, and it can be ascertain for the first time by detecting an end of CPCS-PDUs.

Here, again, a case of errors in the maximum four symbols will be considered. The syndrome calculation procedure is identical to that of the equation (66) described above. Here, however, a value of k is taken from a certain C[k] contained in the equation (75), so that it takes a random value. Then, f(k) represents a degree of X in the equation (75) which has a coefficient C[k] corresponding to that value of k. For example, in correspondence to k=1, it is f(k)=7.

When there is an error, the syndrome value is not equal to 0, and the syndrome can be expressed, in a form similar to the equation (67), as follows.

$$S[i] = C[s] \cdot \alpha^{(119+i)f(s)} + C[t] \cdot \alpha^{(119+i)f(t)} + \tag{76}$$
$$C[u] \cdot \alpha^{(119+i)f(u)} + C[v] \cdot \alpha^{(119+i)f(v)}$$

$(i = 1, 2, 3, 4)$ where 0<s<t<u<v, and {s, t, u, v=k|k is a symbol number belonging to the fourth row}. Then, it is assumed that there are errors in the s-th, t-th, u-th, and v-th symbols. Also, C[k] (k=s, t, u, v) denotes a value of each symbol after the correction.

By solving the equations (66) and (76), the symbol value after the correction can be calculated. First, when there are four errors, the solutions are as follows.

$$C[s] = \{S[4] + (\alpha^{f(t)} + \alpha^{f(u)} + \alpha^{f(v)}) \cdot S[3] +$$
$$(\alpha^{f(t)+f(u)} + \alpha^{f(t)+f(v)} + \alpha^{f(u)+f(v)}) \cdot S[2] +$$
$$\alpha^{f(t)+f(u)+f(v)} \cdot S[1]\} /$$
$$\{\alpha^{120f(s)} \cdot (\alpha^{f(t)} + \alpha^{f(v)}) \cdot (\alpha^{f(t)} + \alpha^{f(u)}) \cdot (\alpha^{f(u)} + \alpha^{f(v)})\}$$

$$C[t] = \{S[4] + (\alpha^{f(s)} + \alpha^{f(u)} + \alpha^{f(v)}) \cdot S[3] +$$
$$(\alpha^{f(s)+f(u)} + \alpha^{f(s)+f(v)} + \alpha^{f(u)+f(v)}) \cdot S[2] +$$
$$\alpha^{f(s)+f(u)+f(v)} \cdot S[1]\} /$$
$$\{\alpha^{120f(t)} \cdot (\alpha^{f(s)} + \alpha^{f(v)}) \cdot (\alpha^{f(s)} + \alpha^{f(u)}) \cdot (\alpha^{f(u)} + \alpha^{f(v)})\}$$

$$C[u] = \{S[4] + (\alpha^{f(t)} + \alpha^{f(s)} + \alpha^{f(v)}) \cdot S[3] +$$
$$(\alpha^{f(t)+f(s)} + \alpha^{f(t)+f(v)} + \alpha^{f(s)+f(v)}) \cdot S[2] +$$
$$\alpha^{f(t)+f(s)+f(v)} \cdot S[1]\} /$$
$$\{\alpha^{120f(u)} \cdot (\alpha^{f(t)} + \alpha^{f(v)}) \cdot (\alpha^{f(t)} + \alpha^{f(s)}) \cdot (\alpha^{f(s)} + \alpha^{f(v)})\}$$

$$C[v] = \{S[4] + (\alpha^{f(t)} + \alpha^{f(u)} + \alpha^{f(s)}) \cdot S[3] +$$
$$(\alpha^{f(t)+f(u)} + \alpha^{f(t)+f(s)} + \alpha^{f(u)+f(s)}) \cdot S[2] +$$
$$\alpha^{f(t)+f(u)+f(s)} \cdot S[1]\} /$$
$$\{\alpha^{120f(v)} \cdot (\alpha^{f(t)} + \alpha^{f(s)}) \cdot (\alpha^{f(t)} + \alpha^{f(u)}) \cdot (\alpha^{f(u)} + \alpha^{f(s)})\}$$

(77)

In the equation (76), if there is only one error symbol (which is assumed to be the s-th symbol), then the equation (76) is reduced to:

$$S[i] = C[s] \cdot \alpha^{(119+i)f(s)} \quad (i=1,2,3,4) \tag{78}$$

and from this, it follows that:

$$C[s] = \alpha^{(119+i)}/S[i] \quad (i=1,2,3,4) \tag{79}$$

This is true regardless of a value of i, so it suffices to calculate for one i. This implies that it suffices to calculate only one of them, such as S[1] for instance, and there is no need to carry out any other syndrome calculation, so that an amount of calculations can be reduced as much.

Also, if there are only two error symbols (which are assumed to be the s-th and t-th symbols), then the equation (76) is reduced to:

$$S[i] = C[s] \cdot \alpha^{(119+i)f(s)} + C[t] \cdot \alpha^{(119+i)f(t)} \quad (i=1,2,3,4) \tag{80}$$

Similarly, in this case, it suffices to calculate only two syndromes such as S[1] and S[2] for instance, so that an amount of calculations can be reduced as much as that would be required for the other symbols otherwise.

In this case, the solutions are as follows.

$$C[s] = (S[2] + \alpha^{f(t)} \cdot S[1]) / \{\alpha^{120f(s)} \cdot (\alpha^{f(s)} + \alpha^{f(t)})\} \tag{81}$$

$$C[t] = (S[2] + \alpha^{f(s)} \cdot S[1]) / \{\alpha^{120f(t)} \cdot (\alpha^{f(s)} + \alpha^{f(t)})\}$$

Also, if there are only three error symbols (which are assumed to be the s-th, t-th and u-th symbols), then the equation (76) is reduced to:

$$S[i] = C[s] \cdot \alpha^{(119+i)f(s)} + C[t] \cdot \alpha^{(119+i)f(t)} + C[u] \cdot \alpha^{(119+i)f(u)} \tag{82}$$

$(i=1,2,3,4)$

Similarly, in this case, it suffices to calculate only three syndromes such as S[1], S[2] and S[3] for instance, so that an amount of calculations can be reduced as much as that would be required for S[4] otherwise.

In this case, the solutions are as follows.

$$C[s] = \{S[3] + (\alpha^{f(t)} + \alpha^{f(u)}) \cdot S[2] + \alpha^{f(t)+f(u)} \cdot S[1]\} / \tag{83}$$
$$\{\alpha^{120f(s)} \cdot (\alpha^{f(s)} + \alpha^{f(t)}) \cdot (\alpha^{f(s)} + \alpha^{f(u)})\}$$

$$C[t] = \{S[3] + (\alpha^{f(s)} + \alpha^{f(u)}) \cdot S[2] + \alpha^{f(s)+f(u)} \cdot S[1]\} /$$
$$\{\alpha^{120f(t)} \cdot (\alpha^{f(s)} + \alpha^{f(t)}) \cdot (\alpha^{f(t)} + \alpha^{f(u)})\}$$

$$C[u] = \{S[3] + (\alpha^{f(t)} + \alpha^{f(s)}) \cdot S[2] + \alpha^{f(t)+f(s)} \cdot S[1]\} /$$
$$\{\alpha^{120f(u)} \cdot (\alpha^{f(u)} + \alpha^{f(t)}) \cdot (\alpha^{f(s)} + \alpha^{f(u)})\}$$

In the first embodiment described above, only the FEC processing on the SSCS layer of AAL5 is used as a protocol for guaranteeing the data reliability. However, in practice, there is a limit to the performance of the FEC, and when cells greater than a certain number are discarded, the error correction by the FEC is no longer possible. In such a situation, there is no choice but to make an error correction by the re-transmission, and to this end, it is necessary to implement in advance a light-weight re-transmission control on the upper layer, in addition to the error-correction by the FEC on the SSCS layer. When the correction by the FEC is impossible, the original data cannot be obtained unless the re-transmission is made, so that in this embodiment it is assumed that a light-weight re-transmission control protocol is implemented on the upper layer of the SSCS layer.

In addition, by way of monitoring a state of the ATM network in advance, a high performance FEC code can be used when it is a state in which many errors occur, or a light FEC code can be used when it is a state in which only few errors occur, and a communication can be started by selecting a parameter for this selective use of different types of FEC codes.

It is to be noted that the above description has been directed to a case of AAL5, but the error correction scheme of the present invention is not limited by a type of data transfer, and equally applicable to any other type of data transfer as well.

It is also to be noted that, when there is a terminal device on which only AAL5 functions are implemented, and this terminal device has multimedia/continuous media processing functions (for speech, video, etc.), at a time of realizing multimedia/continuous media applications, it is possible to employ the error control scheme of the present invention in addition to the AAL5 processing functions so as to be able to guarantee the data reliability under various circumstances flexibly.

Second Embodiment One-to-Multiple Communication

Now, the second embodiment of an error control scheme according to the present invention, which is concerned with a case of one-to-multiple communication among terminals, will be described in detail.

Figure 25:
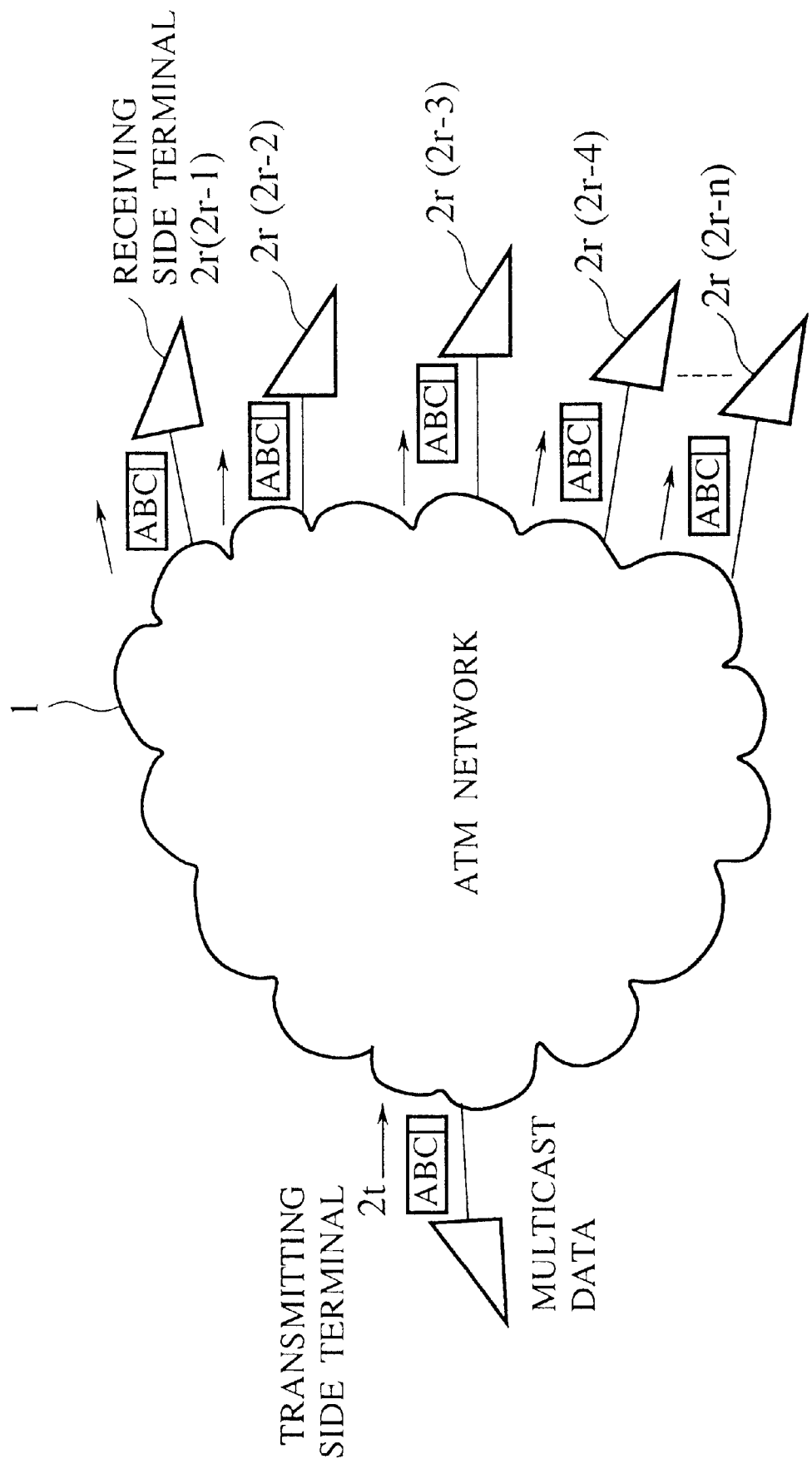
FIG. 25 is a schematic diagram of one-to-multiple communication system used in the second embodiment of an error control scheme according to the present invention.

As shown in FIG. 25, in this second embodiment, one transmitting side terminal 2t makes communications with a plurality of receiving side terminals 2r (2r-1 to 2r-n) through an ATM network 1. It is to be noted here that, in FIG. 25, any one or more of the receiving side terminals 2r can play double roles of the receiving side and the transmitting side simultaneously, and make one-to-multiple communication with the other terminals by setting up similar connections among the terminals, so as to effectively realize multiple-to-multiple communications, and this second embodiment will be applicable to such a case as well.

In the following, an exemplary case of attaching FEC and carrying out a multicast will be described in detail.

Figure 26:
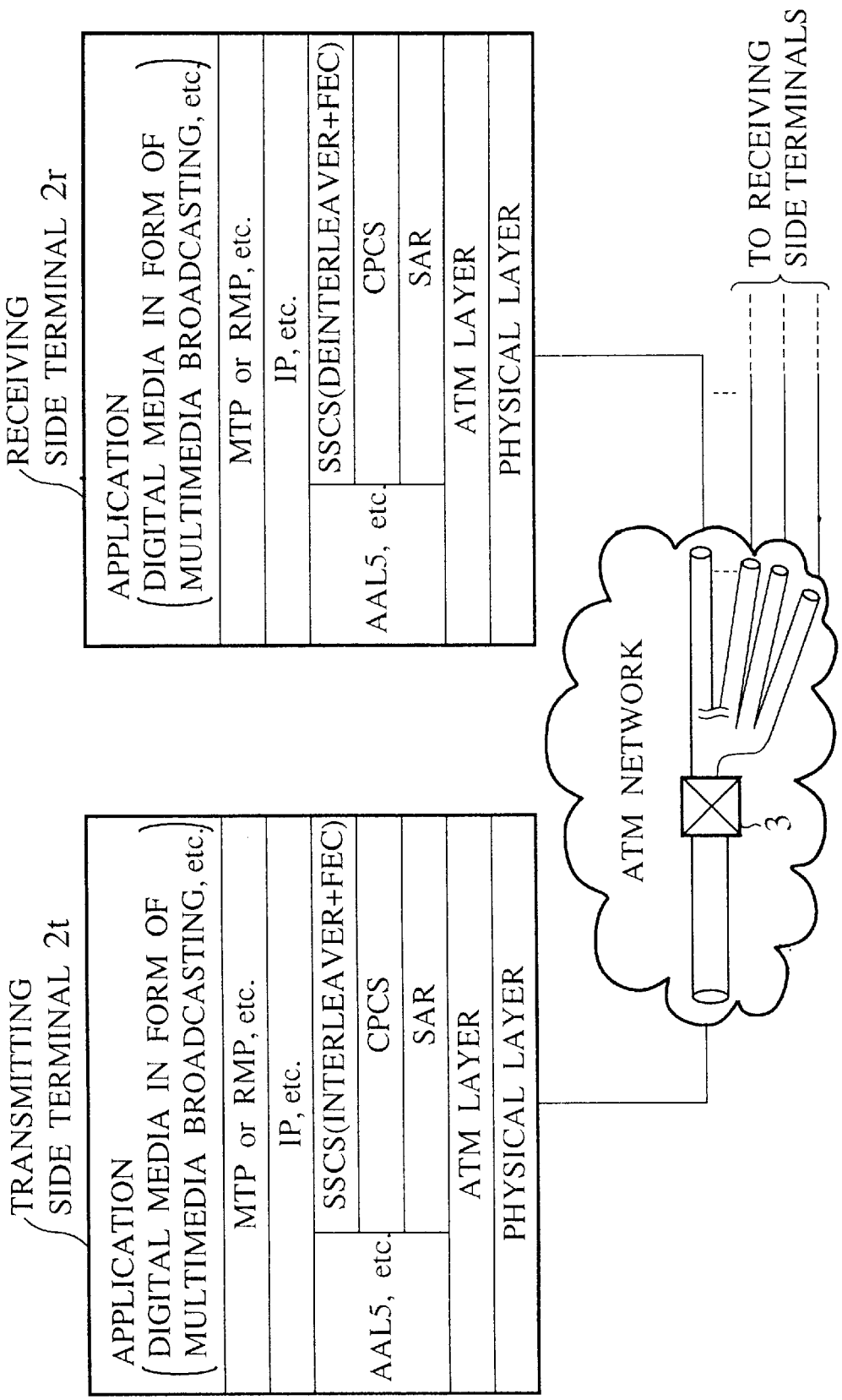
FIG. 26 is a schematic diagram showing a structure of protocol stacks for transmitting side and receiving side terminals in the second embodiment of an error control scheme according to the present invention.

FIG. 26 shows a structure of protocol stacks for terminals in this second embodiment, which are basically similar to the protocol stacks of FIG. 2 for the first embodiment described above, except that this second embodiment requires a protocol capable of providing a multicast function on some layer.

As a generally well known protocol capable of providing a multicast function, there is an IP transfer using a multicast IP address. In the currently available system, a UDP (User Datagram Protocol) is usually used as the upper layer protocol in a case of carrying out the IP multicast. This UDP differs from the TCP (Transmission Control Protocol) in that it is a protocol which does not guarantee the end-to-end reliability, so that this protocol does not make a correction even when a packet loss or a bit error occurs during the transfer. However, the application data to be transferred in this embodiment are supposed to be the digital media in a form of multimedia broadcasting, so that a protocol such as IP+UDP which does not guarantee the data reliability is inappropriate in this case.

For this reason, this second embodiment adopts MTP (Multicast Transport Protocol) or RMP (Reliable Multicast Protocol) on layer 4. In this second embodiment, however, by way of implementing the FEC according to the error control scheme of the present invention, a need of the re-transmission by the upper layer for the purpose of guaranteeing the data reliability can be reduced considerably.

MTP is a protocol having a function for correcting an error occurred during the transfer in a case of carrying out the IP multicast. The detail of its realization scheme is described in the current internet draft RFC 1301. This is an error correction scheme in which the transmitter re-transmits data in response to a re-transmission request made by the receiver. On the other hand, RMP is a protocol proposed by B. Wetten et al. of the University of California, Berkeley, which has basically equivalent operation and function as MTP. Both of these protocols presuppose the use of CSCW (Computer Supperted Cooperative Work), etc. as the application, so that there is no guarantee for the real time performance.

However, in a case of realizing the application in a form of multimedia broadcasting, there is a need to guarantee the real time performance, because in such a case, there is a high probability for the delay to exceed a tolerable range if the receiver is to make a re-transmission request to the transmitter after detecting an error. In this second embodiment, however, the FEC redundancy code for the error correction purpose is attached in advance to the data to be transferred, just as in the first embodiment described above, so that it becomes possible to guarantee the real time performance.

Now, the multicast provided by the upper layer such as IP is realized at the ATM level by using the copy function of the switch 3 as shown in FIG. 26. As for a manner of setting up connections, the following two manners can be primarily considered.

(1) A point-to-multipoint ATM connection is set up from the transmitting side terminal to all the receiving side terminals.

(2) A point-to-multipoint ATM connection is set up from the transmitting side terminal to some receiving side terminals and some relay servers. Each ATM connected relay server takes care of the receiving side terminals and relay servers which are located downstream in the multicast tree than this ATM connected relay server. Here, the relay server is a device which connects networks and sub-nets either physically or logically, which may possibly terminate a connection once at the layer above AAL.

Figure 27:
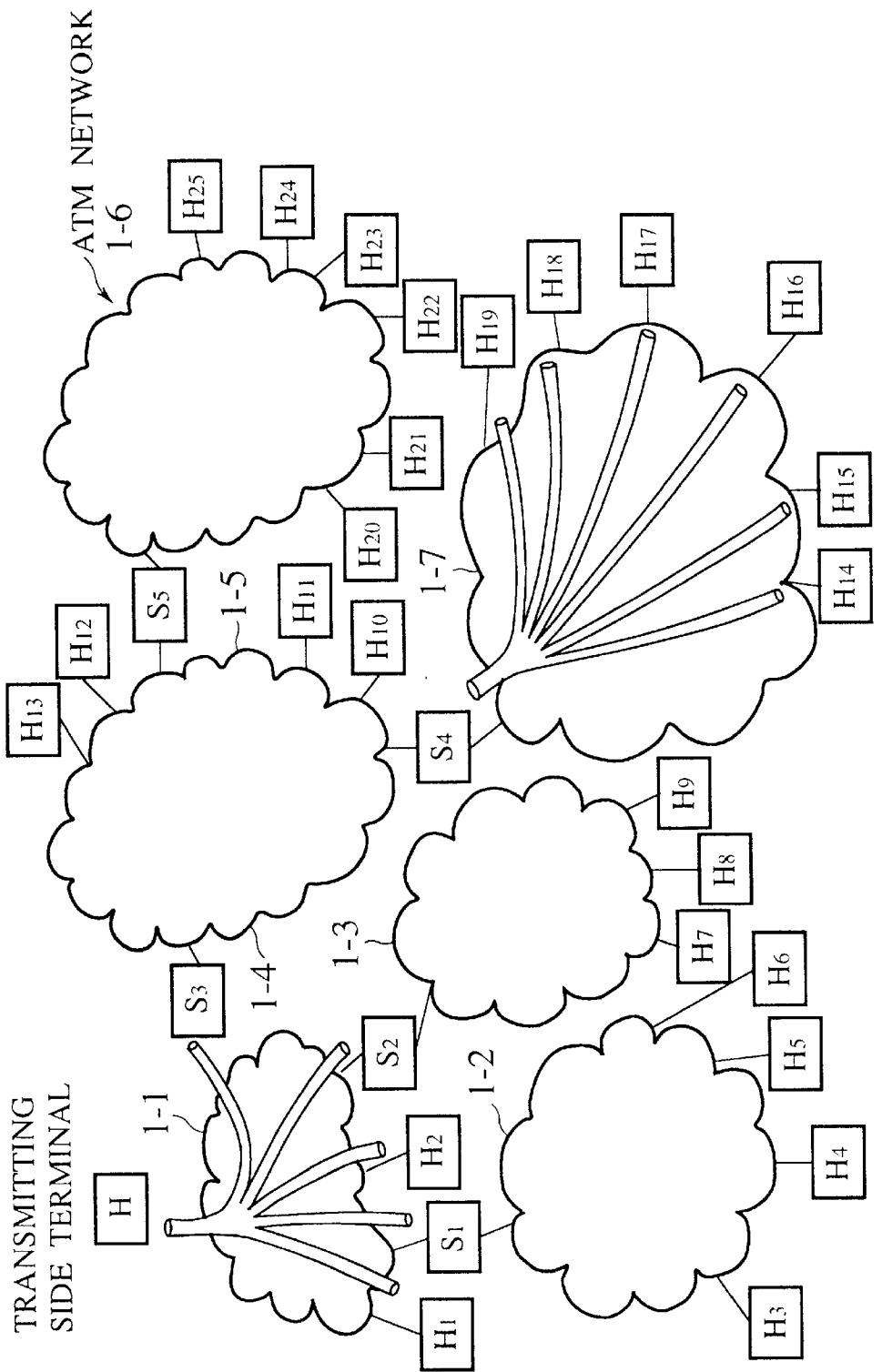
FIG. 27 is a schematic diagram showing an exemplary manner of setting up connections in one-to-multiple communication system used in the second embodiment of an error control scheme according to the present invention.

An exemplary situation realized by this manner (2) is illustrated in FIG. 27, where H represents for the transmitting side terminals 2t, H1 to H25 represent the receiving side terminals 2r, and S1 to S5 represent relay servers. As shown in FIG. 27, the connections are set up from the transmitting side terminal H to the receiving side terminals H1 and H2 and the relay servers S1, S2 and S3, and the relay servers S1, S2, and S3 similarly set up connections to the receiving side terminals belonging to a multicast group within the ATM networks 1–2, 1–3 and 1–4, respectively, or other relay servers which have further multicast group members on their downstream sides.

The above manner (1) is suitable in a case where a total number of receiving side terminals is relatively small, whereas the above manner (2) is capable of realizing the multicast over a wide range by hierarchically terminating connections at downstream side relay servers once, even in a case where a total number of receiving side terminals is considerably large.

Next, the transmitting side terminal 2t and the receiving side terminal 2r in this second embodiment will be described in detail.

Figure 28:
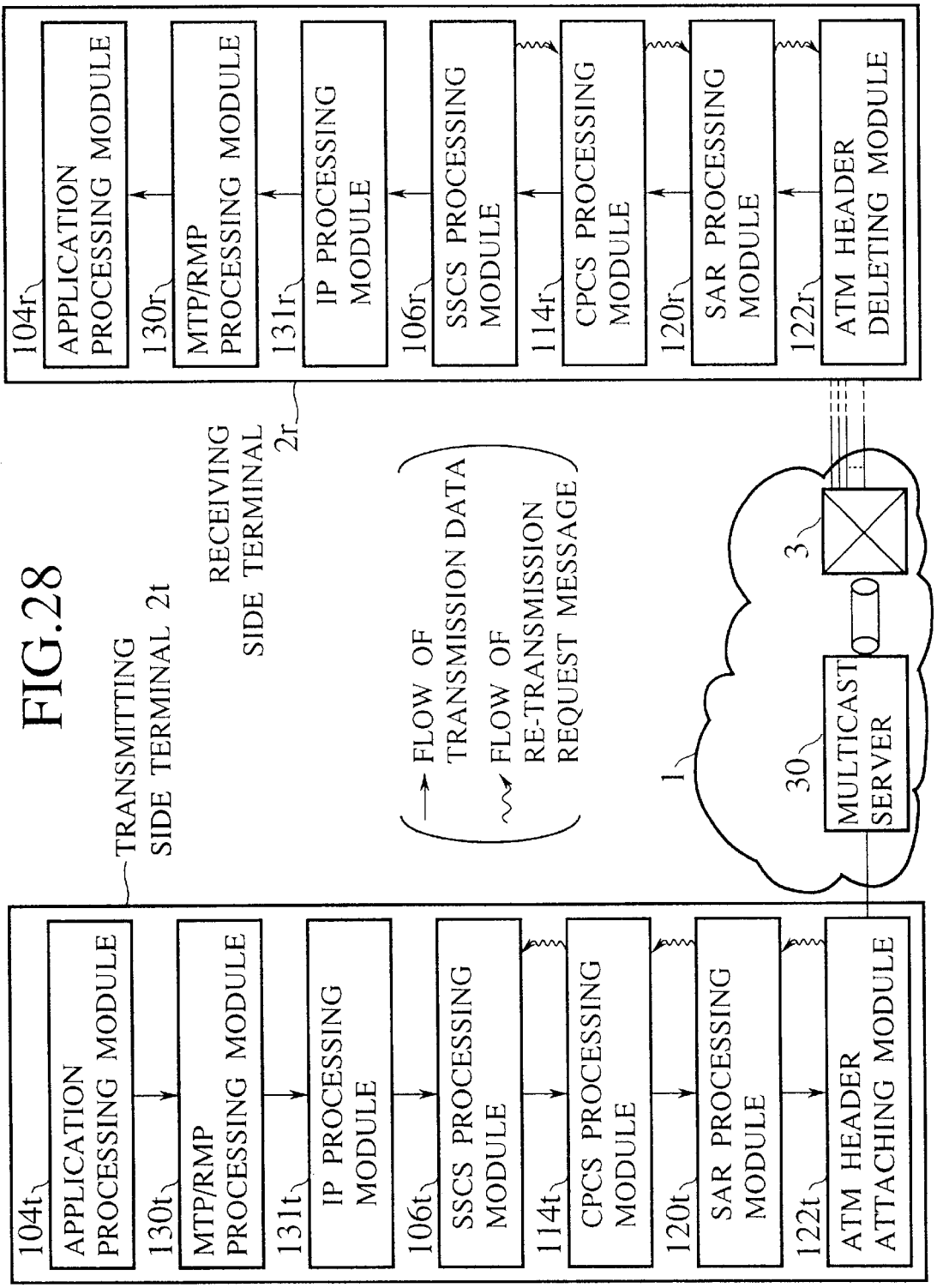
FIG. 28 is a schematic block diagram of internal configurations of a transmitting side and receiving side terminals in the second embodiment of an error control scheme according to the present invention.

FIG. 28 shows internal configurations of the transmitting side terminal 2t and the receiving side terminals 2r in this second embodiment, which are basically similar to those shown in FIG. 3 for the first embodiment described above. In the following, the features of the transmitting side terminal 2t and the receiving side terminal 2r of this second embodiment which differ from the first embodiment will be described. Here, an exemplary case of AAL5 will be described Just as in the first embodiment described above.

First, the transmitting side terminal 2t has an application processing module 104t, an MTP/RMP processing module 130t for carrying out MTP/RMP processing, and an IP processing module 131t for carrying out IP processing, which apply processings characteristic to the respective protocols with respect to the receiving side terminals 2r that are targets of the multicast. Here, various types of data in various media such as video, speech, text data, etc. are to be transferred by taking an advantage of ATM. The processings at these modules are similar to the conventional known ones and not characteristic to the present invention.

The transmitting side terminal 2t also has an SSCS processing module 106t, a CPCS processing module 114t, an SAR processing module 120t, and an ATM header attaching module 122t, which apply similar processings as the corresponding elements in FIG. 3 of the first embodiment.

Here, however, in a case of providing an error free communication with respect to the upper layer at the SSCS layer for carrying out the FEC, it is necessary for the layers below the SSCS layer to be capable of carrying out transparent data exchanges. This is because an identification of an individual cell at the SSCS layer is indispensable in order to carry out the re-transmission in unit of cell when a re-transmission request is sent from an entity on the SSCS layer of the receiving side to an entity on the SSCS layer of the transmitting side. For example, in a case of carrying out the re-transmission in unit of cell at the SSCS layer, the re-transmission request or data related to the re-transmission must be exchanged transparently at the layers below the SSCS layer. This feature will be described in further detail in relation to the processing at the receiving side terminal 2r below. Besides this, the processings at the layers below the SSCS layer are similar to the first embodiment described above.

Next, the receiving side terminal 2r will be described in detail.

In a case of carrying out the multicast, there is a high probability for some receiving side terminals 2r to be unable to receive data correctly, as messages are transmitted to many destinations. In other words, there is a high probability for the transmitting side terminal 2t to receive the re-transmission requests from some receiving side terminals 2r. However, in this second embodiment, the function for guaranteeing the data reliability is provided at the layer (SSCS layer in a case of AAL5) for attaching the FEC in advance, so that the probability for the transmitting side terminal 2t to receive the re-transmission requests from some receiving side terminals 2r is reduced considerably.

The error detection at the receiving side terminal 2r is carried out at the CPCS processing module 114r first. At this point, if no error is detected, it is possible to give the data to the upper layer directly, by passing through the SSCS processing module 106r just as in the first embodiment described above. In this case, the overhead is just as much as that due to the FEC redundancy code attached at the transmitting side, and the throughput and the latency can be fairly close to those obtainable in AAL5.

As described above, in a case of the multicast, the data gram is sent to a plurality of IP addresses corresponding to the multicast group at the IP level, so that in general, in the IP multicast, there is a higher probability for the transmitting side terminal 2t to receive the re-transmission requests compared with a case of a point-to-point communication. This probability becomes larger when a number of terminals belonging to the multicast group becomes larger. For example, if a number of receiving side terminals is $10^4$ and an error rate at the datalink is as large as that of a radio, the transmitting side terminal 2t would receive the re-transmission requests at a probability close to 1.

Here, the errors can be roughly classified into the following two levels.

(1) A level within a correctable range of the error correction code (FEC code) attached in advance.

(2) A level above the above level (1) which cannot be corrected by the FEC code, so that the correction can be realized only by using the re-transmission.

As should be obvious, in a case of the above level (1), it is possible to carry out the error correction Just as in a case of the one-to-one communication of the first embodiment described above, and give the correct data to the upper layer.

However, in a case of the above level 82), it is necessary to make an error correction by the re-transmission, and in this case, the following two re-transmission control schemes can be considered.

(A) A scheme in which the re-transmission control is carried out at the upper layer above AAL (such as the MTP/RMP layer corresponding to the layer 4 in FIG. 26, for example).

(B) A scheme in which the re-transmission control is carried out at some layer of AAL.

In a case of the scheme (A), the error correction is to be made according to a procedure of each re-transmission protocol, so that the procedure described in the first embodiment can be used, but in a case of the scheme (B), it is necessary to provide some additional processings in addition to the procedure described in the fist embodiment. In the following, a procedure for an error correction according to the above scheme (B) at a time of an occurrence of an error at the above level (2) will be described.

When errors exceeding the correction capability of the FEC occur during the transfer, the re-transmission control for the purpose of guaranteeing the data reliability at the SSCS layer can be carried out as follows.

In the re-transmission control, various different units of re-transmission including the following can be considered.

(1) A re-transmission of a cell at the ATM layer level.

(2) A re-transmission in unit of CPCS-PDU.

(3) A re-transmission in unit of SSCS-PDU (interleaver).

(4) A re-transmission in unit of (arbitrary number of) columns within SSCS-PDU (interleaver).

(5) a re-transmission in unit of packet at a layer above the layer 3.

In the following, an exemplary case of making an error correction by (3): the re-transmission in unit of (arbitrary number of) columns within SSCS-PDU (interleaver), in a case of carrying out the multicast, will be described in detail.

As described in the first embodiment, the SSCS processing module 106t of the transmitting side terminal 2t attaches an SSCS header containing SN in unit of cell. Then, the SSCS processing module 106r of the receiving side terminal 2r identifies a discarded cell according to this SSCS header. The fact that some error has occurred before this point is already detected by the CRC check at the CPCS layer. When the detected errors are spread over a wide range and exceeding the correction capability of the FEC attached at a time of transmission, the re-transmission request is issued to the SSCS layer of the transmitting side. The re-transmission request messages are expected to be sent from some of the receiving side terminals which are members of the multicast group, and their number is unknown. It may possibly be Just one, or may very well be several.

Figure 29:
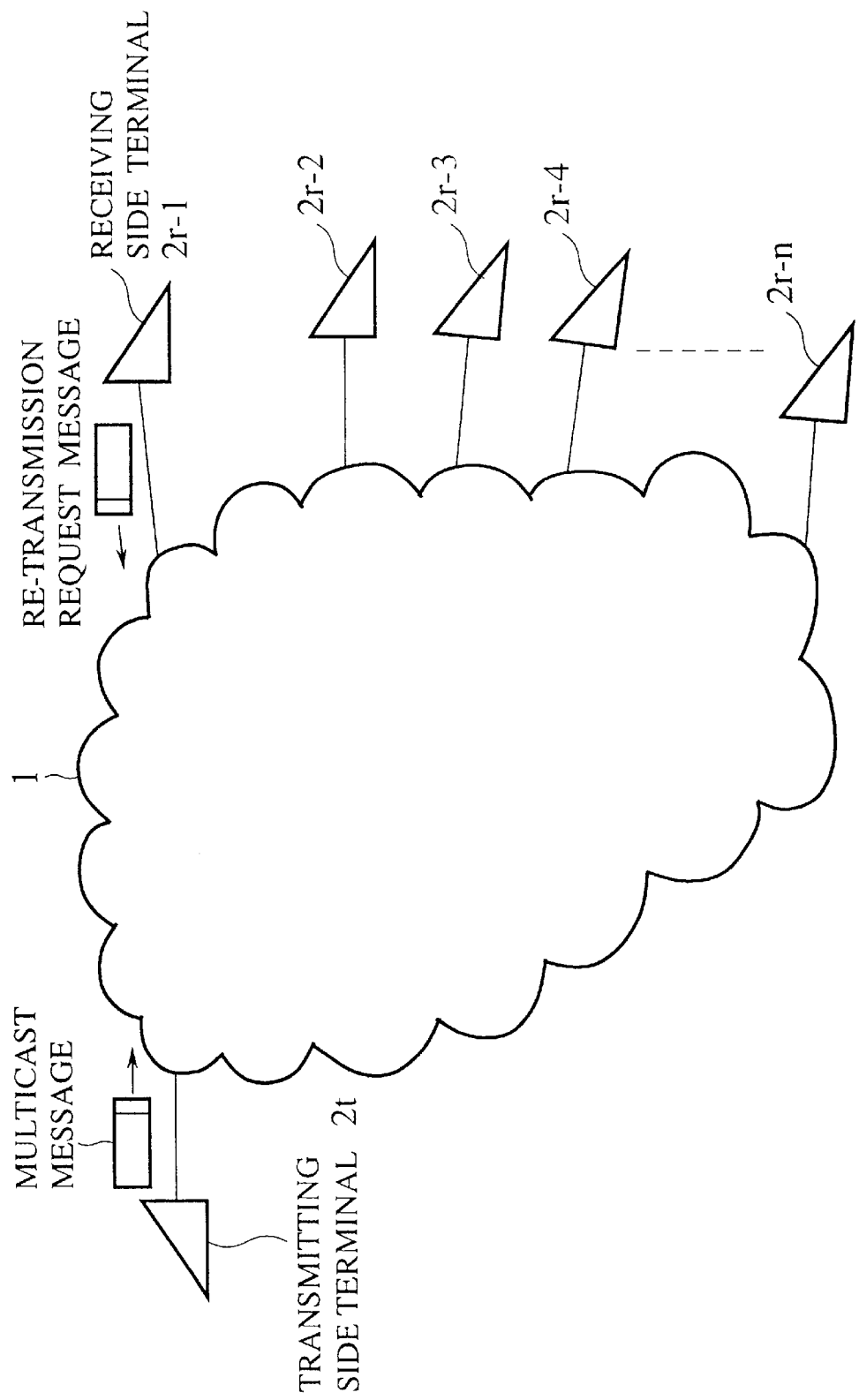
FIG. 29 is a schematic diagram of one-to-multiple communication system used in the second embodiment of an error control scheme according to the present invention, in a case of re-transmission request from one receiving side terminal.

For example, when errors exceeding the correction capability are detected only by the receiving side terminal 2r-1, the receiving side terminal 2r-1 realizes the error correction by sending at least the own address or a multicast address, and SN of a cell to be re-transmitted, to the SSCS processing module 106t of the transmitting side terminal 2t, as indicated in FIG. 29.

The re-transmission request sent by the receiving side terminal 2r-1 is then delivered to the SSCS processing module 106t of the transmitting side terminal 2t. At the transmitting side terminal 2t, in accordance with the content of the re-transmission request message, a cell having a corresponding SN is re-transmitted. At this point, the re-transmission data may be transmitted only to the receiving side terminal which issued the re-transmission request by utilizing a point-to-point connection set up separately from the multicast connection, or the multicast of the re-transmission data may be carried out.

In this example, AAL5 is presupposed, so that even when it is possible according to SN to identify a column within the SSCS-PDU to which the discarded cell corresponds, usually it is impossible to transfer that discarded cell alone. When the trailer of AAL5 is attached, even the actual data for one cell part becomes AAL-PDU for two cell part. As a scheme for transferring the re-transmission data, the following three schemes can be considered.

(1) A scheme in which the actual data is stored into an independent interleaver anew, given a new FEC there, and sent as an independent AAL-PDU. In this case, there is a need to register SN at a time of cell loss in a new SSCS header/trailer as well.

(2) A scheme in which the re-transmission data are sent with AAL null. The same SSCS header/trailer as before is attached in this case.

(3) A scheme in which the re-transmission data are included at a top or a last of the interleaver to be transferred at a timing of receiving the re-transmission request, or at a next timing. In this case, there is a need to provide an indication of the fact that it is the re-transmission data in order to be able to distinguish it from the other data.

In these transfer schemes, the destination of the re-transmission can be any one of the following four types.

(A) All the receiving side terminals belonging to the multicast group. In this case, the re-transmission data are to be transferred by the multicast.

(B) Only the receiving side terminal which issued the re-transmission request. In this case, there is a need to set up a point-to-point connection somehow.

(C) Only the receiving side terminal which issued the re-transmission request, using a connection for re-transmission set up in advance with respect to an individual receiving side terminal. In this case, the same SSCS header/trailer as before is attached.

(D) A part of the multicast group.

In a case of the transfer scheme (1), there is a possibility for the redundancy of the FEC code to be high when a number of discarded cells is small.

In a case of the transfer scheme (2), the overhead is small as the least necessary amount of data are going to be sent to the network.

When the re-transmission data are sent by the multicast as in the above case (A), there is an advantage that there is no need for the transmitting side terminal to carry out the processing to set up the connection to the specific receiving side terminal every time.

When the re-transmission cell is to be included in the multicast data, the fact that the received data is the re-transmission data can be identified by erecting a bit for indicating that it is the re-transmission data in the SSCS header/trailer. When the data are already received correctly, it suffices to discard the re-transmission data at the SSCS processing module 106r of the receiving side, so that this mechanism can be realized rather easily.

Figure 30A:
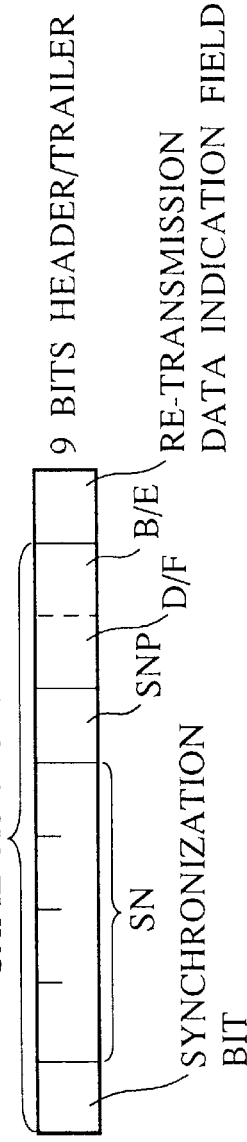
FIGS. 30A, 30B and 30C are diagrams showing various configurations of SSCS header/trailer that can be used in the second embodiment of an error control scheme according to the present invention.
Figure 30B:
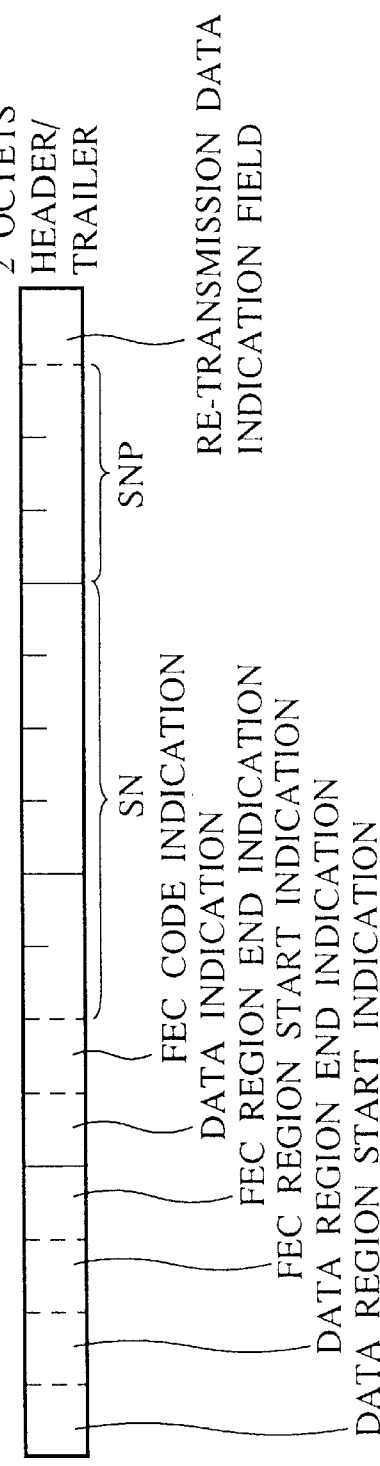
Figure 30C:
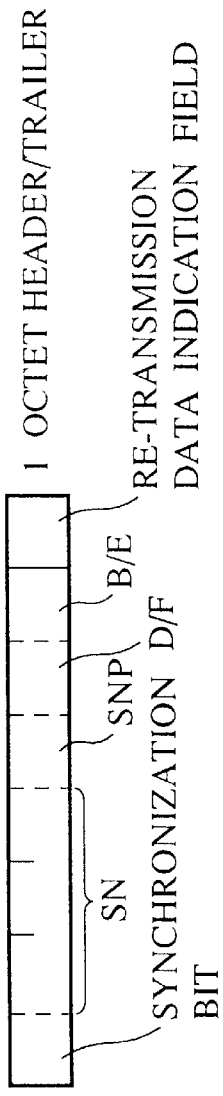

The SSCS header/trailer shown in FIG. 19 for the first embodiment has no field for this purpose, so that in order to provide an error free communication at the SSCS layer, it is necessary to use the extended SSCS header/trailer as shown in FIGS. 30A, 30B and 30C, even for the normal transfer.

In the extended SSCS header/trailer of FIG. 30A, the a one bit field for indicating that it is the re-transmission data is added to the one octet SSCS header/trailer of FIG. 19, to make up a 9 bits header/trailer.

In the extended SSCS header/trailer of FIG. 30B, two octets header/trailer is formed as it is preferable to form the header/trailer in octet unit, by expanding SN field to accommodate a larger SN, and fields for the purpose of more clearly identifying the data region and the FEC redundancy region within the interleaver are added.

In the extended SSCS header/trailer of FIG. 30C, one octet-header/trailer is formed by reducing SN field such that a one bit field for indicating that it is the re-transmission data can be provided in this one octet SSCS header/trailer.

A number of re-transmission cells can be reduced in accordance with the correction capability of the FEC. For example, when the correction capability of the FEC is four cells out of 128 cells, and the re-transmission of 8 cells is requested by the re-transmission request. In this case, the loss of up to 4 cells can be corrected by this FEC code, so that it suffices to sent at least 4 cells as the re-transmission cells. In this manner, by sending only the least necessary number of cells by the re-transmission, it is possible to prevent an occurrence of the congestion in the network. This is another advantage realized by the use of FEC in this embodiment.

Next, a case in which the re-transmission requests are sent from a plurality of receiving side terminals to the transmitting side terminal will be described. Here, an exemplary case of using the FEC code with such a correction capability that one cell within 16 cells corresponding to a size of one interleaver can be corrected.

Apart from the re-transmission of all the cells that are discarded, there is a scheme for reducing a number of re-transmission cells as follows.

As shown in FIG. 31, suppose that the re-transmission requests for the following cells arrive from the receiving side terminals 2r-1 and 2r-3 to the SSCS processing module 106t of the transmitting side terminal 2t.

(i) From the receiving side terminal 2r-1: Cells with SN=1, 2, 3

(ii) From the receiving side terminal 2r-3: Cells with SN=2, 3, 4

When the transmitting side terminal identified which cells are discarded at which receiving side terminal in this-manner, a processing for either one of the following two cases can be carried out.

(1) All the cells for SN that cannot be received by the receiving side terminals are re-transmitted.

(2) Only the minimum number of cells necessary for the decoding according to the correction capability of the FEC are re-transmitted.

In either case, a scheme for transmitting by the multicast and a scheme for transmitting by the point-to-point are possible.

When the above noted SNs of the discarded cells are compared, it can be seen that SN=2, 3 are common to both receiving side terminals. According to the case (2), three cells are discarded in each receiving side terminal, so that if two more cells can be received correctly at each receiving side terminal, the remaining one cell can be recovered by using the FEC code. Consequently, in accordance with a policy to re-transmit only the minimum number of cells necessary, the transmitting side terminal 2t re-transmits the commonly discarded cells with SN=2, 3 to both of the receiving side terminal 2r-1 and the receiving side terminal 2r-3 in this case (2). Of course, it is also possible to re-transmit the minimum number of cells necessary for each receiving side terminal separately, that is, the cells with SN=1, 2 to the receiving side terminal 2r-1 and the cells with SN=2, 3 to the receiving side terminal 2r-3 in a case of selecting cells with smaller SN among the necessary cells, for example. However, in a case of carrying out the re-transmission to the specific terminal in the multicast group, a corresponding point-to-point connection becomes necessary as already mentioned above.

The transmission destination can be limited to the receiving side terminals 2r-1 and 2r-3 as in the above example, or else two cells with SN=2, 3 or all four cells with SN=1, 2, 3, 4 can be transmitted by using the multicast.

It is to be noted that this data re-transmission control with a scheme for reducing a number of re-transmission cells is described here for a case of the one-to-multiple commication as an illustrative example, but it should be obvious that it is equally applicable to a case of one-to-one communication using the error correction function by re-transmission as well.

In a case of using the multicast, the fact that the received data are the re-transmission cells can be detected at the SSCS layer of those receiving side terminals which have already received these data correctly, so that the received data can be discarded at these receiving side terminals. Consequently, the re-transmission data will not affect the other data by being mixed into the other data in overlap.

At this point, in order to minimize the overhead due to the re-transmission cells, it is also possible to insert the re-transmission cells into another interleaver at the SSCS layer level, without forming a CPCS-PDU by the re-transmission cell alone.

In order to send data only to the specific receiving side terminals (receiving side terminals $2r$-1 and $2r$-3 in this example) in the multicast group, it is possible to adopt a scheme in which the minimum necessary number of cells alone are transferred by setting up connections to the specific receiving side terminals at the transmitting side terminal, or at the relay point between the transmitting side terminal and the receiving side terminals.

In the above example, a scheme using Negative ACK (negative acknowledgement) in which the receiving side which detected the cell loss issues the re-transmission request has been described, but it is also possible to adopt a scheme using Positive ACK (positive acknowledgement).

In such a case, after the multicast data are transmitted from the transmitting side terminal $2t$, a timer is activated at the SSCS processing module 106t, and the return of ACK from all the receiving side terminals $2r$ of the multicast group is awaited. Here, ACK registers an address of the receiving side terminal $2r$ and identifiers of data received there.

The upper limit value of the timer is set up according to the round trip time. When ACK is not returned after an elapse of this upper limit timer value, the corresponding data are re-transmitted to the receiving side terminal which failed to return ACK. The scheme for this re-transmission can be the same as described above.

This data transmission mechanism is similar to that used in the window control of TCP, and it is also possible to use the sliding window, similarly as in the window control of TCP. Here, however, the Positive ACK is used under the multicast environment, so that until ACK is returned from all the receiving side terminals $2r$, the corresponding data cannot be deleted from a memory for re-transmission. Consequently, when ACK gets delayed at a congested node in a middle of its route, there is a possibility for the lowering of the throughput as the transmitting side is kept in a state in which the next data cannot be transmitted.

To the layers above the AAL of the receiving side, the correct, error free data are going to be given as a result of the error control by the FEC and the re-transmission at the SSCS layer. After that, the usual processings at the layer 3 and the layer 4 are carried out, and the correct data are given to the application layer.

As described, it becomes possible in this second embodiment to provide a service with the minimum overhead and delay by carrying out the multicast, even when errors exceeding the correction capability of the FEC occur during the transfer.

By way of the processings at the transmitting and receiving sides as described above, it is possible to provide an error free communication at AAL level. In a case of the multicast, a probability for the transmitting side terminal to receive the re-transmission request from some receiving side terminals becomes higher for a larger number of receiving side terminals. However, by providing the FEC function at AAL level, and providing the error correction by the re-transmission in addition, it is possible to construct a system in which a high data reliability and a high real time performance are guaranteed.

As described, according to the present invention, the more efficient, faster, and more resource saving data transfer can be realized in the high speed communication through the ATM communication network, by implementing the error control scheme using the interleaver and the FEC at some layer of AAL, and in addition, by adjusting a size of the interleaver flexibly to a size of the application data. In particular, in a case of the high speed data transfer at AAL5, by applying the error control scheme of the present invention to the layer above the CPCS layer, it is possible to take a full advantage of the high speed nature of AAL5, while suppressing the inherent overhead of the FEC to the minimum. It is also possible to implement the FEC more efficiently to AAL1, AAL2, or AAL3/4 as well.

In the present invention, a size of the interleaver which defines a unit of data transfer is made variable and a flexibility is provided by setting only the maximum size, so that the traffic due to the overhead can be suppressed to the minimum, and a high throughput and a low latency can be realized. Moreover, unlike the conventional interleaver of a fixed size, there is no need to insert PAD in a region without data, so that an amount of calculation can be reduced and a high speed processing can be realized.

Note that, in the error control by the FEC using the conventional interleaver of a fixed length produces cells containing dummy data which causes a meaningless overhead solely for the purpose of length matching, so that it has been particularly difficult to apply to the data transfer at AAL3/4 or AAL5 which involves bursty data generation, because of an enormous amount of dummy cells required. The present invention resolve this problem by making a size of the interleaver variable and providing a flexibility by setting only the maximum size, as noted above.

In addition, in the present invention, a direction of writing and a direction of reading for the interleaver are made identical, so that the reading can be started immediately after the writing starts. Conventionally, there has been a considerably delay as data cannot be given to the lower layer until the writing of all the data for the data region of the interleaver is finished, but this delay can be reduced to nearly zero according to the present invention.

Thus, the present invention provide a framework for realizing the error control scheme using the FEC at AAL, and by using this, it becomes possible to make a communication which requires a data reliability, without using the re-transmission control, as long as the errors occur at a level that can be recovered by the correction capability of the FEC.

Also, in the present invention, a size of data written within the interleaver can be recognized surely by providing a field for indicating a last location of the data written into the interleaver. As a result, by means of the advance negotiation concerning the data size indication, it also becomes possible to recognize the data size surely at the receiving side as well, and therefore it becomes possible to reproduce the correct data to be given to the upper layer. In addition, by attaching the data length indication, it suffices to use the minimum amount of padding, so that the packing efficiency can be raised to the maximum level for a case of carrying out the FEC.

Also, in the present invention, by omitting the writing into a dedicated memory for an interleaver, and providing only a memory for storing the calculation results for the FEC redundancy code, it is possible to suppress an amount of memory required to the minimum, and the reduction of cost can be realized.

Also, in the present invention, a size of meaningful data excluding the dummy data can be recognized accurately, so that the correct data can be reproduced even from the data containing errors by making an error correction by the FEC with respect to the data only when the error is detected by utilizing the error detection function of AAL5 trailer (i.e., CRC check of the CPCS trailer). By using this scheme, it suffices to simply discard the FEC portion for those data which are judged as error free by the CRC check, so that the processing time is nearly the same as in a case of AAL5 without FEC (i.e., a case of SSCS null) as long as an error rate is small, so that the light-weight protocol in compliance with an original aim of AAL5 can be realized.

In addition, depending on a state of the network, the processing time at the SSCS layer can be reduced further when an error rate is small. Namely, in the present invention, the data region and the redundancy code region of the interleaver can be treated independently. By using this, when the error rate at the network is relatively small, the data region of almost all the interleavers can be judged as error free, and in such a case, the FEC processing becomes unnecessary, so that the processing time at the SSCS layer can be further reduced.

Consequently, according to the present invention, it is possible to deal with the application which requires a real time performance as well, and it is useful for the effective use of CPU resources.

In general, when the error correction code for the data are attached to the data at a layer above the CPCS layer, even when a size of the interleaver is not variable, it is possible to set the data and the error correction code in separate CPCS-PDUs at the transmitting side.

The CPCS layer has an error detection function, and this error detection function is separately applied to the CPCS-SDU containing the actual data and the CPCS-SDU containing the error correction code at the receiving side, it becomes possible to ascertain whether there is an error in the actual data which are necessary in reproducing the application level data, by using of the AAL5 function.

From a viewpoint of the application level, as long as the actual data can be received correctly, it is unimportant as to whether the error correction code contains an error or not.

Consequently, when the CPCS-SDU containing the actual data is error free, it is possible for the receiving side to omit the decoding calculation processing by the FEC attached in advance to the upper layer at the transmitting side, regardless of a presence or absence of an error in the CPCS-SDU containing the error correction code.

In a case of realizing the decoding calculation processing by the FEC as the software processing, this processing requires a certain amount of processing time, so that it is a processing which should be avoided as long as it is unnecessary. Thus, it is used only when the correction of the actual data is unavoidably required.

By way of the utilization of the error detection using the CPCS trailer as described above, it is possible to suppress a range of application of the error correction processing at the upper layer to the minimum necessary range, and as a result, it is possible to reduce the decoding processing for the purpose of the error correction considerably.

Also, in a case of the multicast communication, when the FEC according to the present invention is implemented, it is possible to guarantee the data reliability to more receivers in real time, compared with a case without FEC or a case with only the re-transmission control at the layer 4, etc. which has a very poor real time performance.

Here, however, by providing the re-transmission function for the purpose of the reliability guarantee in addition to the FEC, even in the case where the errors exceeds the correction capability of the FEC, it becomes possible to make an error correction by using the minimum necessary amount of re-transmission data.

Namely, the re-transmission of a very large data as it is to each of a plurality of receivers is very inefficient. In this regard, by implementing the FEC, it suffices to re-transmit only the minimum necessary amount of data to reach to the correction capability range of the FEC, so that the amount of re-transmission data can be reduced, and the network efficiency can be improved.

It is to be noted that, in the embodiments described above, an order of writing the data into the interleaver can be either predetermined to a default setting or determined by a negotiation between a transmitting side and a receiving side at a beginning of a communication between the transmitting side and the receiving side such as at a time of signaling. Here, an appropriate order of writing should be determined in view of the fact that the writing into the interleaver can cause a large delay depending on an order of writing.

It is to be noted that the present invention as described above is equally applicable to the wired ATM network as well as to the wireless ATM network.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of error control at an AAL (ATM Adaptation Layer) level, comprising the steps of:

(a) segmenting continuous data to be transmitted given from an upper layer into a sequence of data in a prescribed length, and sequentially writing each data into each column of a matrix shaped data region in an interleaver;

(b) variably setting a last column of the data region in the interleaver as a column of the data region in the interleaver determined in relation to one column into which a last data is written in the interleaver by the step (a) such that the last column of the data region in the interleaver contains interleaved data of a variable size, obtaining an error control code for the data up to the last column in each row of the data region in the interleaver, and writing each obtained error control code into a corresponding location within a matrix shaped error control code region in the interleaver; and (c) reading contents of each column of the data region and the error control code region in the interleaver, attaching a prescribed header/trailer to a prescribed number of columns of the data and/or the error control codes read out from the interleaver to form a data unit, and sequentially giving each data unit to a lower layer such that data units are transmitted in forms of ATM cells and an error correction using the error control codes can be carried out for the data at a receiving side when an error occurs during data transfer.

2. The method of claim 1, wherein at the step (b), the data region of the interleaver has a prescribed maximum column, and the last column of the data region in the interleaver is set as the maximum column of the data region in the interleaver when the data region of the interleaver is filled with the data up to the maximum column.

3. The method of claim 1, wherein at the step (b), the data region of the interleaver has a prescribed maximum column, and the last column of the data region in the interleaver is set as either one of said one column into which the last data is written in the interleaver by the step (a) or a column next to said one column when the data region of the interleaver is not filled with the data up to the maximum column.

4. The method of claim 1, wherein at the step (b), an information indicating an amount of data stored in the interleaver is also entered into a field provided at the last column of the data region in the interleaver.

5. The method of claim 1, wherein at the step (b), dummy data for padding an empty portion into which no data are written by the step (a), within the data region in the interleaver up to the last column, are also entered into the interleaver.

6. The method of claim 1, wherein at the step (c), a part of the data region in the interleaver beyond the last column is not read out and given to the lower layer.

7. The method of claim 1, wherein at the step (b), an empty space for a length of a trailer to be attached at CPCS (Common Part Convergence Sublayer) is provided in the data region after the last data in the interleaver.

8. The method of claim 1, wherein an order of writing the data into the interleaver at the step (a) is either predetermined or determined by a negotiation between a transmitting side and a receiving side at a beginning of a communication between the transmitting side and the receiving side.

9. The method of claim 1, wherein at the step (c), the prescribed header/trailer contains a sequence number to be assigned to each data unit.

10. The method of claim 1, wherein at the step (c), the prescribed header/trailer contains a field for indicating an information to be used in detecting and correcting an error in the data and/or the error control codes to which the prescribed header/trailer is attached.

11. The method of claim 1, wherein at the step (c), the prescribed header/trailer contains a field for indicating whether a content of the data unit in which the prescribed header/trailer is contained belongs to the data or the error control codes.

12. The method of claim 1, wherein at the step (c), the prescribed header/trailer contains a field for providing a protection against an error in at least a part of the prescribed header/trailer.

13. The method of claim 1, wherein at the step (c), the prescribed header/trailer contains a field for identifying a boundary of a corresponding set of the data and the error control codes.

14. The method of claim 1, wherein at the step (c), the prescribed header/trailer contains a field for indicating a beginning or an end of each of a sequence of data and a sequence of error control codes.

15. The method of claim 1, wherein at the step (b), the error control codes are FEC (Forward Error Correction) redundancy codes.

16. The method of claim 1, wherein at the step (b), the error control codes are Reed Solomon codes.

17. The method of claim 1, wherein the steps (a), (b) and (c) are carried out at SSCS (Service Specific Convergence Sublayer) in the AAL.

18. The method of claim 1, wherein the steps (a), (b) and (c) are implemented on AAL type 5.

19. A method of error control at an AAL (ATM Adaptation Layer) level, comprising the steps of:

(a) segmenting continuous data to be transmitted given from an upper layer into a sequence of data in a prescribed length, and sequentially giving each data to a lower layer;

(b) obtaining error control codes for the data while the data are sequentially given to the lower layer at the step (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs such that the last column of the data region in the interleaver contains interleaved data of a variable size, and calculating each error control code for the data up to the last column in each row of the interleaving matrix; and (c) attaching a prescribed header/trailer to a prescribed amount of the data and/or the error control codes sequentially given to the lower layer by the steps (a) and (b) to form a data unit, such that the data units are transmitted in forms of ATM cells and an error correction using the error control codes can be carried out for the data at a receiving side when an error occurs during data transfer.

20. The method of claim 19, wherein at the step (a), an information indicating an amount of data to be regarded as being interleaved together by the interleaving matrix is also given to the lower layer after the data.

21. The method of claim 19, wherein at the step (a), dummy data for padding an empty portion which is not filled with the data, within the interleaving matrix up to the last column, are also given to the lower layer after the data.

22. The method of claim 21, wherein the dummy data for padding are added such that a total size of the data given by the step (a), the prescribed header/trailer attached by the step (c), a length of a trailer to be attached at CPCS (Common Part Convergence Sublayer), and the dummy data for padding becomes an integer multiple of 48 octet.

23. The method of claim 19, wherein at the step (c), the prescribed header/trailer contains a field for indicating an information to be used in detecting and correcting an error in the data and/or the error control codes to which the prescribed header/trailer is attached.

24. The method of claim 19, wherein at the step (c), the prescribed header/trailer contains a field for indicating whether a content of the data unit in which the prescribed header/trailer is contained belongs to the data or the error control codes.

25. The method of claim 19, wherein at the step (c), the prescribed header/trailer contains a field for providing a protection against an error in at least a part of the prescribed header/trailer.

26. The method of claim 19, wherein at the step (c), the prescribed header/trailer contains a field for identifying a boundary of a corresponding set of the data and the error control codes.

27. The method of claim 19, wherein at the step (c), the prescribed header/trailer contains a field for indicating a beginning or an end of each of a sequence of data and a sequence of error control codes.

28. The method of claim 19, wherein at the step (b), the error control codes are FEC (Forward Error Correction) redundancy codes.

29. The method of claim 19, wherein at the step (b), the error control codes are Reed Solomon codes.

30. The method of claim 19, wherein the steps (a), (b) and (c) are carried out at SSCS (Service Specific Convergence Sublayer) in the AAL.

31. The method of claim 19, wherein the steps (a), (b) and (c) are implemented on AAL type 5.

32. A method of error control at an AAL (ATM Adaptation Layer) level, comprising the steps of:
(a) checking headers/trailers containing sequence numbers in a sequence of data units for data and error control codes given from a lower layer, and deleting the headers/trailers from the data units;
(b) sequentially writing the data and the error control codes of the data units with the headers/trailers deleted at the step (a) into a deinterleaver having matrix shaped data region and error control code region according to an information contained in the headers/trailers, and detecting an end of a sequence of data units according to the information contained in the headers/trailers;
(c) carrying out error detection and error correction for the data written into the deinterleaver at the step (b), so as to decode correct data; and
(d) reading decoded correct data obtained at the step (c) from the deinterleaver, and sequentially giving the decoded correct data to an upper layer.

33. The method of claim 32, wherein at the step (b), an information indicating an amount of data stored in the deinterleaver is also entered into a field provided at a last column of the data region in the deinterleaver.

34. The method of claim 32, wherein at the step (b), dummy data for padding an empty portion into which no data are written, within the data region in the deinterleaver up to a last column, are also entered into the deinterleaver.

35. The method of claim 32, wherein an order of writing the data into the deinterleaver at the step (b) is either predetermined or determined by a negotiation between a transmitting side and a receiving side at a beginning of a communication between the transmitting side and the receiving side.

36. The method of claim 32, wherein at the step (c), the error correction using the error control codes is carried out in a state in which locations of errors are identified according to the information contained in the header/trailer.

37. The method of claim 36, wherein further comprising the step of identifying locations of errors by an error detection using a CPCS (Common Part Convergence Sublayer) trailer and an SSCS (Service Specific Convergence Sublayer) header/trailer before the step (c).

38. The method of claim 37, wherein at the step (c), the error correction using the error control codes is applied by regarding the data for which an error is detected by the error detection using the CPCS (Common Part Convergence Sublayer) trailer the SSCS (Service Specific Convergence Sublayer) header/trailer as being discarded during data transfer.

39. The method of claim 36, further comprising the step of skipping the steps (b), (c), and (d) and giving a sequence of data units with the headers/trailers deleted at the step (a) to the upper layer when no error is detected by an error detection using a CPCS (Common Part Convergence Sublayer) trailer for all the data in the sequence of data units.

40. The method of claim 32, wherein at the step (c), the header/trailer contains a field for indicating an information to be used in detecting and correcting an error in the data and/or the error control codes to which the header/trailer is attached.

41. The method of claim 32, wherein at the step (c), the header/trailer contains a field for indicating whether a content of the data unit in which the header/trailer is contained belongs to the data or the error control codes.

42. The method of claim 32, wherein at the step (c), the header/trailer contains a field for providing a protection against an error in at least a part of the header/trailer.

43. The method of claim 32, wherein at the step (c), the header-trailer contains a field for identifying a boundary of a corresponding set of the data and the error control codes.

44. The method of claim 32, wherein at the step (c), the header/trailer contains a field for indicating a beginning or an end of each of a sequence of data and a sequence of error control codes.

45. A method of error control at an AAL (ATM Adaptation Layer) level, comprising the steps of:
(a) segmenting continuous data to be transmitted given from an upper layer into a sequence of data in a prescribed length, and sequentially giving each data to a lower layer;
(b) obtaining error control codes for the data while the data are sequentially given to the lower layer at the step (a), and sequentially giving obtained error control codes to the lower layer in succession to the data; and
(c) attaching a prescribed header/trailer containing a sequence number to a prescribed amount of the data and/or the error control codes sequentially given to the lower layer by the steps (a) and (b) to form CPCS (Common Part Convergence Sublayer) protocol data units in which the data given by the step (a) and the error control codes given by the step (b) in succession to the data given by the step (a) belong to different CPCS protocol data units, such that the CPCS protocol data units are transmitted in forms of ATM cells and an error correction using the error control codes can be carried out for the data at a receiving side when an error occurs during data transfer.

46. A method of error control at an AAL (ATM Adaptation Layer) level, comprising the steps of:
(a) receiving a sequence of CPCS (Common Part Convergence Sublayer) protocol data units for data and CPCS protocol data units for corresponding error control codes given from a lower layer;
(b) carrying out an error detection using a CPCS trailer for the CPCS protocol data units for the data;
(c) carrying out an error correction for the data in which an error is detected at the step (b) by using the corresponding error control codes at SSCS (Service Specific Convergence Sublayer), and giving only corrected data to an upper layer; and
(d) giving the data in which no error is detected at the step (b) to the upper layer by skipping the step (c), regardless of a presence or absence of an error in the CPCS protocol data units for the corresponding error control codes.

47. A method of data re-transmission control in a communication using an error correction function by FEC (Forward Error Correction) and an error correction function by re-transmission, comprising the steps of:
(a) receiving at a transmitting terminal a re-transmission request from a receiving terminal requesting a re-transmission of erroneous communication data which are received with errors that cannot be corrected by the error correction function by FEC at the receiving terminal;

(b) determining a minimum amount of re-transmission data necessary in recovering the erroneous communication data by using the error correction function by FEC and the error correction function by re-transmission, according to the re-transmission request received by the step (a) and an error correction capability of the error correction function by FEC; and (c) re-transmitting the minimum amount of re-transmission data determined by the step (b) from the transmitting terminal to the receiving terminal.

48. The method of claim 47, wherein the communication is a multicast communication from the transmitting terminal to a plurality of receiving terminals, and the step (a) receives the re-transmission request at the transmitting terminal from at least one receiving terminal while the step (b) re-transmits the minimum amount of re-transmission data from the transmitting terminal to said at least one receiving terminal.

49. A system for error control at an AAL (ATM Adaptation Layer) level, comprising:

(a) means for segmenting continuous data to be transmitted given from an upper layer into a sequence of data in a prescribed length, and sequentially writing each data into each column of a matrix shaped data region in an interleaver;

(b) means for variably setting a last column of the data region in the interleaver as a column of the data region in the interleaver determined in relation to one column into which a last data is written in the interleaver by the means (a) such that the last column of the data region in the interleaver contains interleaved data of a variable size, obtaining an error control code for the data up to the last column in each row of the data region in the interleaver, and writing each obtained error control code into a corresponding location within a matrix shaped error control code region in the interleaver; and (c) means for reading contents of each column of the data region and the error control code region in the interleaver, attaching a prescribed header/trailer to a prescribed number of columns of the data and/or the error control codes read out from the interleaver to form a data unit, and sequentially giving each data unit to a lower layer such that data units are transmitted in forms of ATM cells and an error correction using the error control codes can be carried out for each data unit at a receiving side when an error occurs during data transfer.

50. A system for error control at an AAL (ATM Adaptation Layer) level, comprising:

(a) means for segmenting continuous data to be transmitted given from an upper layer into a sequence of data in an prescribed length, and sequentially giving each data to a lower layer;

(b) means for obtaining error control codes for the data while the data are sequentially given to the lower layer at the means (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs such that the last column of the data region in the interleaver contains interleaved data of a variable size, and calculating each error control code for the data up to the last column in each row of the interleaving matrix; and (c) means for attaching a prescribed header/trailer to a prescribed amount of the data and/or the error control codes sequentially given to the lower layer by the means (a) and (b) to form a data unit, such that the data units are transmitted in forms of ATM cells and an error correction using the error control codes can be carried out for each data unit at a receiving side when an error occurs during data transfer.

51. A system for error control at an AAL (ATM Adaptation Layer) level, comprising:

(a) means for checking headers/trailers containing sequence numbers in a sequence of data units for data and error control codes given from a lower layer, and deleting the headers/trailers from the data units;

(b) means for sequentially writing the data and the error control codes of the data units with the headers/trailers deleted at the means (a) into a deinterleaver having matrix shaped data region and error control code region according to an information contained in the headers/trailers, and detecting an end of a sequence of data units according to the information contained in the headers/trailers;

(c) means for carrying out error detection and error correction for the data written into the deinterleaver at the means (b), so as to decode correct data; and (d) means for reading decoded correct data obtained at the means (c) from the deinterleaver, and sequentially giving the decoded correct data to an upper layer.

52. A system for error control at an AAL (ATM Adaptation Layer) level, comprising:

(a) means for segmenting continuous data to be transmitted given from an upper layer into a sequence of data in a prescribed length, and sequentially giving each data to a lower layer;

(b) means for obtaining error control codes for the data while the data are sequentially given to the lower layer at the means (a), and sequentially giving obtained error control codes to the lower layer in succession to the data; and (c) means for attaching a prescribed header/trailer containing a sequence number to a prescribed amount of the data and/or the error control codes sequentially given to the lower layer by the means (a) and (b) to form CPCS (Common Part Convergence Sublayer) protocol data units in which the data given by the means (a) and the error control codes given by the means (b) in succession to the data given by the means (a) belong to different CPCS protocol data units, such that the CPCS protocol data units are transmitted in forms of ATM cells through and an error correction using the error control codes can be carried out for the data at a receiving side when an error occurs during data transfer.

53. A system for error control at an AAL (ATM Adaptation Layer) level, comprising:

(a) means for receiving a sequence of CPCS (Common Part Convergence Sublayer) protocol data units for data and CPCS protocol data units for corresponding error control codes given from a lower layer;

(b) means for carrying out an error detection using a CPCS trailer for the CPCS protocol data units for the data;

(c) means for carrying out an error correction for the data in which an error is detected at the means (b) by using the corresponding error control codes at SSCS (Service Specific Convergence Sublayer), and giving only corrected data to an upper layer; and (d) means for giving the data in which no error is detected at the means (b) to the upper layer by skipping the means (c), regardless of a presence or absence of an error in the CPCS protocol data units for error control codes.

54. A system for data re-transmission control in a communication using an error correction function by FEC (Forward Error Correction) and an error correction function by re-transmission, comprising the steps of:

(a) means for receiving at a transmitting terminal a re-transmission request from a receiving terminal requesting a re-transmission of erroneous communication data which are received with errors that cannot be corrected by the error correction function by FEC at the receiving terminal;

(b) means for determining a minimum amount of re-transmission data necessary in recovering the erroneous communication data by using the error correction function by FEC and the error correction function by re-transmission, according to the re-transmission request received by the means (a) and an error correction capability of the error correction function by FEC; and (c) means for re-transmitting the minimum amount of re-transmission data determined by the means (b) from the transmitting terminal to the receiving terminal.

55. The system of claim 54, wherein the communication is a multicast communication from the transmitting terminal to a plurality of receiving terminals, and the means (a) receives the re-transmission request at the transmitting terminal from at least one receiving terminal while the means (c) re-transmits the minimum amount of re-transmission data from the transmitting terminal to said at least one receiving terminal.

56. A method of error control at a level between an upper layer and a lower layer, comprising the steps of:

(a) segmenting continuous data to be transmitted given from the upper layer into a sequence of data in a prescribed length, and sequentially writing each data into each column of a matrix shaped data region in an interleaver:

(b) variably setting a last column of the data region in the interleaver as a column of the data region in the interleaver determined in relation to one column into which a last data is written in the interleaver by the step (a) such that the last column of the data region in the interleaver contains interleaved data of a variable size, obtaining an error control code for the data up to the last column in each row of the data region in the interleaver, and writing each obtained error control code into a corresponding location within a matrix shaped error control code region in the interleaver; and (c) reading contents of each column of the data region and the error control code region in the interleaver, attaching a prescribed header to a prescribed number of columns of the data and/or the error control codes read out from the interleaver to form a data unit, and sequentially giving each data unit to the lower layer such that data units are transmitted and an error correction using the error control codes can be carried out for the data at a receiving side when an error occurs during data transfer.

57. A method of error control at a level between an upper layer and a lower layer, comprising the steps of:

(a) segmenting continuous data to be transmitted given from the upper layer into a sequence of data in a prescribed length, and sequentially giving each data to the lower layer;

(b) obtaining error control codes for the data while the data are sequentially given to the lower layer at the step (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs such that the last column of the data region in the interleaver contains interleaved data of a variable size, and calculating each error control code for the data up to the last column in each row of the interleaving matrix; and (c) attaching a prescribed header to a prescribed amount of the data and/or the error control codes sequentially given to the lower layer by the steps (a) and (b) to form a data unit, such that the data units are transmitted and an error correction using the error control codes can be carried out for the data at a receiving side when an error occurs during data transfer.

58. A method of error control at a level between an upper layer and a lower layer, comprising the steps of:

(a) checking headers containing sequence numbers in a sequence of data units for data and error control codes given from the lower layer, and deleting the headers from the data units;

(b) sequentially writing the data and the error control codes of the data units with the headers deleted at the step (a) into a deinterleaver having matrix shaped data region and error control code region according to an information contained in the headers, and detecting an end of a sequence of data units according to the information contained in the headers;

(c) carrying out error detection and error correction for the data written into the deinterleaver at the step (b), so as to decode correct data; and (d) reading decoded correct data obtained at the step (c) from the deinterleaver, and sequentially giving the decoded correct data to the upper layer.

59. A system for error control at a level between an upper layer and a lower layer, comprising:

(a) means for segmenting continuous data to be transmitted given from the upper layer into a sequence of data in a prescribed length, and sequentially writing each data into each column of a matrix shaped data region in an interleaver;

(b) means for variably setting a last column of the data region in the interleaver as a column of the data region in the interleaver determined in relation to one column into which a last data is written in the interleaver by the means (a) such that the last column of the data region in the interleaver contains interleaved data of a variable size, obtaining an error control code for the data up to the last column in each row of the data region in the interleaver, and writing each obtained error control code into a corresponding location within a matrix shaped error control code region in the interleaver; and (c) means for reading contents of each column of the data region and the error control code region in the interleaver, attaching a prescribed header to a prescribed number of columns of the data and/or the error control codes read out from the interleaver to form a data unit, and sequentially giving each data unit to the lower layer such that data units are transmitted and an error correction using the error control codes can be carried out for each data unit at a receiving side when an error occurs during data transfer.

60. A system for error control at a level between an upper layer and a lower layer comprising:

(a) means for segmenting continuous data to be transmitted given from the upper layer into a sequence of data in a prescribed length, and sequentially giving each data to the lower layer;

(b) means for obtaining error control codes for the data while the data are sequentially given to the lower layer at the means (a), and sequentially giving the obtained error control codes to the lower layer in succession to the data, where the error control codes are obtained by regarding the data as being interleaved by an interleaving matrix in which each data corresponds to each column, variably setting a last column of the interleaving matrix as a column determined in relation to one column of the interleaving matrix to which a last data belongs such that the last column of the data region in the interleaver contains interleaved data of a variable size, and calculating each error control code for the data up to the last column in each row of the interleaving matrix; and (c) means for attaching a prescribed header to a prescribed amount of the data and/or the error control codes sequentially given to the lower layer by the means (a) and (b) to form a data unit, such that the data units are transmitted and an error correction using the error control codes can be carried out for each data unit at a receiving side when an error occurs during data transfer.

61. A system for error control at a level between an upper layer and a lower layer, comprising:

(a) means for checking headers containing sequence numbers in a sequence of data units for data and error control codes given from the lower layer, and deleting the headers from the data units;

(b) means for sequentially writing the data and the error control codes of the data units with the headers deleted at the means (a) into a deinterleaver having matrix shaped data region and error control code region according to an information contained in the headers, and detecting an end of a sequence of data units according to the information contained in the headers;

(c) means for carrying out error detection and error correction for the data written into the deinterleaver at the means (b), so as to decode correct data; and (d) means for reading decoded correct data obtained at the means (c) from the deinterleaver, and sequentially giving the decoded correct data to the upper layer.

* * * * *